United States Patent
Chung et al.

(10) Patent No.: US 10,236,791 B1
(45) Date of Patent: Mar. 19, 2019

(54) INVERTER MODULE HAVING MULTIPLE HALF-BRIDGE MODULES FOR A POWER CONVERTER OF AN ELECTRIC VEHICLE

(71) Applicant: SF Motors, Inc., Santa Clara, CA (US)

(72) Inventors: Nathan Chung, Santa Clara, CA (US); Jinzhu Li, Santa Clara, CA (US); Kangwei Mao, Santa Clara, CA (US); Colin Haag, Santa Clara, CA (US); Zhong Nie, Santa Clara, CA (US); Duanyang Wang, Santa Clara, CA (US); Yifan Tang, Santa Clara, CA (US)

(73) Assignee: SF Motors, Inc., Santa Clara, CA (US)

( * ) Notice: Subject to any disclaimer, the term of this patent is extended or adjusted under 35 U.S.C. 154(b) by 0 days.

(21) Appl. No.: 16/051,182

(22) Filed: Jul. 31, 2018

Related U.S. Application Data

(60) Provisional application No. 62/647,612, filed on Mar. 23, 2018.

(51) Int. Cl.
| | |
|---|---|
| H02M 7/538 | (2007.01) |
| H02M 7/5387 | (2007.01) |
| H02M 7/00 | (2006.01) |
| H05K 7/20 | (2006.01) |
| H02K 11/33 | (2016.01) |
| H02K 5/22 | (2006.01) |
| H05K 7/14 | (2006.01) |
| B60L 11/18 | (2006.01) |
| H02M 1/00 | (2006.01) |

(52) U.S. Cl.
CPC ........ *H02M 7/53871* (2013.01); *H02K 5/225* (2013.01); *H02K 11/33* (2016.01); *H02M 7/003* (2013.01); *H05K 7/1432* (2013.01); *H05K 7/20927* (2013.01); *B60L 11/1803* (2013.01); *H02M 2001/0003* (2013.01)

(58) Field of Classification Search
CPC ............. H02M 7/53871; H02M 7/003; H02M 2001/0003; H02K 11/33; H02K 5/225; H05K 7/1432; H05K 7/20927; B60L 11/1803
See application file for complete search history.

(56) References Cited

U.S. PATENT DOCUMENTS

| 7,292,451 | B2 * | 11/2007 | Rodriguez | ............ | H02M 7/003 361/775 |
| 7,505,294 | B2 * | 3/2009 | Ahmed | .................. | H02M 7/003 363/132 |
| 2014/0369099 | A1 * | 12/2014 | Asako | ................... | H02M 7/003 363/97 |

* cited by examiner

*Primary Examiner* — Emily P Pham
(74) *Attorney, Agent, or Firm* — Foley & Lardner LLP; James De Vellis

(57) ABSTRACT

Provided herein is a power converter component to power a drive unit of an electric vehicle drive system. The power converter component includes an inverter module formed having three half-bridge modules arranged in a triplet configuration for electric vehicle drive systems. Positive inputs, negative inputs, and output terminals of the different half-bridge inverter modules are aligned with each other. The inverter module includes a positive bus-bar coupled with the positive inputs and a negative bus-bar coupled with the negative inputs of the half-bridge inverter modules. The positive bus-bar is positioned adjacent to and parallel with the negative bus-bar. The inverter module can be coupled with a drive train unit of the electric vehicle and provide three phase voltages to the drive train unit. Each of the half bridge modules can generate a single phase voltage and three half-bridge modules arranged in a triplet configuration can provide three phase voltages.

20 Claims, 40 Drawing Sheets

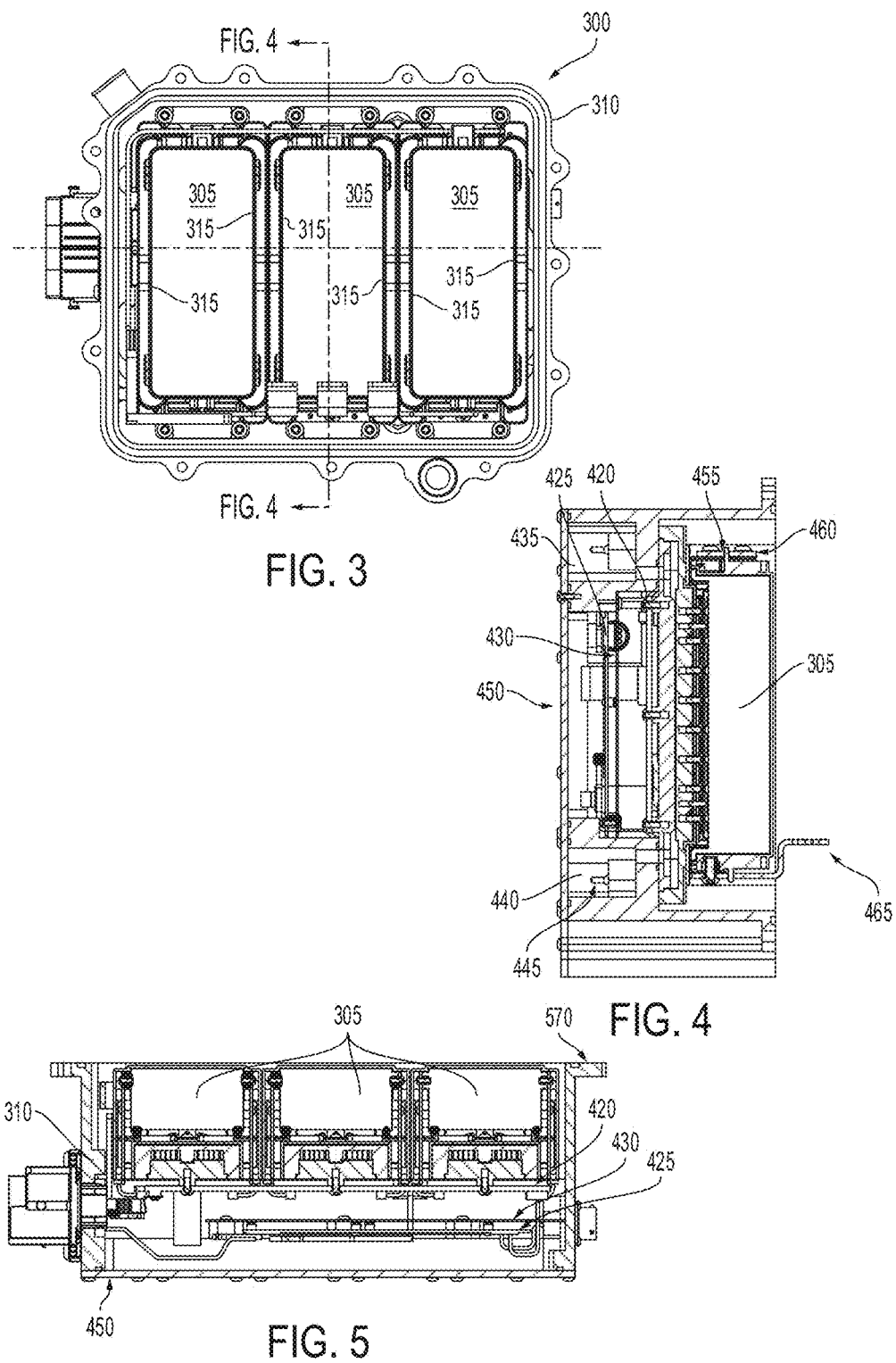

INVERTER MODULE HAVING MULTIPLE HALF-BRIDGE MODULES FOR A POWER CONVERTER OF AN ELECTRIC VEHICLE

CROSS REFERENCE TO RELATED APPLICATIONS

The present application claims the benefit of priority under 35 U.S.C. § 119(e) to U.S. Provisional Application 62/647,612, titled "INVERTER MODULE HAVING MULTIPLE HALF-BRIDGE MODULES FOR A POWER CONVERTER OF AN ELECTRIC VEHICLE", filed on Mar. 23, 2018. The entire disclosure of which is incorporated herein by reference in its entirety.

BACKGROUND

Vehicles such as automobiles have power requirements to operate the vehicle and associated or peripheral systems. The power source can include onboard batteries or fuel cells, gasoline or other fossil fuel or plant based fuels, as well as combinations thereof

SUMMARY

The present disclosure is directed a power converter component to power a drive unit of an electric vehicle drive system. The power converter component includes an inverter module formed having three half-bridge modules (which can also be referred to herein as a half-bridge inverter module or a sub-module) arranged in a triplet configuration for electric vehicle drive systems. The inverter module can be coupled with a drive train unit of the electric vehicle and be configured to provide three phase voltages to the drive train unit. For example, each of the half bridge modules can generate a single phase voltage and thus, the three half-bridge modules arranged in a triplet configuration can provide three phase voltages.

At least one aspect is directed to an inverter module. The inverter module includes first, second and third half-bridge inverter modules coupled with each other in a triplet configuration. The first, second, and third positive inputs of the first, second and third half-bridge inverter modules, respectively, are aligned with each other and first, second, and third negative inputs of the first, second and third half-bridge inverter modules, respectively, are aligned with respect to each other. The first, second, and third output terminals of the first, second and third half-bridge inverter modules, respectively, are aligned with respect to each other. The inverter module includes a positive bus-bar coupled with the first, second, and third positive inputs of the first second and third half-bridge inverter modules, and a negative bus-bar coupled with the first, second, and third negative inputs of the first, second and third half-bridge inverter modules. The positive bus-bar is positioned adjacent to and parallel with the negative bus-bar.

At least one aspect is directed to a method including forming a first, second and third half-bridge inverter modules, coupling the first, second and third half-bridge inverter modules with each other in a triplet configuration, aligning first, second, and third positive inputs of the first, second and third half-bridge inverter modules, respectively, with each other, and aligning first, second, and third negative inputs of the first, second and third half-bridge inverter modules, respectively, with each other. The method further includes coupling a positive bus-bar with the first, second, and third positive inputs of the first second and third half-bridge inverter modules, and coupling a negative bus-bar with the first, second, and third negative inputs of the first, second and third half-bridge inverter modules such that the positive bus-bar is positioned adjacent to and parallel with the negative bus-bar.

At least one aspect is directed to a method of providing an inverter module. The inverter module having first, second and third half-bridge inverter modules coupled with each other in a triplet configuration. The first, second, and third positive inputs of the first, second and third half-bridge inverter modules, respectively, can be aligned with each other. The first, second, and third negative inputs of the first, second and third half-bridge inverter modules, respectively, can be aligned with respect to each other. The first, second, and third output terminals of the first, second and third half-bridge inverter modules, respectively, can be aligned with respect to each other. The inverter module can include a positive bus-bar coupled with the first, second, and third positive inputs of the first, second, and third half-bridge inverter module. The inverter module can include a negative bus-bar coupled with the first, second, and third negative inputs of the first, second and third half-bridge inverter modules. The positive bus-bar can be positioned adjacent to and parallel with the negative bus-bar.

At least one aspect is directed to a half-bridge module. The half-bridge module having a cold plate, a ceramic layer disposed over a first surface of the cold plate, a plurality of transistors disposed within slots of a locator, the locator and the plurality of transistors disposed over a first surface of the ceramic layer, and a plurality of clips having gull wings that extend over the transistors to secure the plurality of transistors to the locator. The half-bridge module includes a first plurality of fasteners disposed through the locator and cold plate to secure the plurality of clips to the locator, a first printed circuit board (PCB) disposed between the plurality of clips and the locator, a capacitor disposed over a first surface of the plurality of the transistors, and a gel tray disposed over the capacitor, the first PCB and the plurality of transistors.

At least one aspect is directed to a method of forming a half-bridge module. The method including providing a cold plate on a pick and place fixture. The cold plate having two shallow regions and a hump region, and the hump region disposed between the two shallow regions. The method includes dispensing a lubricant over a first surface of the cold plate, disposing a ceramic layer over the first surface of the cold plate, dispensing the lubricant over a first surface of the ceramic layer, and installing a locator over the first surface of the ceramic layer. The method includes coupling a plurality of transistors within a plurality of slots formed in the locator using a plurality of clips and fasteners. Each of the plurality of clips including at least two gull wings that extend out and over at least one of the plurality of transistors, and the plurality of fasteners coupling the plurality of clips to the locator. The method includes providing a capacitor over a first surface of the plurality of transistors and disposing a gel tray over the capacitor, the hump region of the cold plate is configured to raise the capacitor and the plurality of transistors into the gel tray.

At least one aspect is directed to a method of providing a half-bridge module. The half-bridge module having a cold plate, a ceramic layer disposed over a first surface of the cold plate, and a plurality of transistors disposed within slots of a locator. The locator and the plurality of transistors can be disposed over a first surface of the ceramic layer. The half-bridge module can include a plurality of clips having gull wings that extend over the transistors to secure the plurality of transistors to the locator, a first plurality of fasteners disposed through the locator and cold plate to secure the plurality of clips to the locator, and a first printed circuit board (PCB) disposed between the plurality of clips and the locator. The half-bridge module can include a capacitor disposed over a first surface of the plurality of the transistors, and a gel tray disposed over the capacitor, the first PCB and the plurality of transistors.

At least one aspect is directed to a half-bridge module. The half-bridge module including a cold plate having a first surface and a second, opposing surface. The cold plate includes a first region having a first height, a second region having the first height, and a third region having a third height. The second height greater than the first height. The cold plate includes a plurality of cooling channels formed within the second region. One or more of the plurality of cooling channels fluidly coupled with one or more other cooling channels. The cold plate includes a coolant input fluidly coupled with at least one first cooling channel of the plurality of cooling channels, and a coolant output fluidly coupled with at least one second cooling channel of the plurality of cooling channels.

At least one aspect is directed to a method of providing a half-bridge module. The method includes providing a cold plate having a first surface and a second, opposing surface, forming a first region of the cold plate having a first height, forming a second region of the cold plate having the first height, and forming a third region of the cold plate having a third height. The second height greater than the first height. The method includes disposing a plurality of cooling channels within the second region. One or more of the plurality of cooling channels fluidly coupled with one or more other cooling channels. The method includes fluidly coupling a coolant input with at least one first cooling channel of the plurality of cooling channels, and fluidly coupling a coolant output with at least one second cooling channel of the plurality of cooling channels.

At least one aspect is directed to a method of providing a half-bridge module. The half-bridge module having a cold plate having a first surface and a second, opposing surface. The cold plate includes a first region having a first height, a second region having the first height, and a third region having a third height. The second height greater than the first height. The cold plate can include a plurality of cooling channels formed within the second region. One or more of the plurality of cooling channels fluidly coupled with one or more other cooling channels. The cold plate can include a coolant input fluidly coupled with at least one first cooling channel of the plurality of cooling channels and a coolant output fluidly coupled with at least one second cooling channel of the plurality of cooling channels.

At least one aspect is directed towards an electric vehicle. The electric vehicle can include an inverter module disposed in a drive train unit of an electric vehicle. The inverter module can include first, second and third half-bridge inverter modules coupled with each other in a triplet configuration. The first, second, and third positive inputs of the first, second and third half-bridge inverter modules, respectively, are aligned with each other and first, second, and third negative inputs of the first, second and third half-bridge inverter modules, respectively, are aligned with respect to each other. The first, second, and third output terminals of the first, second and third half-bridge inverter modules, respectively, are aligned with respect to each other. The inverter module includes a positive bus-bar coupled with the first, second, and third positive inputs of the first second and third half-bridge inverter modules, and a negative bus-bar coupled with the first, second, and third negative inputs of the first, second and third half-bridge inverter modules. The positive bus-bar is positioned adjacent to and parallel with the negative bus-bar.

At least one aspect is directed towards an electric vehicle. The electric vehicle can include a half-bridge module disposed in a battery pack of an electric vehicle. The half bridge module can include a cold plate, a ceramic layer disposed over a first surface of the cold plate, a plurality of transistors disposed within slots of a locator, the locator and the plurality of transistors disposed over a first surface of the ceramic layer, and a plurality of clips having gull wings that extend over the transistors to secure the plurality of transistors to the locator. The half-bridge module includes a first plurality of fasteners disposed through the locator and cold plate to secure the plurality of clips to the locator, a first printed circuit board (PCB) disposed between the plurality of clips and the locator, a capacitor disposed over a first surface of the plurality of the transistors, and a gel tray disposed over the capacitor, the first PCB and the plurality of transistors.

At least one aspect is directed towards an electric vehicle. The electric vehicle can include a half-bridge module disposed in a drive train unit of an electric vehicle. The half bridge module can include a cold plate having a first surface and a second, opposing surface. The cold plate can include a first region having a first height, a second region having the first height, and a third region having a third height. The second height greater than the first height. The cold plate includes a plurality of cooling channels formed within the second region. One or more of the plurality of cooling channels fluidly coupled with one or more other cooling channels. The cold plate includes a coolant input fluidly coupled with at least one first cooling channel of the plurality of cooling channels, and a coolant output fluidly coupled with at least one second cooling channel of the plurality of cooling channels.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings:

FIG. 3 depicts an example cross-sectional top view of an inverter module having three half-bridge modules, according to an illustrative implementation;

FIG. 4 depicts an example cross-sectional side view of an inverter module having three half-bridge modules, according to an illustrative implementation;

FIG. 5 depicts an example cross-sectional front view of an inverter module having three half-bridge modules, according to an illustrative implementation;

Following below are more detailed descriptions of various concepts related to, and implementations of, methods, apparatuses, and systems of providing inverter/capacitor packages for electric vehicle. The various concepts introduced above and discussed in greater detail below may be implemented in any of numerous ways, as the described concepts are not limited to any particular manner of implementation.

DETAILED DESCRIPTION

Systems and methods described herein relate to an inverter module formed having three half-bridge modules (which can also be referred to herein as a half-bridge inverter module or sub-module) arranged in a triplet configuration for electric vehicle drive systems. The inverter module can be coupled with a drive train unit of an electric vehicle and be configured to provide three phase voltages to the drive train unit. For example, each of the half bridge modules can generate a single phase voltage and thus, the three half-bridge modules arranged in a triplet configuration can provide three phase voltages.

During development and manufacturing of a half-bridge module, technological or physical compromises with respect to the different components of the half-bridge module can be made to meet one or more needs or requirements of a particular electrical drive system. For example, compromises can be made between cost, engineering flexibility, manufacturing, packaging design, thermal design or electrical design of one or more components of the respective half-bridge module. These compromises may result in undesirable design changes that can impact a performance of the half-bridge module. The half-bridge modules described herein can alleviate the issues associated with these compromises and provide a half-bridge module having a half-bridge inverter based on TO-247 transistors, a cold plate, and sensing/control electronic hardware. Thus, the half-bridge modules described herein can strike a balance between high performance (e.g., low electrical parasitics, high current capacity, low component temperatures), high power density, low volume, low cost and having properties that allow them to be compatible for mass production.

The half-bridge modules described herein can be formed and arranged within an inverter module in a triplet configuration to provide a compact design. For example, a half-bridge module can be formed having a length of about 220 mm to about 230 mm, a width of about 80 mm to about 90 mm and a height of about 60 mm to about 70 mm. The dimensions and size of the half-bridge modules described herein can vary outside these ranges. The half-bridge modules can be positioned such that their respective input terminals and output terminals are aligned. The alignment of the input terminals and output terminals can allow one or more bus-bars coupled with each of the half-bridge modules to be disposed adjacent and parallel to each other.

Figure 1:
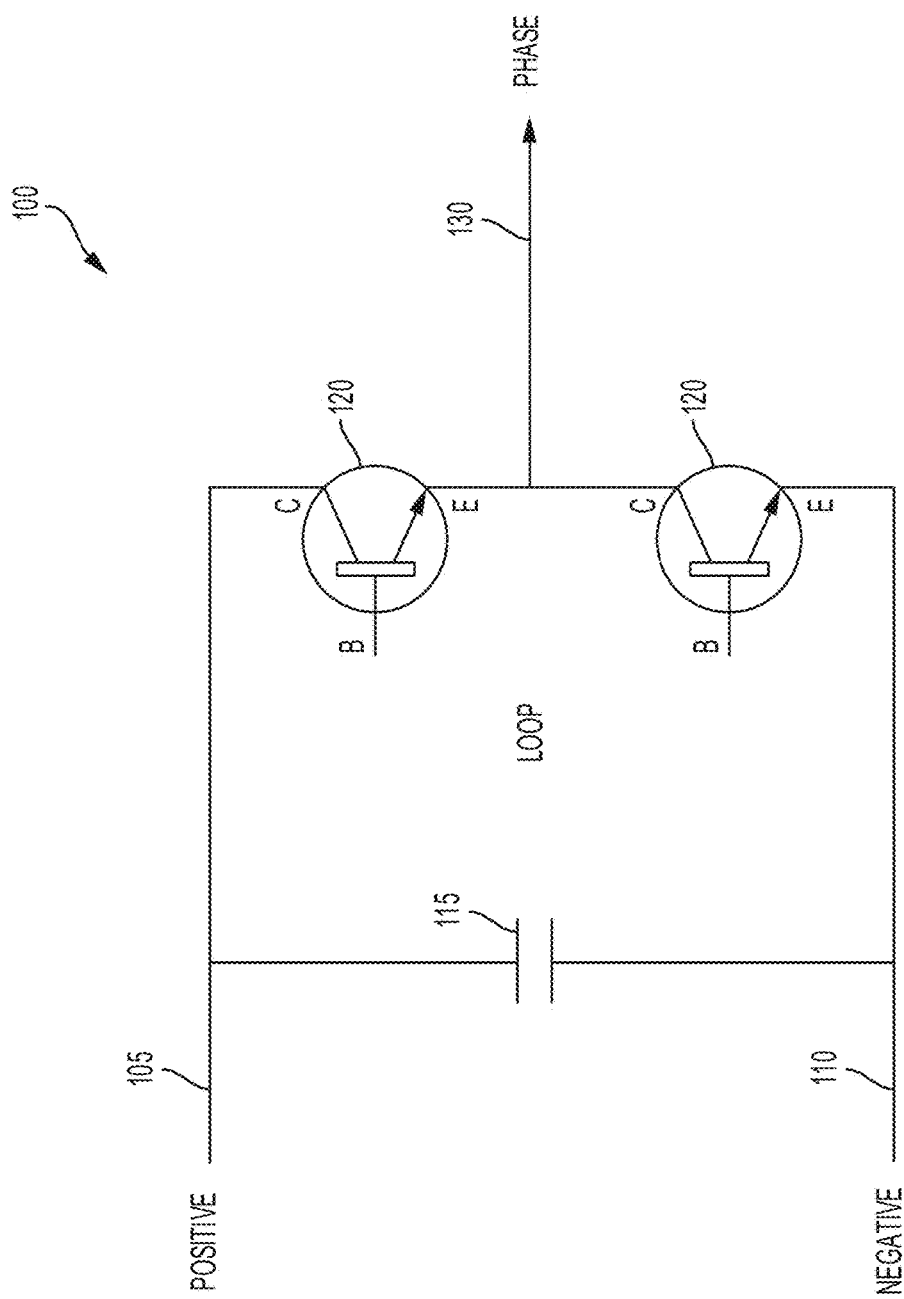
FIG. 1 depicts an example schematic of a half-bridge inverter circuit of a half-bridge module having a capacitor coupled with at least two transistors.

FIG. 1 shows a half-bridge inverter circuit 100 having at least one positive terminal 105 (which can also be referred to herein as a positive input, positive input terminal), at least one negative terminal 110 (which can also be referred to herein as a negative input, negative input terminal) forming a loop. The half-bridge inverter circuit includes at least one capacitor 115 coupled between the positive terminal 105 and the negative terminal 110. The half-bridge inverter circuit 100 includes a first transistor 120 and a second terminal 120 coupled between the positive terminal 105, the negative terminal 110 and a phase terminal 130. The first transistor 120 includes a base terminal, a collector terminal, and an emitter terminal. The collector terminal can couple with the positive terminal 105. The emitter terminal can couple with a phase terminal 130 and a collector terminal of the second transistor 120. The second transistor 120 includes a base terminal, a collector terminal, and an emitter terminal. The emitter terminal of the second transistor 120 can couple with the negative terminal 110. The first transistor 120 and the second transistor 120 can be configured to operate as switches and provide a phase voltage through the phase terminal 130, for example, to a three phase motor or motor drive unit of an electrical vehicle.

The half-bridge inverter circuit 100 provides a closed inductance loop between the capacitor 115 (e.g., a DCLSP capacitor) and first and second transistors 120 (e.g., TO-247 transistors, switches), where the capacitor 115 lead frame can make electrical connections directly to the first and second transistors 120. The leads of the first and second transistors 120 can be unbent, and terminated to or otherwise coupled with the capacitor 115 through resistive welding. Thus, the lead length of the first and second transistors 120 before the weld termination can be minimized. For example, the straight and unbent leads of first and second transistors 120 that can be short in length theoretically minimizes parasitic inductance effects, relative to alternative designs where more of the transistor lead is utilized or the leads are bent to reach their target connections.

The half-bridge circuit 100 can be formed such that a distance between first and second transistors 120 (e.g., IGBT semiconductor die) and the capacitor 115 (e.g., filtering capacitor film elements) is minimized. For example, by coupling the lead frame of the capacitor 115 with the lead frame of the first and second transistors 120, the inductance loop present in the half-bridge circuit 100 can have a reduced size. The lead frame of the capacitor 115 can couple directly with the lead frame of the first transistor 120 or the second transistor 120 such that a distance between them is zero. A distance between a lead or finger portion of the lead frame of the capacitor 115 and a body portion of the first transistor 120 or the second transistor 120 can be in a range from 5 mm to 20 mm. The distance between a lead or finger portion of the lead frame of the capacitor 115 and a body portion of the first transistor 120 or the second transistor 120 can be in a range from 0 mm (e.g., in contact) to 15 mm. For example, a physical distance between a lead or finger portion of the lead frame of the capacitor 115 and a body portion of the first transistor 120 or the second transistor 120 can be in a range from 0 mm to 5 mm. A distance an electrical signal may travel between a lead or finger portion of the lead frame of the capacitor 115 and a body portion of the first transistor 120 or the second transistor 120 can be in a range from 10 mm to 15 mm.

This arrangement of capacitor elements and conductors minimizes distance and maintains equidistance between the capacitor elements and transistor dies, on both the high side and low side. Electrical loss is in this example minimal and uniform across all insulated gate bipolar transistors (IGBTs). The capacitor and the previously intermediate bus-bars can be one homogenous part, sharing structure, insulation, mounting points, and heat dissipation surfaces. The mechanical tolerance stack-up between the X capacitor and laminated bus-bar can be eliminated. The capacitor case can provide the bus-bars with the structural backing or support needed to compress thermal pads against heat dissipation surfaces in a single assembly step, in contrast with a technique that uses separate plastic brackets/clips to this fulfill this roll. Part count is thus further reduced in the context of the assembly. Further, cost is reduced for purchased component as well as in-house assembly/labor. This assembly also accomplishes weight reduction. For example, approximately 30% less copper can be used when the capacitor and laminated bus-bar are combined. Several fasteners and layers of insulation film can also be eliminated. The capacitor 115 can include DC-Link, Single-Phase Capacitors ("DCLSP Capacitors") used as X capacitors/DC-Link filtering capacitors or automotive/industrial/commercial inverters. The bus-bars in the capacitor can serve as the conducting paths indicated in FIG. 1.

Figure 2:
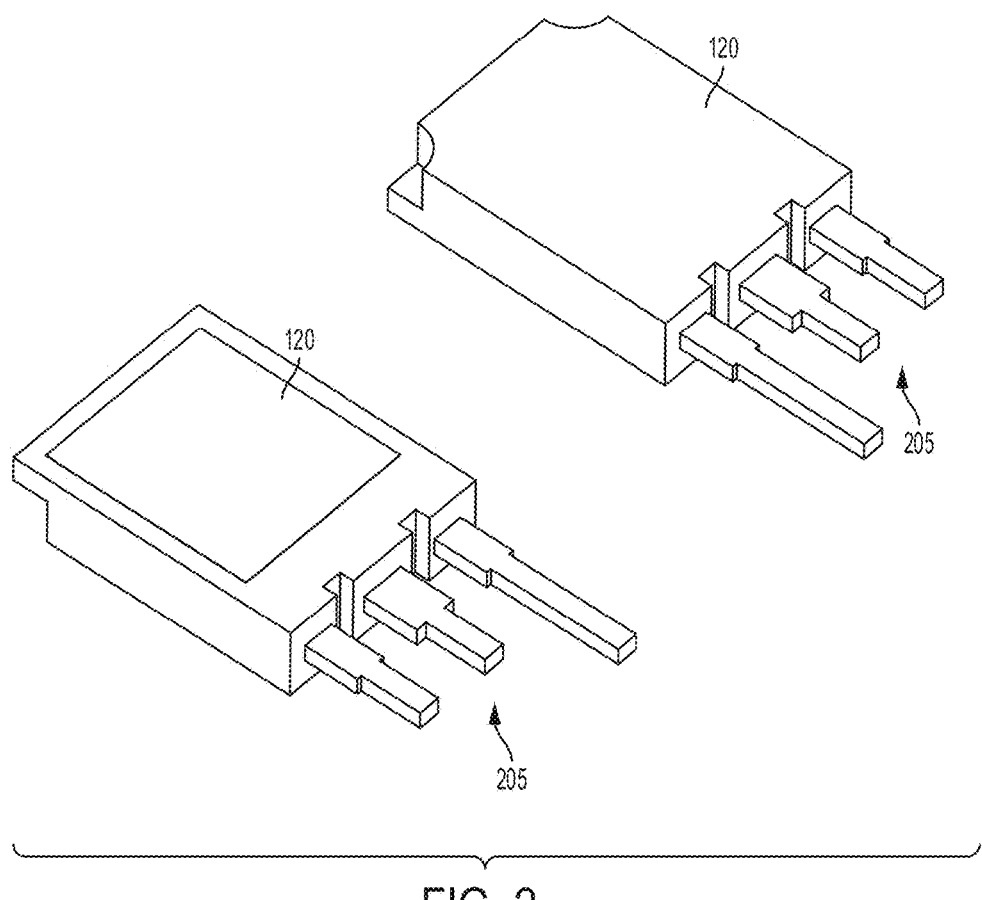
FIG. 2 depicts an example transistor (TO-247) used in a half-bridge module, according to an illustrative implementation.

FIG. 2 shows a front and a back view of the transistor 120. The transistor 120 may include a TO-247 transistor or a TO-247 discreet IGBT package. The transistors can include a variety of different transistors. The transistor 120 can include a semiconductor device having one or more connections. For example, and as depicted in FIG. 1, the transistor 120 can include a base terminal, a collector terminal, and an emitter terminal. Each of the transistors 120 can include one or more leads 205. For example, each of the transistors 120 may include three leads 205. Each of the three leads 205 can corresponds to at least one of the terminals of the transistor 120. For example, a first lead 205 can correspond to the base terminal or base lead. A second lead 205 can correspond to the collector terminal or collector lead. A third lead 205 can correspond to the emitter terminal or emitter lead. The leads 205 can receive or provide a voltage signal or a current signal. The transistor 120 can be incorporated into the half-bridge modules described herein.

FIGS. 3-5 show cross-sectional views of an inverter module 300 having three half-bridge modules 305. In FIG. 3, a top view of first, second, and third half-bridge modules 305 disposed in a triplet configuration within an enclosure 310 of the inverter module 300 is provided. The first, second, and third half-bridge modules 305 are disposed adjacent with respect to each other. For example, the half-bridge modules 305 can be positioned such that a second side surface 315 of the first half-bridge module 305 is adjacent to a first side surface 315 of the second half-bridge module 305 and a second side surface 315 of the second half-bridge module 305 is adjacent to a first side surface 315 of the third half-bridge module 305. The half-bridge modules 305 can be disposed in other arrangements within the inverter module 300. The half-bridge modules 305 can be disposed in a triplet configuration to provide a compact size of the inverter module 300. The first, second, and third half-bridge modules 305 can be formed having a length ranging from 200 mm to 240 mm, a width ranging from 70 mm to 100 mm, and a height ranging from 50 mm to 80 mm. The dimensions and size of the half-bridge modules 305 described herein can vary outside these ranges.

The half-bridge modules 305 can be formed in a variety of different shapes. For example, and as depicted in FIG. 3, the half-bridge modules can have rectangular shapes. The half-bridge modules 305 can be formed to be modular units having similar shapes, sizes, and dimensions such that they can interchangeable within an inverter module 300. Thus, individual half-bridge modules 305 can be replaced, serviced or otherwise repaired without replacing an entire inverter module 300. Each of the half-bridge modules 305 in a common inverter module 300 may have the same shape, size, and dimensions or one or more of the half-bridge modules 305 in a common inverter module 300 may have a different shape, size, or dimensions. The half-bridge modules 305 can be formed to be modular units having similar shapes, sizes, and dimensions such that they can interchangeable within an inverter module 300.

FIG. 4 provides a side view of the inverter module 300 showing a cross-sectional view of one of the half-bridge modules 305. The half-bridge module 305 includes a power printed circuit board (PCB) 420, a control PCB 425, and an electromagnetic interference (EMI) shield 430 disposed between the power PCB 420 and the control PCB 425. The power PCB 420 can be configured to provide power to the half-bridge modules 305 forming the inverter module 300. For example, each of the half-bridge modules 305 may include a power PCB 420. Thus, the inverter module 300 can include multiple power PCBs 420 with each power PCB 420 configured to provide power signals to at least one of the respective half-bridge modules 305 to power the respective half-bridge modules 305. The control PCB 425 can provide control signals to the half-bridge modules 305 forming the inverter module 300 to control operation of the half-bridge modules 305. For example, the control PCB 425 can use the control signals to activate (e.g., turn-on) or deactivate (e.g., turn-off) one or more of the half-bridge modules 305. The EMI shield 430 can be disposed between the control PCB 425 and each of the power PCBs 425 to electrically isolate the control PCB 425 from the power PCBs 425.

The inverter module 300 includes an inlet coolant manifold 435, an outlet coolant manifold 440 and a coolant temperature sensor 445 disposed adjacent to, proximate to, or within a predetermined distance from the outlet coolant manifold 440. The inlet coolant manifold 435 can include an orifice or hole configured to receive coolant fluid and provide the coolant fluid to the inverter module 300 to provide cooling for the half-bridge modules 305 disposed within the inverter module. The coolant temperature sensor 445 can be posited to measure a temperature of the coolant fluid as it is released or removed from the inverter module 300. The inverter module 300 may include a coolant temperature sensor 445 disposed adjacent to, proximate to, or within a predetermined distance from the inlet coolant manifold 435 to measure a temperature of coolant fluid provided to the inverter module 300.

The inlet coolant manifold 435 and the outlet coolant manifold 440 can be fluidly coupled such that coolant fluid provided to the inlet coolant manifold 435 can flow through the inverter module 300 to provide cooling to the components of the half-bridge modules 305 forming the inverter module 300 and exit the inverter module 300 through the outlet coolant manifold 440. For example, a tube, conduit, or hollow layer can couple the inlet coolant manifold 435 to the outlet coolant manifold 440 and the tube, conduit or hollow layer can run or extend through a length of the inverter module 300 such that it is positioned next to, adjacent to, or proximate to portion of one or more half-bridge modules 305 forming the inverter module 300 to provide cooling to the components of the half-bridge modules 305. The hollow layer may include a wall structure of the inverter module 300 formed having a hollow inner portion to receive coolant fluid.

The inverter module 300 includes a positive bus-bar 455, a negative bus-bar 460 and a phase bus-bar 465. The positive bus-bar 455 and the negative bus-bar 460 can be positioned adjacent to and parallel with respect to each other. For example, the positive bus-bar 455 can be disposed at a first level or height along a first side of the half-bridge modules 305 and the negative bus-bar 460 can be disposed at a second, different level or height along the first side of the half-bridge modules 305. The positive bus-bar 455 and the negative bus-bar 460 can be disposed along a first side of the half-bridge modules 305 and the phase bus-bar 465 can be disposed along a second, different side of the half-bridge modules 305. Positioning the positive bus-bar 455 and the negative bus-bar 460 at different heights provides spacing for the positive bus-bar 455 and negative bus-bar 460 to be disposed along the same side of the half-bridge module 305. Thus, multiple half-bridge modules 305 can couple with the same the positive bus-bar 455 and negative bus-bar 460 and be aligned with respect to each other.

The half-bridge modules 305 can be positioned such that their respective input terminals and output terminals are aligned. For example, each of the half-bridges modules 305 can include a positive input coupled with the positive bus-bar 455 along a first side of the half-bridge modules 305 and a negative input coupled with the negative bus-bar 460 along the first side of the half-bridge modules 305. Each of the half-bridge modules 305 can include an output terminal coupled with the phase bus-bar 465 along a second, different side of the half-bridge modules. The alignment of the input terminals and output terminals can allow one or more bus-bars coupled with each of the half-bridge modules to be disposed adjacent and parallel to each other. An enclosure lid 440 can be disposed over each the half-bridge modules 305 disposed within the enclosure 310 of the inverter module 300. For example, the enclosure lid 440 can seal the enclosure 310 and be configured to protect the half-bridge modules 305 from an environment the inverter module 300 and the half-bridge modules 305 forming the inverter module 305 are disposed.

FIG. 5 provides a front view of the inverter module 300 showing a cross-sectional view of one of the first, second, and third half-bridge modules 305 disposed adjacent to each other in a triplet configuration. For example, the half bridge modules are disposed side by side with the second half-bridge module 305 disposed between the first half-bridge module 305 and the third half-bridge module 305. The half-bridge modules 305 can be aligned with respect to each other such that a top surface of each of the first, second, and third half-bridge modules 305 are aligned with respect to each other and a bottom surface of each of the first, second, and third half-bridge modules 305 are aligned with respect to each other. The side surfaces of the first, second, and third half-bridge modules 305 can be aligned with respect to each other to form the triplet configuration.

As depicted in FIG. 5, the first, second, and third half-bridge modules 305 are disposed within the enclosure 310 (e.g., housing) of the inverter module 300. The enclosure 310 includes the enclosure lid 450 to seal or close the enclosure such that the half-bridge modules 305 are protected from an environment around the inverter module 300. The enclosure 310 includes a gearbox mounting flange 570 extending from a side surface of the enclosure 310. For example, the gearbox mounting flange 570 can be formed such that it is perpendicular to the side surface of the enclosure 310. The gearbox mounting flange 570 can be configured to mount or position the inverter module 300 in a drive train unit of an electric vehicle.

The spatial relationship between the power PCB 420, the EMI shield 430 and the control PCB 425 is depicted in FIG. 5. For example, the power PCB 420 is disposed at a first distance from a surface (e.g., top surface, bottom surface) of the first, second, and third half-bridge modules 305. The EMI shield 430 is disposed at a second distance from a surface (e.g., top surface, bottom surface) of the first, second, and third half-bridge modules 305. The control PCB 425 is disposed at a third distance from a surface (e.g., top surface, bottom surface) of the first, second, and third half-bridge modules 305. The first distance can be less than the second and third distances. The second distance can be less than the third distance. The power PCB 420 can be disposed a smaller distance (e.g., closer) from the first, second, and third half-bridge modules 305 than the control PCB 425 and the EMI shield 430. The control PCB 425 can be disposed a greater distance from the first, second, and third half-bridge modules 305 than the power PCB 420 and the EMI shield 430. Although FIGS. 3-5 illustrate three half-bridge modules 305 disposed within the inverter module 300, the inverter module 300 can include less than three half-bridge modules 305 or more than three half-bridge modules 305.

Figure 6:
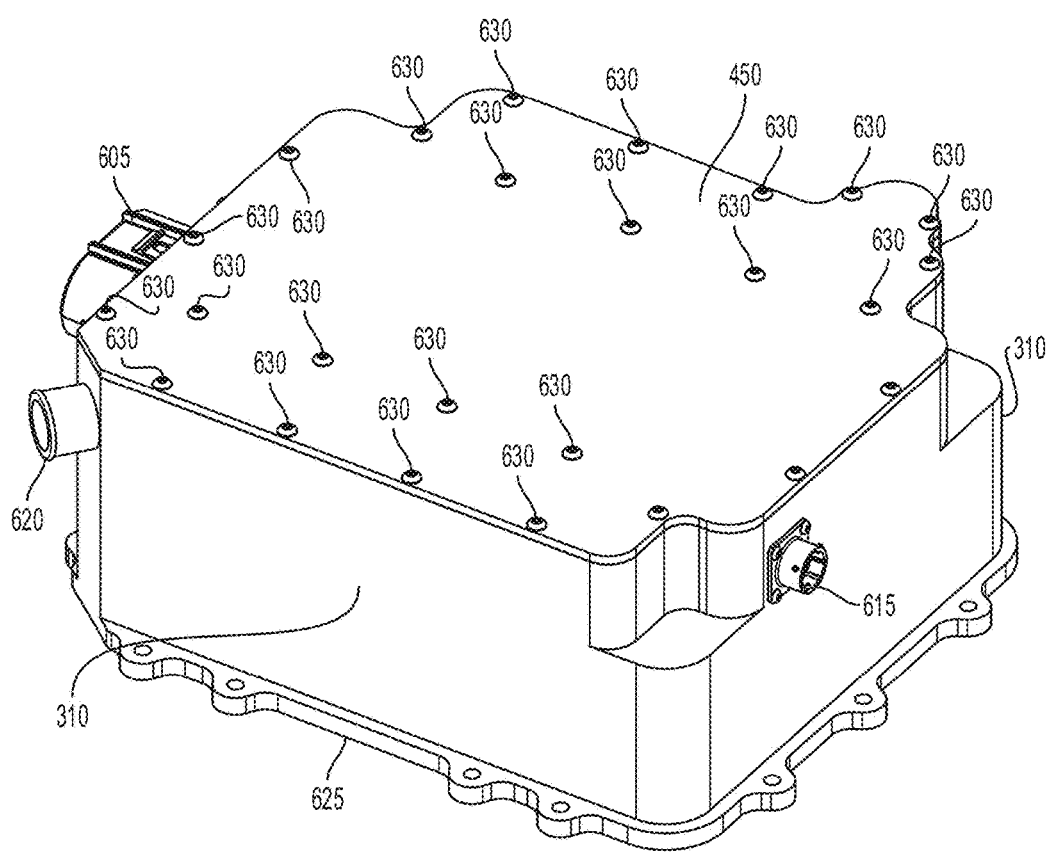
FIG. 6 depicts an example isometric view of an inverter module having a housing and a high-voltage connector coupled with at least one side of the inverter module, according to an illustrative implementation.

FIG. 6 shows a top view of the enclosure 310 of the inverter module 300. The enclosure 310 can be formed from a variety of different material including, but not limited to, plastic material. The enclosure 310 includes the enclosure lid 450 (or cover), a high-voltage (HV) connector 605 (e.g., DC connection) formed on or otherwise coupled with a first side surface of the enclosure 310 and a low-voltage (LV) connector 615 formed on a second, different side surface (e.g., opposite end) of the enclosure 310. The enclosure lid 450 can be coupled with the enclosure through a plurality of fasteners 630 (e.g., screws, bolts). The HV connector 605 can be configured to couple with a high voltage power source to provide power in a first voltage range (e.g., high voltage range) to the inverter module 300. The LV connector 615 can be configured to couple with a low voltage power source to provide power in a second voltage range (e.g., low voltage range) to the inverter module 300.

The enclosure 310 includes a coolant input hose connection 620 (e.g., coolant input hose bard) than can receive a hose, tube, or conduit such that coolant can be provided to the enclosure 310 through the coolant input hose connection 620. For example, the coolant input hose connection 620 can include an orifice, a hole, or a threaded hole to receive or couple with a hose, tube or conduit. The enclosure 310 includes a mounting flange 625. The mounting flange 625 can be formed to aid in coupling the enclosure 310 within a drive train unit of an electric vehicle. The enclosure 310 can include a single mounting flange 625 or multiple mounting flanges 625. For example, the enclosure 310 may include a mounting flange 625 formed on each side or end surface of the enclosure 310.

Figure 7:
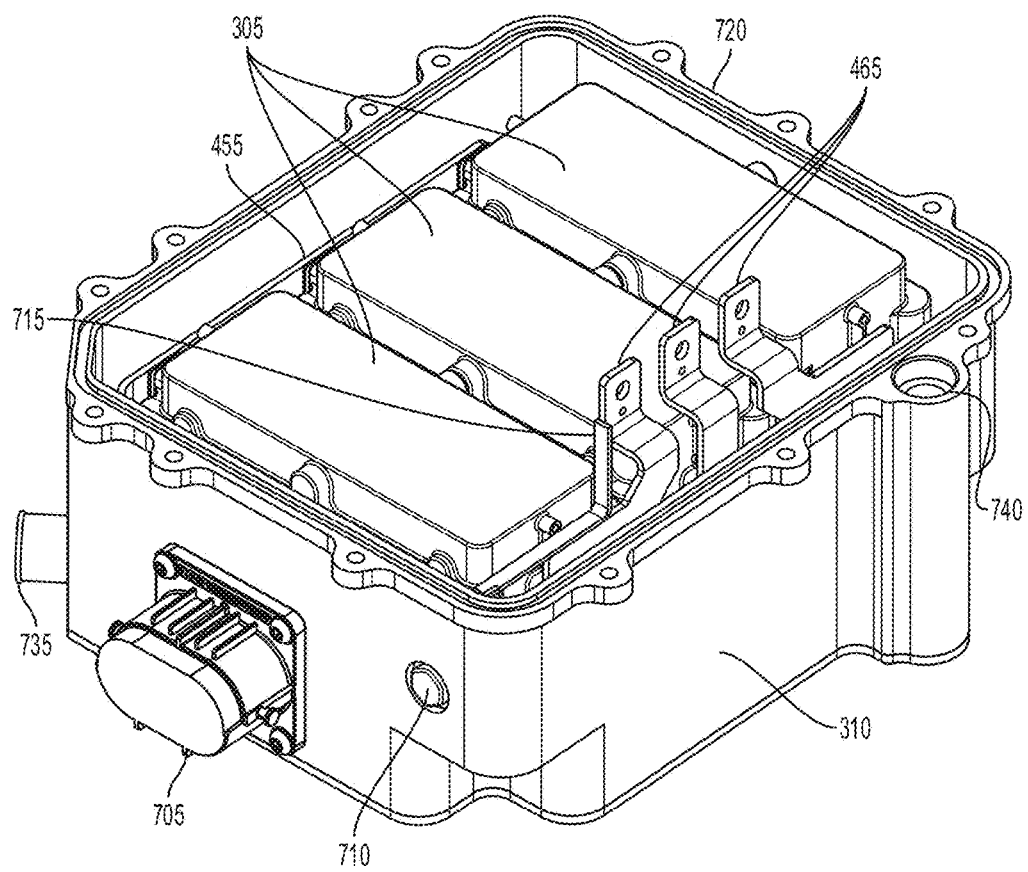
FIG. 7 depicts an example isometric view of the inverter module having at least one surface removed to expose three half-bridge modules disposed within the inverter module, according to an illustrative implementation.

FIG. 7 illustrates the inverter module 300 having three half-bridge modules 305 disposed within the enclosure 310 (e.g., housing) of the inverter module 300. In FIG. 7, the enclosure lid is removed to show the arrangement of the first, second and third half-bridge modules 305 (or sub-modules) disposed within the inverter module 300 in a triplet configuration. The first, second and third half-bridge modules 305 are coupled with a positive bus-bar 455, a negative bus-bar 460 (as shown in FIG. 4), and first, second and third phase bus-bars 465 (e.g., output terminals). The positive bus-bar 455 can be disposed parallel to the negative bus-bar 460 such that the positive and negative bus-bars couple with positive input terminals and negative input terminals, respectively of each of the first, second and third half-bridge modules 305. Each of the first, second and third half-bridge modules 305 may include an output terminal coupled with at least one of the first, second and third phase bus-bars 465. For example, the first half-bridge module 305 can include a first output terminal coupled with a first phase bus-bar 465, the second half-bridge module 305 can include a second output terminal coupled with a second bus-bar 465, and the third half-bridge module 305 can include a third output terminal coupled with a third phase bus-bar 465.

The enclosure 310 includes a DC connector 705. The DC connector 75 can correspond to a high voltage connector and be configured to receive a voltage (e.g., DC voltage) to provide power to the inverter module 300 and to the first, second, and third half-bridge modules 305 forming the inverter module 300. A coolant input 735 can be formed on a first side surface of the enclosure 310 and a coolant output 740 can be formed on a second side surface of the enclosure 310. The coolant input 735 can include an input hose barb and be configured to receive or couple with a hose, tube, or conduit to receive coolant and provide the coolant to the inverter module 300. The coolant output 740 can include an output hose barb and be configured to receive or couple with a hose, tube, or conduit to release coolant from the inverter module 300.

The coolant input 735 can be coupled with a coolant inlet manifold 435 of the inverter module 300 and the coolant output 740 can be coupled with a coolant outlet manifold 440 of the inverter module 300. The coolant input 735 and the coolant output 740 can be formed on the same surface of the enclosure or the coolant input 735 and the coolant output 740 can be formed on different surfaces of the enclosure 310. The enclosure 310 includes a vent 710 to vent the inverter module 300 and the first, second, and third half-bridge modules 305 forming the inverter module 300. The vent 710 can include or be formed as a hole or opening in a side surface of the enclosure 310. For example, the vent 710 can provide air to an inner region of the enclosure 310 to provide cooling to the first, second, and third half-bridge modules 305 forming the inverter module 300. The enclosure 710 includes a gearbox harness 715 and a gearbox mounting flange 720. The harness 715 can be configured to couple one or more of the first, second, and third half-bridge modules 305 with different power systems of a drive train unit. For example, the gearbox harness 715 can electrically couple the half-bridge module 305 or the inverter module 300 with different power systems of a drive train unit to convey or transmit electrical signals between the half-bridge module 305 or the inverter module 300 and the power systems of the drive train unit. The mounting flange 720 can be formed along one or more surfaces or edges of the enclosure 310 to aid in coupling the inverter module 300 within a drive train unit of an electric vehicle.

As depicted in FIG. 7, the enclosure 310 can be formed having a rectangular shape. However, the enclosure 310 can be formed in a variety of different shapes or having different dimensions. The particular shape or dimensions of the enclosure 310 can be selected based at least in part on the shape and dimensions of the half-bridge modules 305 or the shape and dimensions of a space within a drive train unit of an electric vehicle that the enclosure 310 is to be disposed within. The enclosure 310 can have a length in a range from 270 mm to 290 mm (e.g., 280 mm). The enclosure 310 can have a width in a range from 280 mm to 300 mm (e.g., 290 mm). The enclosure 310 can have a height in a range from 120 mm to 132 mm (e.g., 127 mm).

Figure 8:
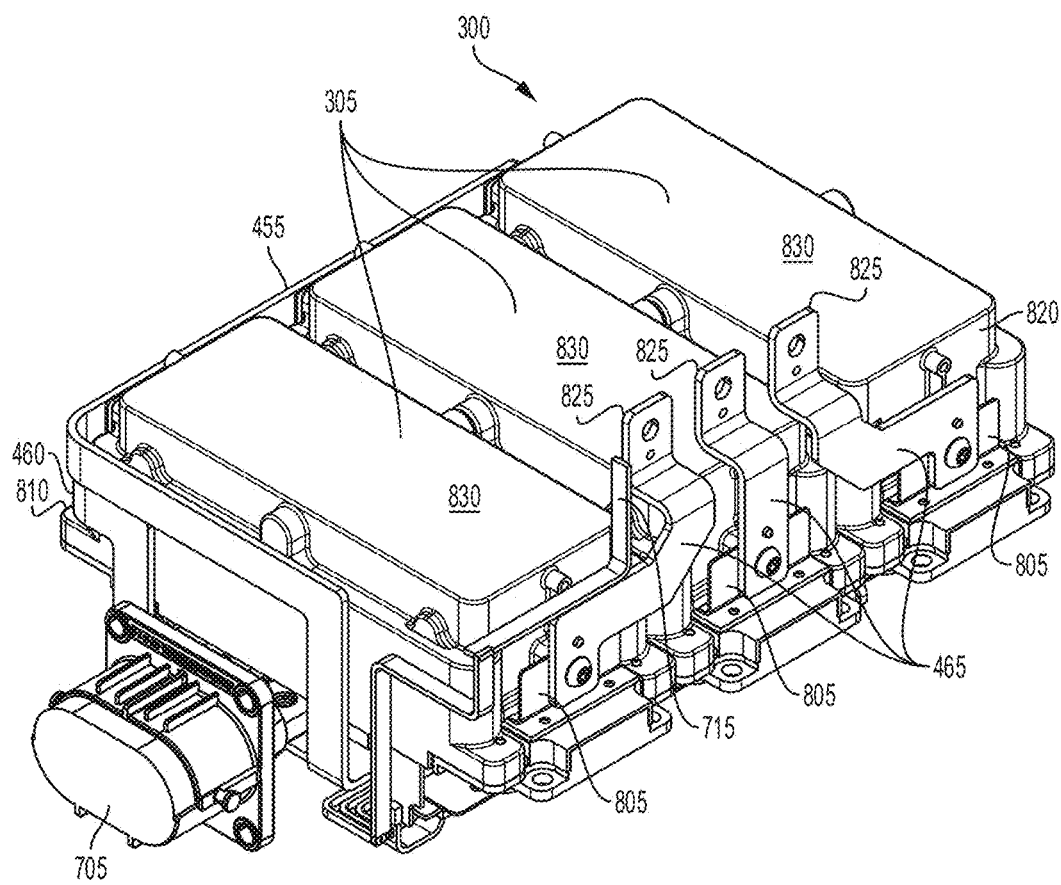
FIG. 8 depicts an example isometric view of an inverter module having a triplet half-bridge module arrangement, with each of the half-bridge modules coupled having an output terminal coupled with a phase bus-bar, according to an illustrative implementation.

FIG. 8 illustrates the first, second and third half-bridge modules 305 coupled with the positive bus-bar 455 and the negative bus-bar 460. The positive bus-bar 455 and the negative bus-bar 460 can be formed or disposed along a common side surface of the first, second, and third half-bridge modules 305 to reduce the dimensions of the inverter module 300 and provide a compact design. As depicted in FIG. 8, the positive bus-bar 455 is positioned along first sides 810 of the first, second, and third half-bridge modules 305 at a first level or height and the negative bus-bar 460 is positioned along first sides 810 of the first, second, and third half-bridge modules 305 at a second level or height (e.g., different from the first level or height). For example, the positive bus-bar 455 is positioned parallel to and adjacent to the negative bus-bar 460 along the first sides 810. The positive bus-bar 455 can be positioned parallel to and above the negative bus-bar 460 along the first sides 810 or the positive bus-bar 455 can be positioned parallel to and below the negative bus-bar 460 along the first sides 810.

The first, second and third half-bridge modules 305 include an output terminals 805 formed on second side surfaces 820 of the half-bridge modules 305. The second side surfaces 820 can correspond to an opposite side or opposite end of the half-bridge modules 305 as compared with the first side surfaces 810. For example, the first half-bridge module 305 includes a first output terminal 805 formed on the second side surface 820 of the first half-bridge module 305. The second first half-bridge module 305 includes a second output terminal 805 formed on the second side surface 820 of the second half-bridge module 305. The third half-bridge module 305 includes a third output terminal 805 formed on the second side surface 820 of the third half-bridge module 305.

The output terminals 805 of the first, second, and third half-bridge modules 305 can be aligned with respect to each other. For example, the output terminals 805 can be formed at a same height or level along the second side surfaces 820 of the first, second, and third half-bridge modules 305. The output terminals 805 of the first, second, and third half-bridge modules 305 can couple with phase bus-bars 465 to provide an output from the half-bridge modules 305. The first output terminal 805 of the first half-bridge module 305 can couple with a first phase bus-bar 465, the second output terminal 805 of the second half-bridge module 305 can couple with a second phase bus-bar 465, and the third output terminal 805 of the third half-bridge module 305 can couple with a third phase bus-bar 465.

The first, second, and third phase bus-bars 465 extending from the first, second, and third half-bridge inverter modules 305 can be formed or disposed along the second side surfaces 820 such that they are aligned or parallel with respect to each other. The first, second, and third phase bus-bars 465 can include first, second, and third phase outputs 825, respectively, that are formed or disposed at a common or same level with respect to a top surface 830 of each of the first, second, and third half-bridge modules 305. The first, second, and third phase outputs 825 can form connection points to couple with different systems within a drive train unit of an electric vehicle. For example, each of the first, second, and third phase outputs 825 can be configured to provide a single phase voltage such the first, second, and third phase outputs 825 in combination can provide a three phase voltage. The DC connector 705 (e.g., HV connector) is coupled with the positive bus-bar 455 and the negative bus-bar 460. The DC connector 705 can be coupled with a power supply (e.g., DC power supply) and be configured to provide power to the positive bus-bar 455 and the negative bus-bar 460 and thus power the first, second, and third half-bridge modules 305.

Figure 9:
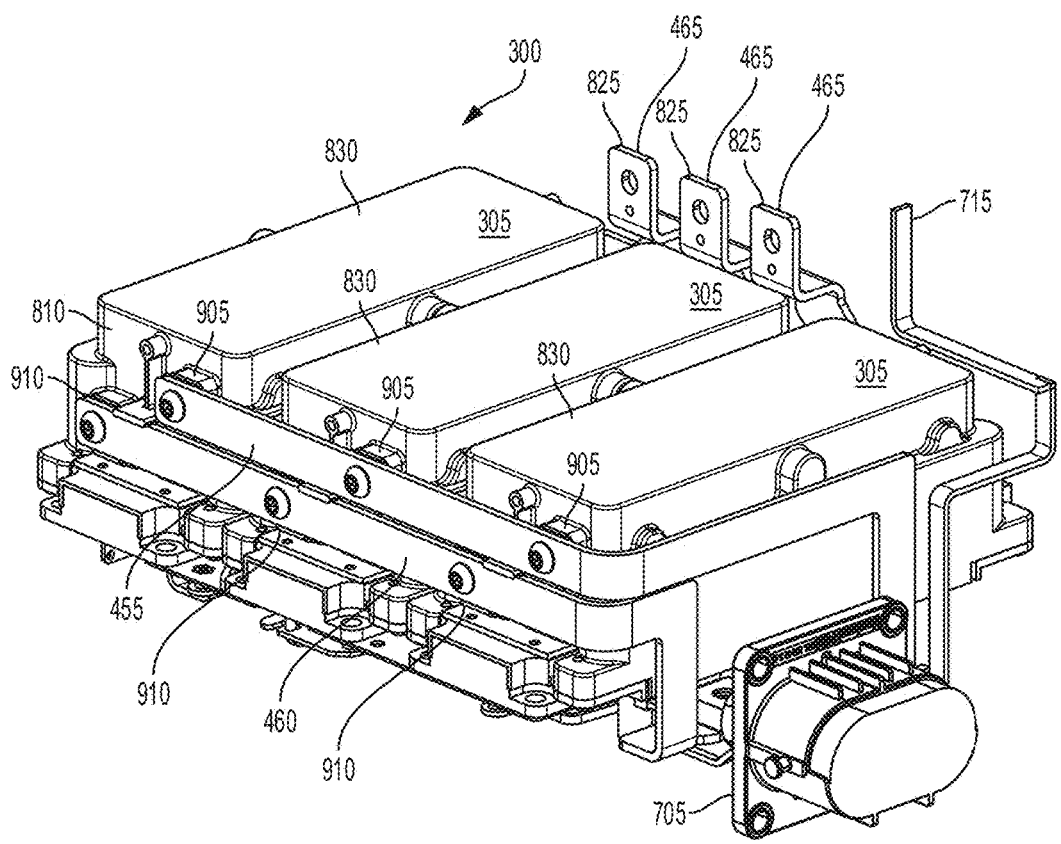
FIG. 9 depicts an example isometric view of the inverter module of FIG. 8 rotated to illustrate the coupling between the inputs of the first, second and third half-bridge modules and the positive and negative bus-bars, according to an illustrative implementation.

FIG. 9 shows the first, second and third half-bridge modules 305, of FIGS. 8 and 9 rotated to further illustrate the coupling between the first, second and third half-bridge modules 305 and the positive and negative bus-bars 455, 460. The first half-bridge module 305 includes a first positive input 905 and a first negative input 910. The first positive input 905 is coupled with the positive bus-bar 455 and the first negative input 910 is coupled with the negative bus-bar 460. The second half-bridge module 305 includes a second positive input 905 and a second negative input 910. The second positive input 905 is coupled with the positive bus-bar 455 and the second negative input 910 is coupled with the negative bus-bar 460. The third half-bridge module 305 includes a third positive input 905 and a third negative input 910. The third positive input 905 is coupled with the positive bus-bar 455 and the third negative input 910 is coupled with the negative bus-bar 460.

The first, second and third half-bridge modules 305 are positioned adjacent to each other in a triplet configuration having each of their respective positive inputs 905 and negative inputs 910 aligned with each other. Thus, the positive bus-bar 455 and the negative bus-bar 460 can be disposed adjacent to each other and parallel to each other along the same side surface 810 of each of the first, second and third half-bridge modules 305. For example, the each of the first, second, third positive inputs 905 can be positioned or formed such that they are at a first level or first height along the first side surfaces 810 of the half-bridge modules 305. Each of the first, second, third negative inputs 910 can be positioned such that they are at a second level or second height along the first side surfaces 810 of the half-bridge modules 305.

The positive inputs 905 can be positioned at a different level or height (e.g., above, below) with respect to the negative inputs 910 along the first side surfaces 810 of the half-bridge modules 305. The positive inputs 905 and the negative inputs 910 can be disposed at different levels so that the positive bus-bar 455 is spaced from the negative bus-bar 460. The spacing of the positive inputs 905 and the negative inputs 910 can be selected and formed to meet clearance needs or requirements between the positive bus-bar 455 and the negative bus-bar 460. For example, the positive inputs 905 can be positioned above the negative inputs 910 or the positive inputs 905 can be positioned below the negative inputs 910. The first positive input 905 can be positioned such that it is directly aligned (e.g., directly over, directly under) or offset with respect to the negative input 910. For example, and as depicted in FIG. 9, the positive inputs 905 are offset with respect to the corresponding negative inputs 910.

The positive bus-bar 455 and negative bus-bar 460 can be positioned such that they couple with each of the half-bridge modules 305 in a relatively straight arrangement. The straight and parallel arrangement allows the positive bus-bar 455 and negative bus-bar 460 to occupy less room within the inverter module 300. Thus, the inverter module 300 can be formed having a compact design. The straight and parallel arrangement can increase an efficiency of the manufacture as the positive and negative bus-bars 455, 460 can be coupled with the same side surfaces 810 of each of the half-bridge modules 305 in a relatively straight fashion. The first, second, and third half-bridge modules 305 can be aligned such their side surfaces, ends, top surfaces, and bottom surfaces are aligned with respect to each other. For example, and as depicted in FIG. 9, the first side surfaces 810 of the first, second, and third half-bridge modules 305 are aligned with respect to each other. The second side surfaces 820 of the first, second, and third half-bridge modules 305 are aligned with respect to each other. The top surfaces 830 of the first, second, and third half-bridge modules 305 are aligned with respect to each other.

Figure 10:
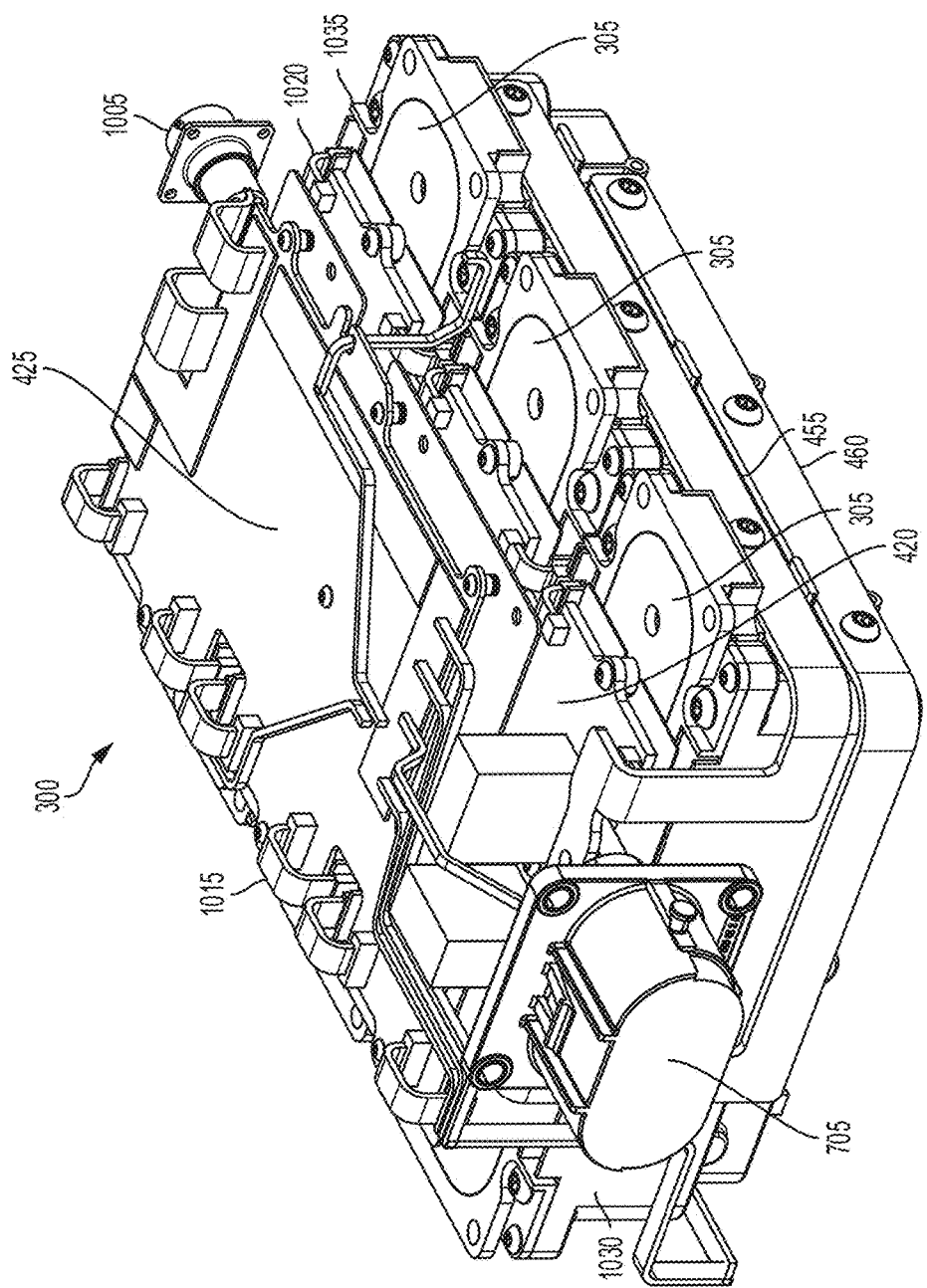
FIG. 10 depicts an example isometric view of the inverter module of FIG. 8 rotated to illustrate the coupling between the first, second and third half-bridge modules and a printed circuit board coupled with one surface of each of the first, second and third half-bridge modules, according to an illustrative implementation.

FIG. 10 shows a bottom view of the first, second and third half-bridge modules 305 to illustrate different circuitry components coupled with the first, second and third half-bridge modules 305. For example, the control PCB 425 is coupled with each of the first, second and third half-bridge modules 305. Further, multiple power PCBs 420 are coupled with the first, second and third half-bridge modules 305. The control PCB 425 and the power PCBs 420 can include control electronics and power electronics to control operation of the half-bridge modules 305. The control PCB 425 can be coupled with each of the first, second and third half-bridge modules 305 to provide controls signals to the first, second and third half-bridge modules 305. For example, the control PCB 425 can generate control signals to activate (e.g., turn-on) or deactivate (e.g., turn-off) one or more of the first, second and third half-bridge modules 305.

Each of the first, second, and third half-bridge modules 305 can couple with at least one power PCB 420. For example, and as illustrated in FIG. 10, a first power PCB 420 couples with the first half-bridge module 305 through a first cold plate of the first half-bridge module 305. A second power PCB 420 couples with the second half-bridge module 305 through a second cold plate of the second half-bridge module 305. A third power PCB 420 couples with the third half-bridge module 305 through a third cold plate of the first half-bridge module 305. The power PCBs can couple with a first surface (e.g., bottom surface, top surface) of the cold plates within the half-bridge modules 305 such that power PCBs are coupled with an opposite surface of the cold plate as compared to a second surface of the cold plate (e.g., top surface, bottom surface) that is positioned adjacent to or proximate to a capacitor or transistors within the half-bridge modules 305. The power PCBs 420 can correspond to power supply PCBs and generate power signals for the half-bridge modules 305. The power PCBs 420 can provide the power signals to control a power level or output level of one or more of the first, second and third half-bridge modules 305.

The half-bridge modules 305 can include low voltage PCB wires 1015 and high voltage PCB wires 1020. The low voltage PCB wires 1015 can couple the control PCB 425 to the first, second, and third half-bridge modules 305. For example, the low voltage PCB wires 1015 can loop through or couple different portions of the control PCB 425 with the half-bridge modules 305. The high voltage PCB wires 1020 can couple the power PCBs 420 to the half-bridge modules 305. The high voltage PCB wires 1020 can through or couple different portions of the power PCBs 420 with the half-bridge modules 305.

A DC connector 705 (e.g., HV connector) couples with the positive bus-bar 455 and the negative bus-bar 460. The DC connector 705 can be formed on or coupled with a first end surface 1030 of the inverter module 300. The DC connector 705 can provide a high voltage power source corresponding to a first voltage range (e.g., high voltage range) to the positive bus-bar 455 and the negative bus-bar 460. An LV connector 1005 couples with a second end surface 1035 (e.g., opposite end from first end 1830) of the inverter module 300. The LV connector 1005 can provide a low voltage power source corresponding to a second voltage range (e.g., low voltage range) to the inverter module 300.

Figure 12:
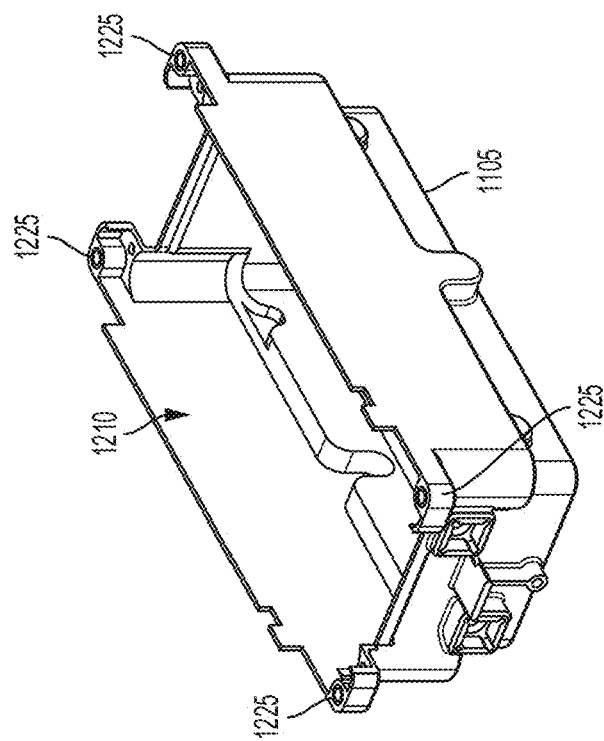
FIG. 12 depicts an example bottom view of a gel tray to be disposed over different components of a half-bridge module, according to an illustrative implementation.
Figure 11:
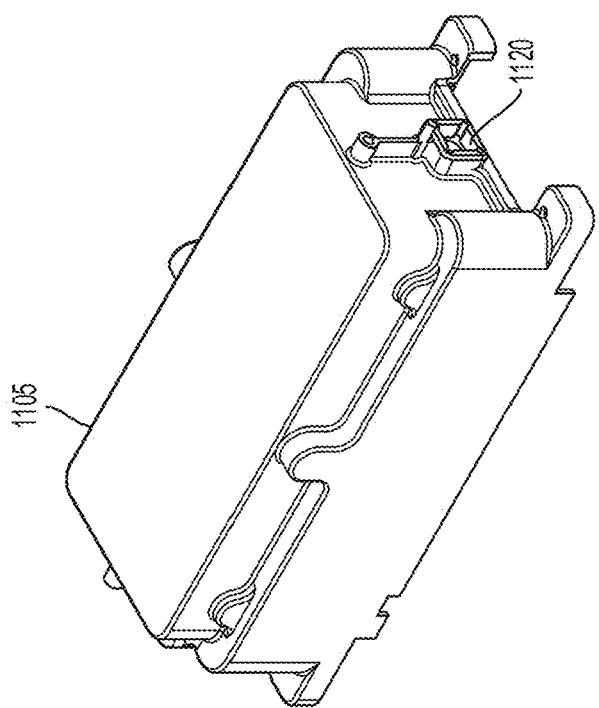
FIG. 11 depicts an example top view of a gel tray to be disposed over different components of a half-bridge module, according to an illustrative implementation.

FIGS. 11-12 show various views of a gel tray 1105. The gel tray 1105 (e.g., potting compound container) can include poly carbon material, or other forms of high temperature plastic. The gel tray 1105 can be formed using various injection molded techniques. The gel tray 1105 can be disposed over one or more components of a half-bridge module 305 or inverter module 300 and operate as an insulator for the components (e.g., electronics) of the half bridge module 305 or inverter module 300. The gel tray 1105 can include or be formed having an inner region 1210 that covers, submerges, or can be disposed about multiple components of a half-bridge module 305 or inverter module 300. For example, components such as but not limited to a capacitor, transistors, or PCBs can be submerged by or otherwise disposed within the inner region 1210 to provide cooling to the respective components.

The gel tray 1105 includes one or more capacitive orifices 1120. The capacitive orifices 1120 can be used as inputs or outputs for a half-bridge module 305 or inverter module 300. For example, the capacitive orifices 1120 can be formed as a hole or an access point to couple a power supply with DC connector, positive bus-bar, or negative bus-bar disposed within the gel tray 1105. The capacitive orifices 1120 can be formed as a hole or an access point to provide a power (e.g., voltage) generated by a half-bridge module 305 or inverter module 300 to other systems, such as a drive train unit of an electric vehicle.

The gel tray 1105 includes one or more connection points 1225. The connection points 1225 can include threaded inserts, holes, or receptacles. The connection points 1225 can be used to couple the gel tray 1105 to other components of a half-bridge module 305 or inverter module 300. For example, the connection points 1225 can receive a fastener (e.g., screw, bolt) to couple the gel tray 1105 to one or more shallow regions of a cold plate. The gel tray 1105 can be formed in a variety of different shapes and having different dimensions. As depicted in the FIGS. 11-12, the gel tray 1105 can be formed having a rectangular shape. The shape and dimensions of the gel tray 1105 can be selected based in part on the shape and dimensions of a half-bridge module 305 or inverter module 305 the gel tray 1105 is coupled with.

Figure 13:
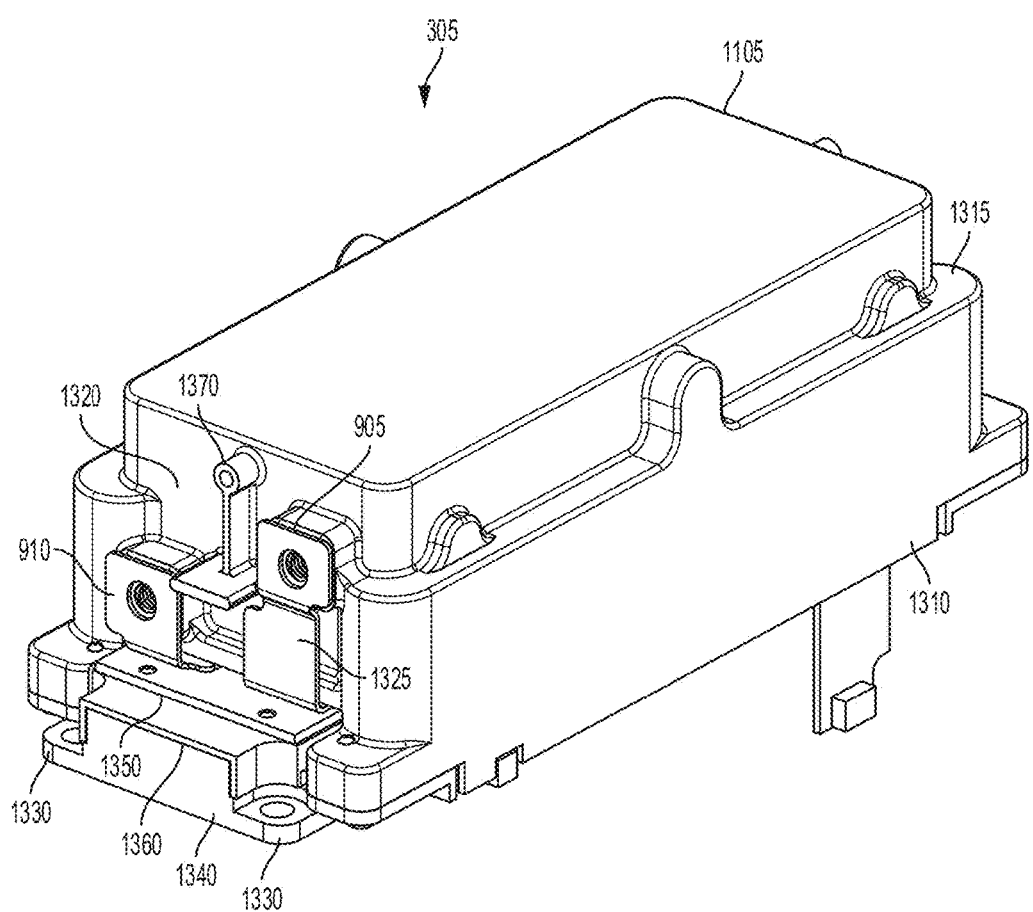
FIG. 13 depicts an example isometric view of a half-bridge module illustrating the positive and negative inputs, thermal pad and cold plate interface, according to an illustrative implementation.

FIG. 13 illustrates a half-bridge module 305 having a positive phase input 905, a negative phase input 910, a thermal pad 1350, and a cold plate 1340. The positive phase input 905 and negative phase input 910 are coupled or disposed on a first side surface 1320 of the half-bridge module 305 (e.g., on the same side). By having the positive phase input 905 and negative phase input 910 on the same first side surface 1320, positive and negative bus-bars to be arranged in a straight and parallel fashion with respect to each other. The positive phase input 905 can be disposed at a different height or level with respect to the negative phase input 910. For example, the positive phase input 905 can be disposed higher or lower than the negative phase input 910 along the first side surface 1320 of the half-bridge module 305. The positive phase input 905 can be disposed offset as compared to the negative phase input 910 in one or more directions (e.g., horizontally, vertically) along the first side surface 13205 of the half-bridge module 305.

The positive phase input 905 can be coupled with a thermal pad 1350 by a clearance layer 1325. The clearance layer 1325 can include copper or to other forms of sheet metal and can be disposed to provide clearance for the positive phase input 905 from a negative bus-bar when the half-bridge module 305 is coupled within an inverter module 300 having multiple half-bridge modules 305. The thermal pad 1350 can be disposed between the positive phase input 905, the negative phase input 910 and the cold plate 1340. The thermal pad 1350 is disposed over or in at least one slot of a locator 1360. The locator 1360 is disposed over the cold plate 1340. The thermal pad 1350 can be disposed within a slot of the locator 1360 such that a portion of the thermal pad 1350 is in contact with a portion of the cold plate 1340. The thermal pad 1350 and the cold plate 1340 can provide active cooling to the positive phase input 905 and the negative phase input 910. For example, the thermal pad 1350 an the cool plate 1340 can provide heat dissipation or heat rejection for heat generated at or by the positive phase input 905 and the negative phase input 910.

A PCB 1310 can be coupled with a side surface 1315 of the half-bridge module 305. The PCB 1310 may be coupled with a different surface 1315 than the first side surface 1320 the positive phase input 905 and the negative phase input 910 are coupled with. The half-bridge module 305 can include a gel tray 1105 disposed over different components of the half-bridge module 305. The half-bridge module 305 can include one or more mounting tabs 1330. The mounting tabs 1330 can couple with different surfaces within an inverter module 300 to couple the half-bridge module 305 within the inverter module 300. The half-bridge module 305 can include a receptacle 1370 (e.g., assembly dowel receptacle) formed on the first side surface 1320. The receptacle can include an orifice or hole and be used during a manufacture process to grab or position the half-bridge module 305 such that the half-bridge module 305 can be disposed within an inverter module 300.

Figure 14:
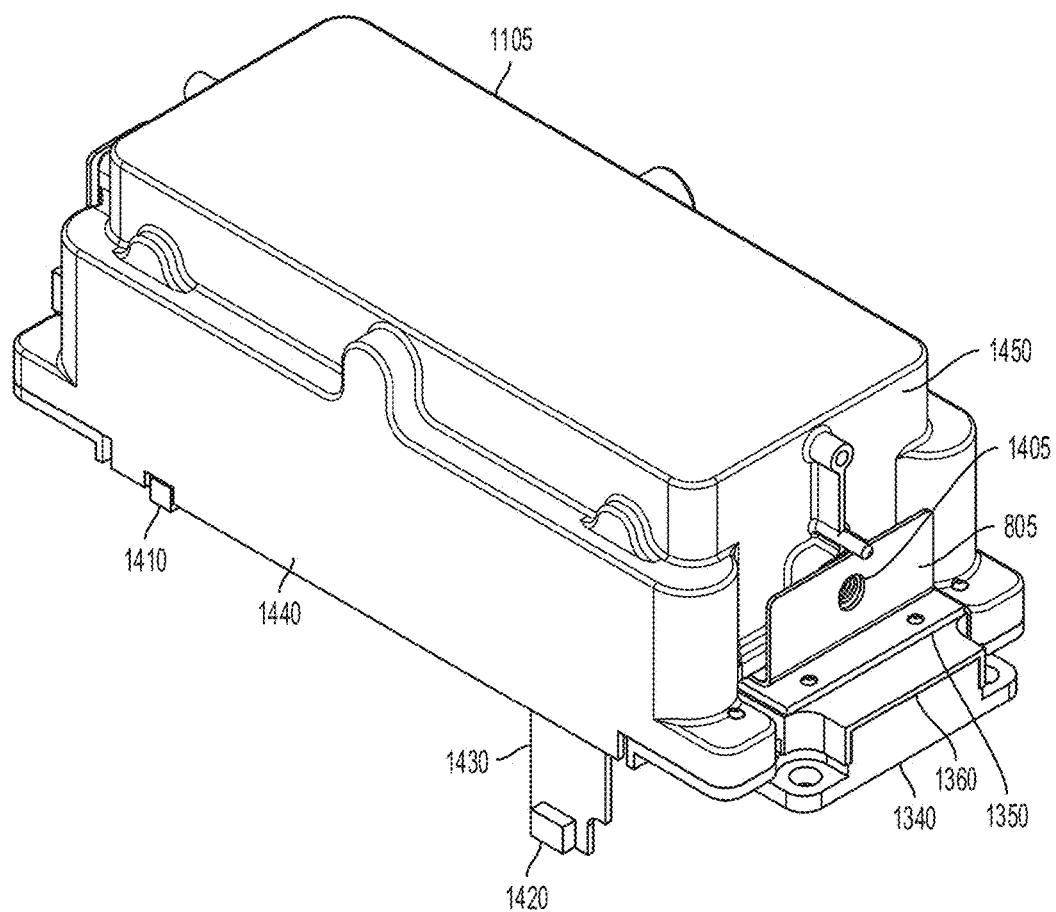
FIG. 14 depicts an example isometric view of the half-bridge module of FIG. 13 rotated to show a phase output terminal, thermal pad and cold plate interface, according to an illustrative implementation.

FIG. 14 shows a half-bridge module 305 of FIG. 13 with a rotated view to show a phase output terminal 805 coupled with a second side surface 1450 of the half-bridge module 305. The phase output terminal 805 can be coupled with an opposite side surface 1450 as compared to the first side surface 1320 the positive phase input 905 and the negative phase input 910 are coupled with. The phase output terminal 805 includes an orifice 1405. For example, the orifice 1405 can have a square, round or circular shape and include a threaded inner region to receive a threaded connection from a phase bus-bar. The orifice 1405 may include or couple with a captive nut or a cage nut to form a connection between the phase output terminal 805 and the phase bus-bar.

A thermal pad 1350 is disposed between the phase output terminal 805 and a cold plate 1340. The thermal pad 1350 is disposed over or in at least one slot of a locator 1360. The locator 1360 is disposed over the cold plate 1340. The thermal pad 1350 can be disposed within a slot of the locator 1360 such that a portion of the thermal pad 1350 is in contact with a portion of the cold plate 1340. The thermal pad 1350, in combination with the cold plate 1340, can provide active cooling to the phase output terminal 805. For example, the thermal pad 1350 and cold plate 1340 can provide heat dissipation or heat rejection for heat generated at or by the phase output terminal 805. The thermal pad 1350 can be in contact with a surface or portion of the phase output terminal 805 or the thermal pad 1350 may be spaced a predetermined distance from the phase output terminal 805. The thermal pad 1340 can include non-conductive material, such as but not limited to, aluminum oxide, aluminum nitride, silicon material or a silicon aluminum blend material.

The half-bridge module 305 includes a HV connector 1410 and a LV connector 1420. The HV connector 1410 and the LV connector 1420 can be coupled with or disposed on a common side surface, here surface 1440. The HV connector 1410 and the LV connector 1420 may be coupled with or disposed on different side surfaces of the half-bridge module 305. The HV connector 1410 may extend a first distance from the side surface 1440 and the LV connector 1420 may extend a second, different distance from the side surface 1440. The first distance may be less than or greater than the second distance. The HV connector 1410 and the LV connector 1420 can extend from the side surface 1440 to provide a more accessible connection point to couple with a power source or to provide power to different components of an inverter module 300 or a drive train unit of an electric vehicle. For example, the HV connector 1410 can couple with a high voltage power source to receive voltage in a first voltage range for the half-bridge module 305. The LV connector 1420 can couple with a low voltage power source to receive voltage in a second voltage range for the half-bridge module 305.

A PCB 1430 can couple the LV connector 1420 to the side surface 1440 of the half-bridge module 305. The PCB 1430 can extend from the side surface 1440 to electrically couple the LV connector 1420 to different components, electronics or circuitry within the half-bridge module 305. The PCB 1430 can include circuitry to transfer power provided to the LV connector 1420 to different components, electronics or circuitry within the half-bridge module 305. A gel tray 1105 can be coupled with or disposed over components of the half-bridge module 305. The gel tray 1105 can be positioned such that it covers multiple sides of components (e.g., capacitor, transistor, PCBs) within the half-bridge module 305.

Figure 15:
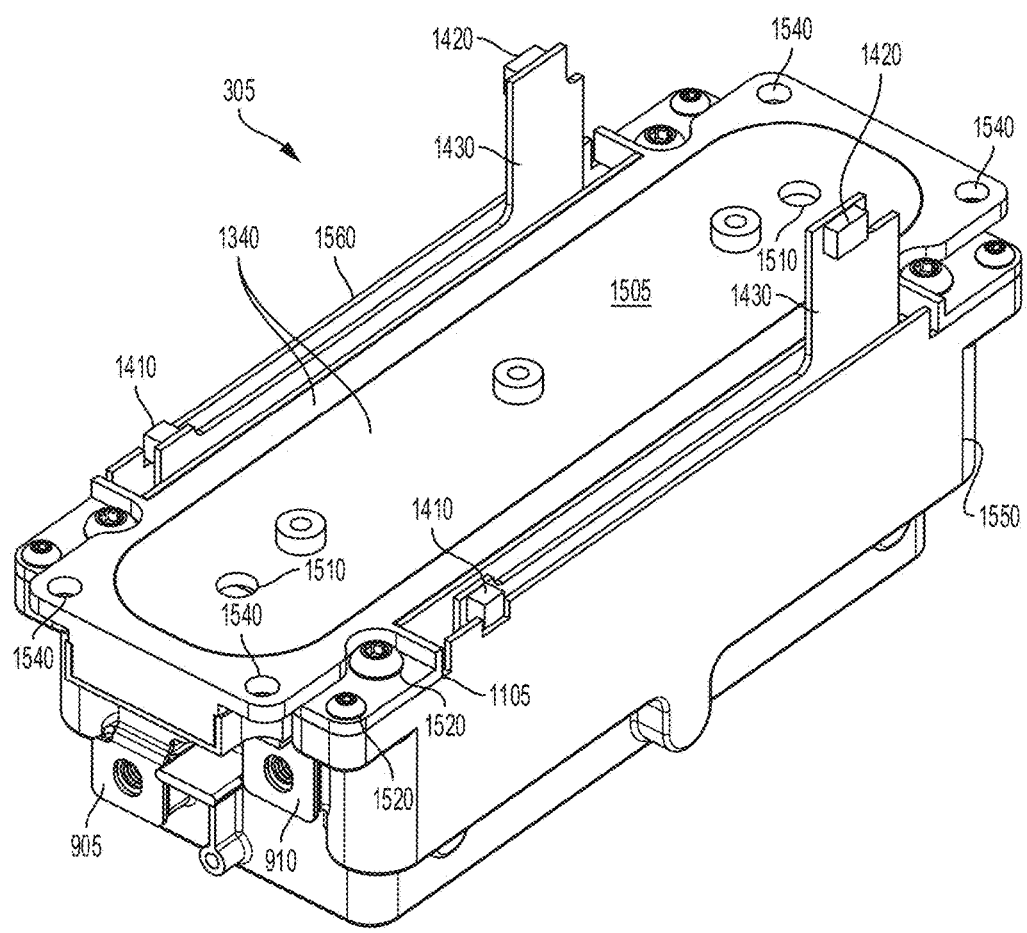
FIG. 15 depicts an example isometric view of the half-bridge module of FIG. 13 rotated to show a cold plate coupled with a gel tray, according to an illustrative implementation.

FIG. 15 shows the half-bridge module 305 rotated to show a bottom view and in particular, a view of a bottom surface 1505 of the cold plate 1340. The cold plate 1340 is coupled with the gel tray 1105 through a plurality of fasteners 1520. For example, a surface 1505 (e.g., bottom surface, top surface) of the cold plate 1340 can include a plurality of holes (e.g., threaded holes) to receive the plurality of fasteners 1520. The fasteners 1520 can extend through the cold plate 805 and couple with threaded holes formed in the gel tray 1105. In this arrangement, the fasteners 1520 can be coupled away from electronics or other conductive components, conductive surfaces (e.g., input terminals 905, 910, output terminals, capacitor) of the half-bridge module 305. The fasteners 1520 may be spaced a predetermined distance from electronics or other conductive components, or conductive surfaces of the half-bridge module 305.

For example, and as illustrated in the FIG. 15, the positive input 905 and the negative input 910 are spaced from the fasteners 1520 to, for example, avoid an electrical short between the positive input 905, the negative input 910 and the fasteners 1520. Thus, the half-bridge module 305 can be formed having adequate clearances/isolation between high voltage conductors and ground (cold plate, fasteners, clips). For example, non-conductive materials, surfaces (e.g., plastic, thermal pad) may disposed next to or adjacent to the conductive materials, surfaces of the half-bridge module 305.

The fasteners 1520 can include fasteners of different sizes and dimensions. For example, the half-bridge module 305 may include four first fasteners 1520 and four second fasteners 1520 with at least one first fastener 1520 and at least one second fastener 1520 coupled at each corner of the cold plate 1340. The first fasteners 1520 can be smaller in size than the second fasteners 1520. The first fasteners 1520 can correspond to gel tray fasteners to couple the gel tray 1105 with the cold plate 1340. The second fasteners 1520 can correspond to capacitor fasteners to couple the capacitor or capacitor frame to the cold plate 1340.

A first PCB 1430 can couple with and extend from a first side surface 1550 of the half-bridge module 305 and a second PCB 1430 can couple with and extend from a second side surface 1560 of the half-bridge module 305. The PCBs 1430 can couple with at least one LV connector 1420. For example, and as depicted in FIG. 15, the first PCB 1430 couples with a first LV connector 1420 and the second PCB 1430 couples with a second LV connector 1420. The PCBs 1430 can include circuitry to transfer power provided to the LV connectors 1420 to different components, electronics or circuitry within the half-bridge module 305. The LV connectors 1410 can couple with a power source to provide power in a second voltage range (e.g., low voltage) to the half-bridge module 305. A first HV connector 1410 is coupled with and extends from the first side surface 1550 of the half-bridge module 305 and a second HV connector 1410 is coupled with and extends from the second side surface 1560 of the half-bridge module 305. The HV connectors 1410 can couple with a power source to provide power in a first voltage range (e.g., high voltage) to the half-bridge module 305.

The cold plate 1340 includes one or more coolant ports 1510. For example, and as depicted in FIG. 15, the a first coolant port 1510 can be formed through the surface 1505 of the cold plate 1340 at a first end and a second coolant port 1510 can be formed through the surface 1505 of the cold plate 1340 at a second, different end. The coolant ports 1510 can be formed as orifices or holes formed through the surface 1505 of the cold plate 1340. The coolant ports 1510 can be fluidly coupled with each other through a tube or conduit disposed within the cold plate 1340 or a half-bridge module 305 that the cold plate 1340 is disposed within. The coolant ports 1510 can be fluidly coupled with one or more cooling passages or cooling channels formed within the cold plate 1340 such that coolant can be provided to the cooling channels within the cold plate 1340 through the coolant ports 1510.

The half-bridge module 305 can include one or more mounting tabs 1540. The mounting tabs 1540 can include holes, tabs, or flanges formed at ends or side surfaces of the half-bridge module 305. For example, and as depicted in FIG. 15, the mounting tabs 1540 can be formed at each corner of the half-bridge module 305 such that the half-bridge module 305 includes four mounting tabs 1540. The mounting tabs 1540 can receive or couple with connection points within an inverter module 300 to couple the half-bridge module 305 with the inverter module 300 or with other half-bridge modules within the inverter module 300.

Figure 16:
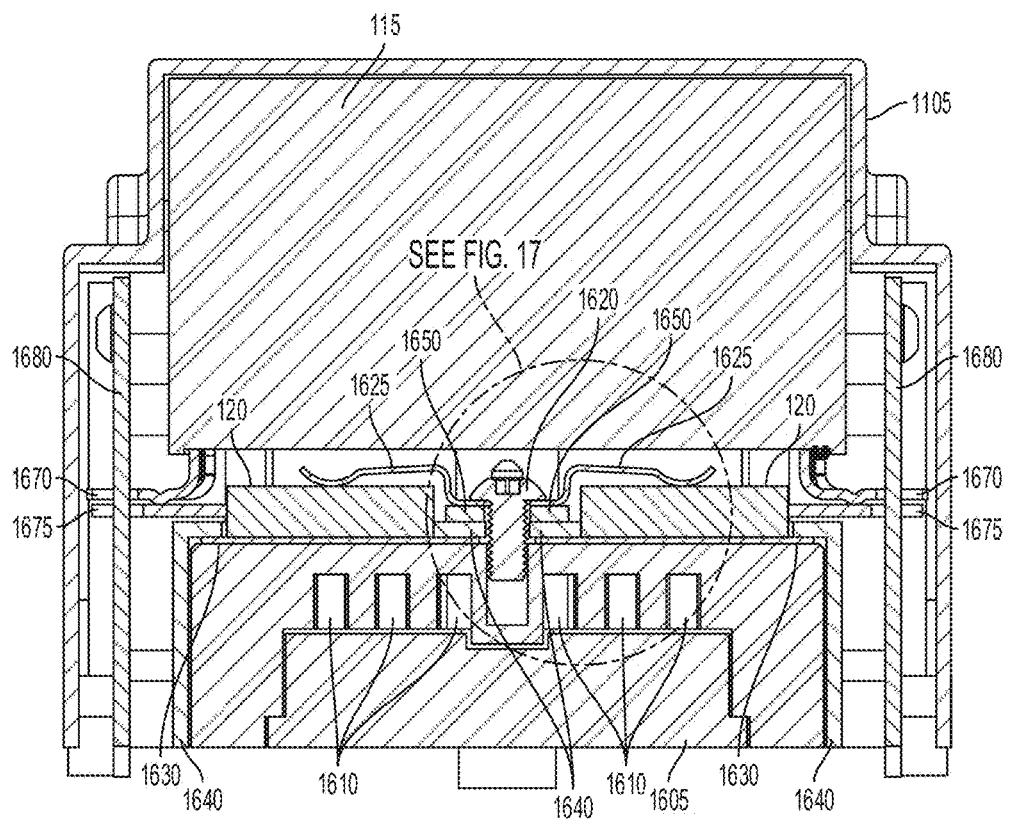
FIG. 16 depicts an example cross-sectional views of a section of a half-bridge module to illustrate the spatial arrangement of the different components of the half-bridge module, according to an illustrative implementation.
Figure 17:
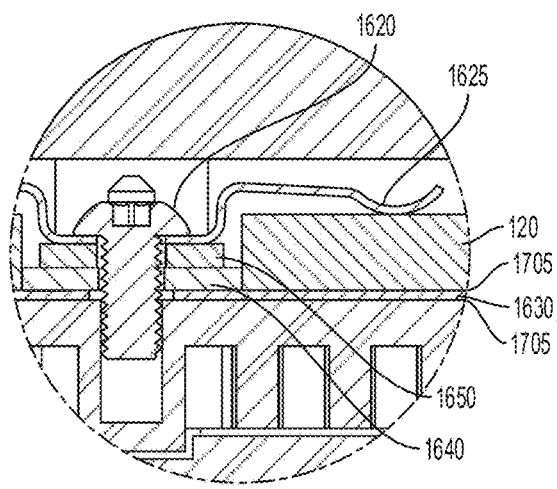
FIG. 17 depicts an example exploded view of a section of a half-bridge module to illustrate the interface between the clips, transistors, PCB, locator, ceramic layer and cold plate, according to an illustrative implementation.

FIGS. 16-17 provides a cut away view of a half-bridge module 305 having a capacitor 115, first and second transistors 120, and a cold plate 1605 disposed within the half-bridge module 305. The capacitor 115 is disposed over first and second transistors 120 and a clip 1620 is disposed between the first and second transistors 120. The clip 1620 includes two gull wings 1625. For example, a first gull wing 1625 extends out and over the first transistor and a second gull wing 1625 extends out and over the second transistor 120. The gull wings 1625 of the clip 1620 can compress or otherwise hold the first and second transistors 120 in place and against a ceramic layer 1630 disposed between the first and second transistors 120 and the cold plate 1605. For example, the gull wings 1625 can be positioned to compress the first and second transistors 120 towards the cold plate 1605 to increase the cooling provided by the cold plate 1605.

A third PCB or temperature sensing PCB 1650 can be disposed between the clip 1620 and a first surface (e.g., top surface) of a locator 1640. The third PCB 1650 can include a temperature sensor and be configured to provide temperature data (e.g., temperature readings) corresponding to the first and second transistors 120. For example, the temperature sensor (e.g., thermistor) can operate to provide temperature sensing capability within the half-bridge module. The third PCB 1650 can be configured to determine or predict transistor junction temperatures (e.g., IGBT junction temperatures) within the half-bridge module 305. The locator 1640 can include a plurality of slots to hold or couple with the first and second transistors 120, the clip 1620, and the third PCB 1650.

The locator 1640 can be disposed over or on the ceramic layer 1630. The ceramic layer 1630 may include ceramic based material and be configured to electrically insulate the cold plate 1605 from the first and second transistors 120. For example, the ceramic layer 1630 can be configured to prevent a short circuit condition between the cold plate 1605 and the first and second transistors 120.

The cold plate 1605 includes the plurality of cooling passages 1610 in which coolant can by pumped or otherwise provided through. The cooling channels 1610 can be formed within the cold plate 1605 such that they are positioned proximate to or within a predetermined distance from the plurality of transistors 120, here the first and second transistors 120. The cold plate 1605 can include aluminum or an aluminum heat sink. The cold plate 1605 can include one or more different layers or one or more different materials. The different layers of the cold plate 1605 can be formed into a single layer during manufacture, such as by friction stir weld construction.

The first transistor 120 includes a first set of leads 1675 coupled with a first PCB 1680 and the second transistor 120 includes a second set of leads 1675 coupled with a second PCB 1680. The first set of leads 1675 can extend through an orifice or hole formed in the first PCB 1680 to couple the first transistor 120 with the first PCB 1680. The first PCB 1680 can include control circuitry to generate and provide control signals to the first transistor 120 to activate (e.g., turn-on) or de-activate (e.g., turn-off) the first transistor 120. The second set of leads 1675 can extend through an orifice or hole formed in the second PCB 1680 to couple the second transistor 120 with the second PCB 1680. The second PCB 1680 can include control circuitry to generate and provide control signals to the second transistor 120 to activate (e.g., turn-on) or de-activate (e.g., turn-off) the first transistor 120.

The capacitor 115 includes a first set of leads 1670 coupled with the first PCB 1680 and a second set of leads 1670 coupled with the second PCB 1680. The first set of leads 1670 and the second set of leads 1670 can include or be formed having a curved or bent shape to accommodate coupling with the first and second PCBs 1680. The first set of leads 1670 and the second set of leads 1670 can extend through an orifice or hole formed in the first and second PCB's 1680 to couple the capacitor 115 with the first and second PCB's 1680. The first and second PCB's 1680 can include or be coupled with control circuitry (e.g., IGBT control circuitry) and can be configured to provide control signals to the capacitor 115 to control operation of the capacitor 115. The first and second PCBs 1680 can be oriented vertically with respect to the capacitor 115 and have minimal conductor length between the transistors 120 (e.g., IGBT dies) and control circuitry of the first and second PCBs 1680.

FIG. 17 provides a cut-away view of the spatial relationship between the clip 1620, the first transistor 120, the ceramic layer 1630, the locator 1640, and the cold plate 1605. For example, the first gull wing 1625 of the clip 1620 can contact a first surface (e.g., top surface) of the first transistor 120 can compress the first transistor towards the ceramic layer 1630 and the cold plate 1605 to increase a cooling provided by the cold plate 1605. A first thermal grease layer or bondline 1705 can be disposed between a second surface (e.g., bottom surface) of the first transistor 120 and a first surface (e.g., top surface) of the ceramic layer 1630. A second thermal grease layer or bondline 1705 can be disposed between a second surface (e.g., bottom surface) of the ceramic layer 1630 and a first surface (e.g., top surface) of the cold plate 1605.

Figure 18:
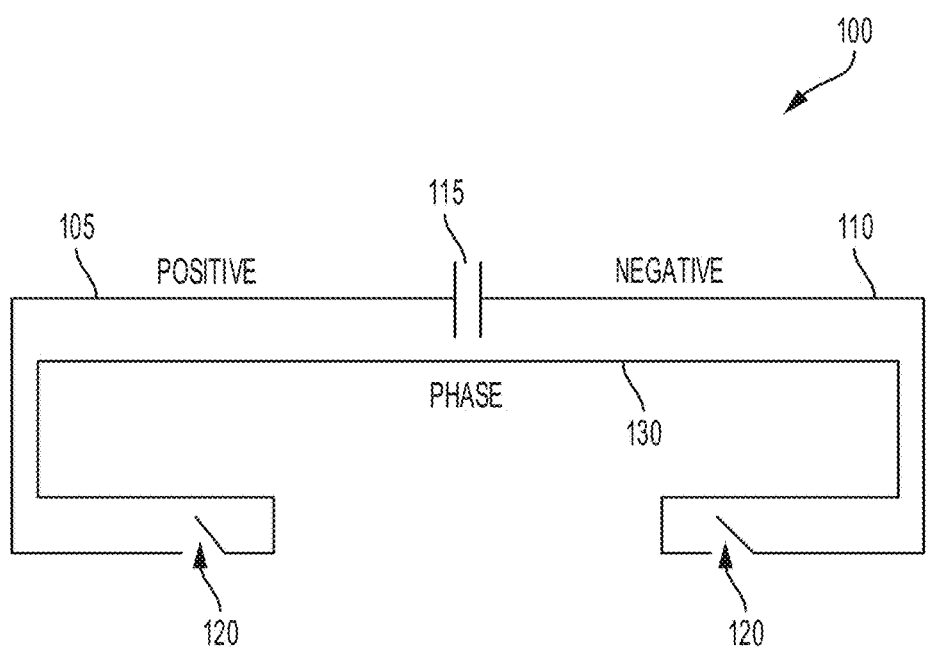
FIG. 18 depicts an example sectional view of a half-bridge module circuit formed within a half-bridge module using the lead frame of a capacitor as a bus-bar, according to an illustrative implementation.

In FIG. 18, the half-bridge module 305 of FIG. 17 is provided showing a half-bridge module circuit 100 formed by the components of the half-bridge module 305. The circuit 100 can be formed between components of the half-bridge module 305, such as the capacitor 115 and first and second transistors 120. For example, the circuit 100 includes a positive terminal 105 coupled with at least one terminal of the capacitor 115 and a negative terminal 110 coupled with a second terminal of the capacitor 115. The positive terminal 105 is coupled between the capacitor 115 and the first transistor 120. The negative terminal 110 is coupled between the capacitor 115 and the second transistor 120.

The first transistor 120 can include at least one terminal (e.g., emitter terminal) coupled with a phase output terminal 130 and the second transistor 120 can include at least one terminal (e.g., collector terminal) coupled with the phase terminal 130. The first and second transistors 120 can operate as switches within the half-bridge module 305. The positive terminal 105 can be coupled with a positive input terminal of the half-bridge module 305 and the negative terminal 110 can be coupled with a negative input terminal of the half-bridge module 305. The phase terminal 130 can be coupled with a phase output of the half-bridge module 305 to provide a single phase output voltage generated by the half-bridge module 305 for a drive unit of an electric vehicle.

Figure 19:
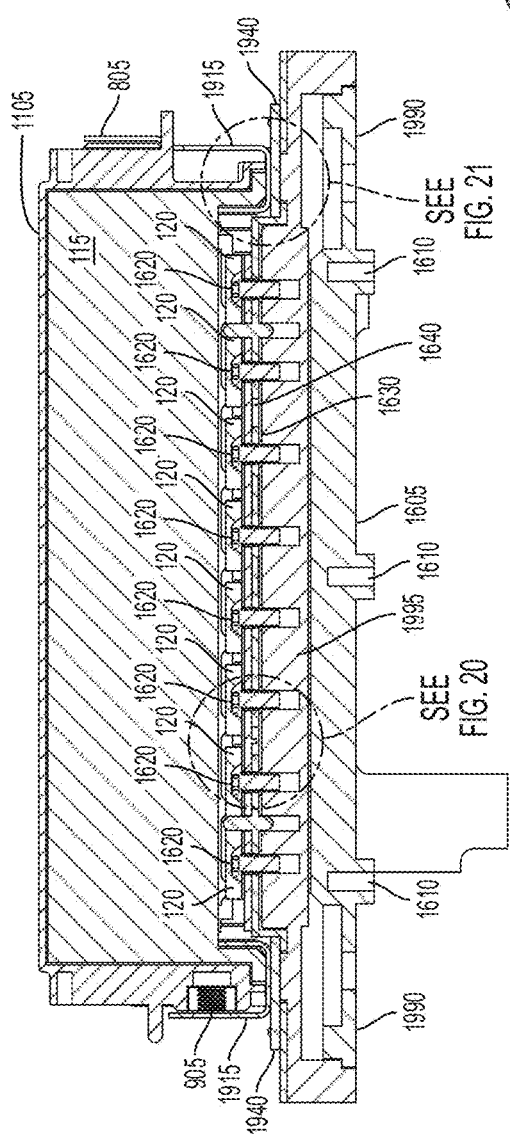
FIG. 19 depicts an example cut-away view of a half-bridge module to illustrate the different components and layers of the half-layer bridge module with respect to each other, according to an illustrative implementation.
Figure 20:
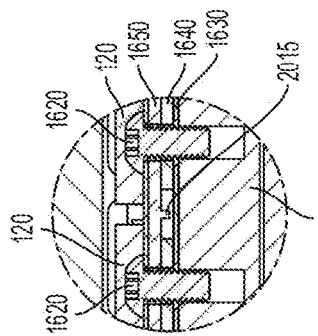
FIG. 20 depicts an example exploded view of a section of a half-bridge module to illustrate the interface between the clips, transistors, PCB, locator, ceramic layer and cold plate, according to an illustrative implementation.
Figure 21:
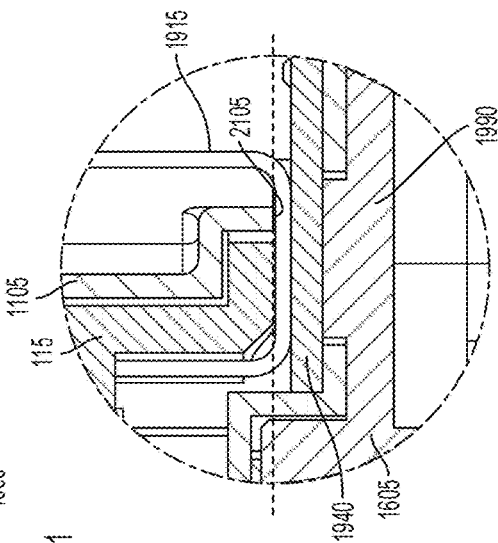
FIG. 21 depicts an example exploded view of a section of a half-bridge module to illustrate the interface ends of the gel tray, capacitor conductors, the thermal pad, and cold plate, according to an illustrative implementation.

FIGS. 19-21, provide cut-away views of a half-bridge module 305 illustrating the spatial relationship between the different components of the half-bridge module 305. The half-bridge module 305 includes a gel tray 1105 disposed about or over a capacitor 115. The half-bridge module 305 includes a positive phase input 905, a negative phase input (not shown), and a phase output terminal 805. The positive phase input 905, the negative phase input (not shown), and the phase output terminal 805 can be coupled with the capacitor 115. For example, a first conductor 1915 can couple the capacitor 115 with the positive input 905, a second conductor 1915 can couple the capacitor 115 with the negative input (not shown), and a third conductor 1915 can couple the capacitor 115 with the phase output terminal 805. The conductors 1915 can include conductive material (e.g., copper). The conductors 1915 can be formed having a bent shape, curved shape or a U-shape to couple at least one of the positive phase input 905, the negative phase input (not shown), or the phase output terminal 805 with the capacitor 115.

The positive phase input 905, the negative phase input (not shown), and the phase output terminal 805 may include conductive materials, such as but not limited to, copper. The gel tray 1105 can be disposed such that it is disposed over the capacitor 115 and includes orifices (e.g., holes) to provide a connection between the positive phase input 905, the negative phase input (not shown), the phase output terminal 805, and the capacitor 115.

The half-bridge module 305 includes a plurality of transistors 120 coupled with a locator 1640 using a plurality of clips 1620. The clips 1620 can couple with the locator 1640 through threaded inserts formed in the locator 1640. The clips 1620 can include gull wings 1625 to extend out and over the transistors 120 such that the gull wings 1625 compress and hold the transistors 120 in place in slots formed in the locator 1640. The locator 1640 is disposed over a ceramic layer 1630. The ceramic layer 1630 is disposed over a cold plate 1605 having a plurality of cooling channels 1610. The cooling channels 1610 can be formed such that they are aligned (here under) the capacitor 115 and transistors 120 to provide cooling to the capacitor 115 and the transistors 120.

As depicted in FIG. 20, a PCB 1650 can be coupled with the locator 1640 by the clips 1620. The PCB 1650 can include at least one temperature sensor 2015 (e.g., thermistor) coupled with or formed within the PCB 1650. The temperature sensor 2015 can measure temperatures for one or more transistors and the PCB 1650 can generate temperature data corresponding to the one or more transistors. Further, and as depicted in FIG. 20, the PCB 1650 is disposed between the transistors 120 and the locator 1640. The ceramic layer 1630 is disposed between the locator 1640 and the cold plate 1605. The ceramic layer 1630 can operate as an electrical insulator between the locator 1640 and the cold plate 1605.

Referring back to FIG. 19, at opposing ends of the half-bridge module 305, thermal pads 1940 can be disposed between a portion of the cold plate 1605 and a portion of the capacitor 115. The thermal pads 1940 can operate as a thermal interface between the electronics of the half-bridge module 305, here the capacitor 115 and the cold plate 605. For example, the thermal pads 1940 can provide active cooling for inputs 905 and outputs 805 of the half-bridge module 305. As depicted in the FIG. 19, a first thermal pad 1940 is disposed proximate to and aligned with (e.g., positioned under) the positive input 905 (and the negative input) and a second thermal pad 1940 is disposed proximate to and aligned with (e.g., positioned under) the phase output terminal 805. Further, a first portion of the cold plate 1605 can be aligned with (e.g., positioned under) the positive input 905 (and negative input) and a second portion of the cold plate 1605 can be aligned with (e.g., positioned under) the phase output terminal 805. The thermal pads 1940 and cool plate 1605 can provide active cooling to conductors in the half-bridge module 305. For example, and depending on the specifications, dimensions (e.g., thickness) and temperature gradients within the capacitor 115, the thermal pads 1940 and cool plate 1605 may provide heat dissipation or heat rejection in a range from 50 watts to 100 watts for a single half-bridge module 305. The thermal pads 1940 can include aluminum oxide, aluminum nitride, silicon material or a silicon aluminum blend material.

The cold plate 1605 can be formed having a shape based on the design of the half-bridge module 305. For example, the cold plate 1605 can include two shallow regions 1990 and a hump region 1995 formed between the two shallow regions 1990. The geometry of the cold plate 1605 can operate to raise the electronics (e.g., high-voltage conductors within capacitor 115, transistors 120, PCB 1650) into an inner area defined by the gel tray 1105 such that the electronics of the half-bridge module 305 are effectively submerged or otherwise covered by the gel tray 1105 on multiple sides, here at least three sides. The shape, size and dimensions of the hump region 1995 can vary and be selected at least based in part on the shape, size and dimensions of one or more components of the half-bridge module 305. For example, a height of the hump region 1995 can be selected such that the transistors 120 or IGBT components of the half-bridge module 305 are submerged within the gel tray 1105.

FIG. 21 illustrates the shallow regions 1990 that are formed such that outer edges 2105 of the gel tray 1105 extend down and are in contact with the conductors 1915 (e.g., positive conductors, negative conductors, phase bar, lead-frame of capacitor 115). The edges 2105 of the gel tray 1105 can be in contact with a portion of the conductor 1915. The conductor 1915 can be disposed over the thermal pad 1940 and the thermal pad 1940 is disposed over a portion of the cold plate 1605. Thus, the edges 2105 of the gel tray 1105 can extend down to be within a predetermined distance from the thermal pad 1940 and the cold plate 1605. The hump region 1995 of the cold plate 1605 can extend or raise the electronics of the half-bridge module 305 into the inner region formed by the gel tray 1105 and the edges 2105 can extend down such that the gel tray 1105 submerges the electronics of the half-bridge module 305. The outer edges 2105 may couple with the shallow regions 1990 of the cold plate 1605.

Figure 22:
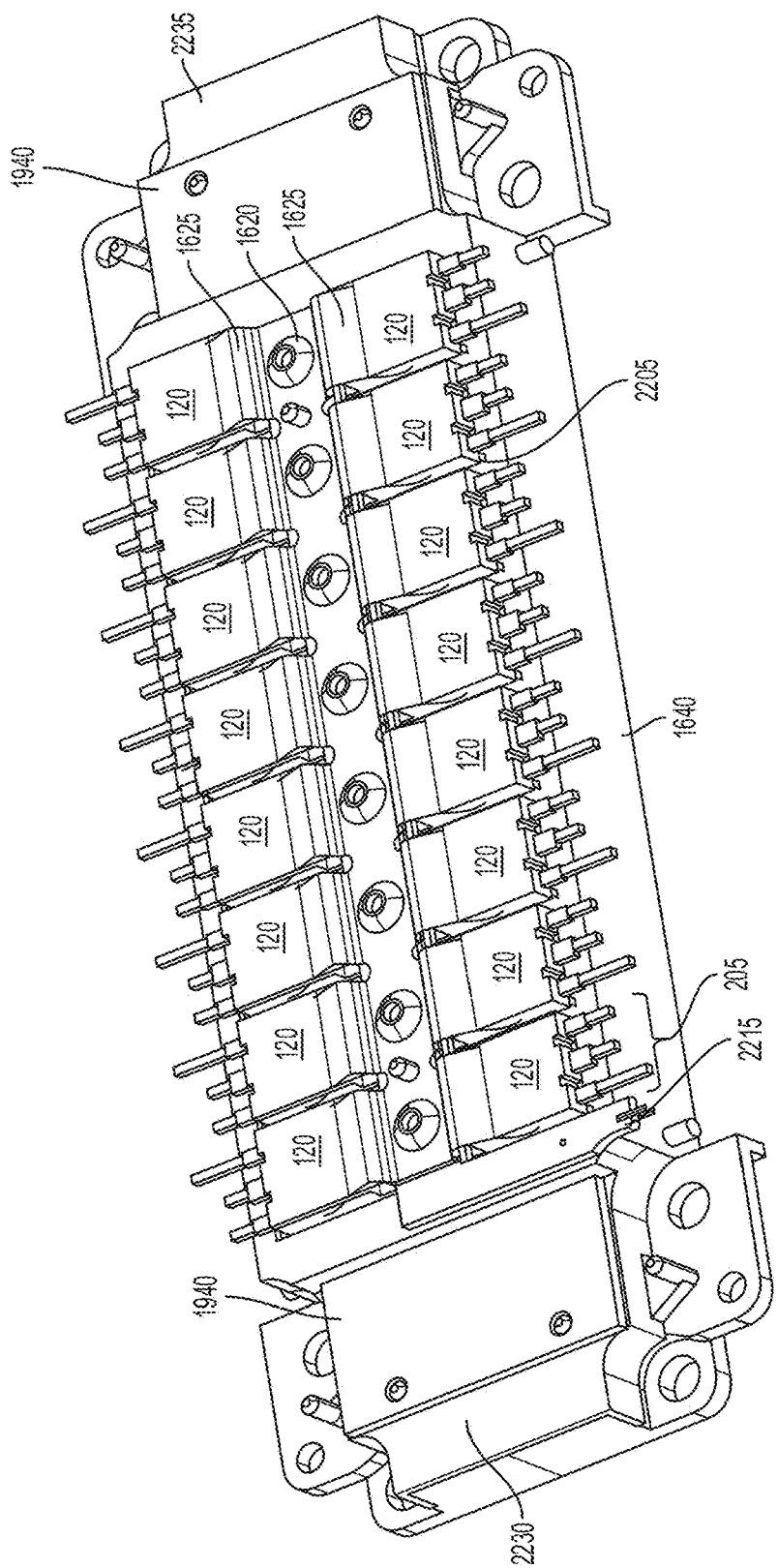
FIG. 22 depicts an example view of a plurality of transistors coupled with a locator through a plurality of clips, with each of the clips having gull wing portions to hold the transistors in place within the locator, according to an illustrative implementation.

FIG. 22 shows a plurality of transistors 120 coupled with or otherwise disposed in slots 2205 of a locator 1640 (which can also be referred to herein as a locator guide, locator frame). In FIG. 22, the transistors 120 have leads 205 having a generally straight or unbent shape. When the transistors 120 are fully coupled with a half-bridge module 305, the leads 205 can be bent, shaped or otherwise manipulated to couple with a respective one or more components (e.g., PCB) within the half-bridge module 305.

A PCB 2215 is coupled with the locator 1640. The PCB 2215 may include control electronics for a temperature sensor (e.g., thermistor) disposed on an opposite side of the locator 1640 (e.g., opposite with respect to the surface of the locator 1640 that the transistors 120 are disposed on). The temperature sensor can operate to provide temperature sensing capability within the half-bridge module. For example, the temperature sensing can be extrapolated to predict IGBT junction temperatures. The temperature sensor (e.g., board-level thermistor) can be compressed and sealed against a pocket of grease on a ceramic layer, adjacent to the transistors 120.

A first thermal pad 1940 is coupled with the locator 1640 at a first end 2230 of the locator 1910 and a second thermal pad 1940 is coupled with the locator 1640 at a second end 2235 of the locator 1640. The first and second thermal pads 1940 can be coupled with the same side or surface of the locator 1640 and be disposed on opposite ends, here the first end 2230 and second end 2235, of the locator 1640 such that the transistors 120 are disposed between the first and second thermal pads 1940.

A plurality of clips 1620 can couple the transistors 120 with the locator 1640. Each of the clips 1620 includes at least two gull wing portions 1625 extending out from a center portion of the respective clip 1620 and over at least one of the plurality of transistors 120. For example, the gull wing portions 1625 can compress and hold the transistors 120 in place and in contact with the locator 1640. For example, and now referring to FIG. 23, an exploded view of clips 1620 compressing transistors 120 towards a cold plate 1605 is provided. The clips 1620 include gull wing portions 1625 that extend out and over a surface (e.g., top surface) of the transistors 120 to secure the transistors 120 and compress the transistors 120 towards a thermal interface formed between a ceramic layer 1630 and the cold plate 1605. For example, the cold plate 1605 includes a plurality of cooling channels 1610 having coolant flowing through, and the gull wings 1625 can compress the transistors 120 closer to the cooling channels 1610 to increase the cooling provided by the cooling channels 1610 and the cold plate 1605. The ceramic layer 1630 is disposed between the transistors 120 and the cold plate 1605 to electrically insulate the transistors 120 from the cold plate 1605.

Figure 23:
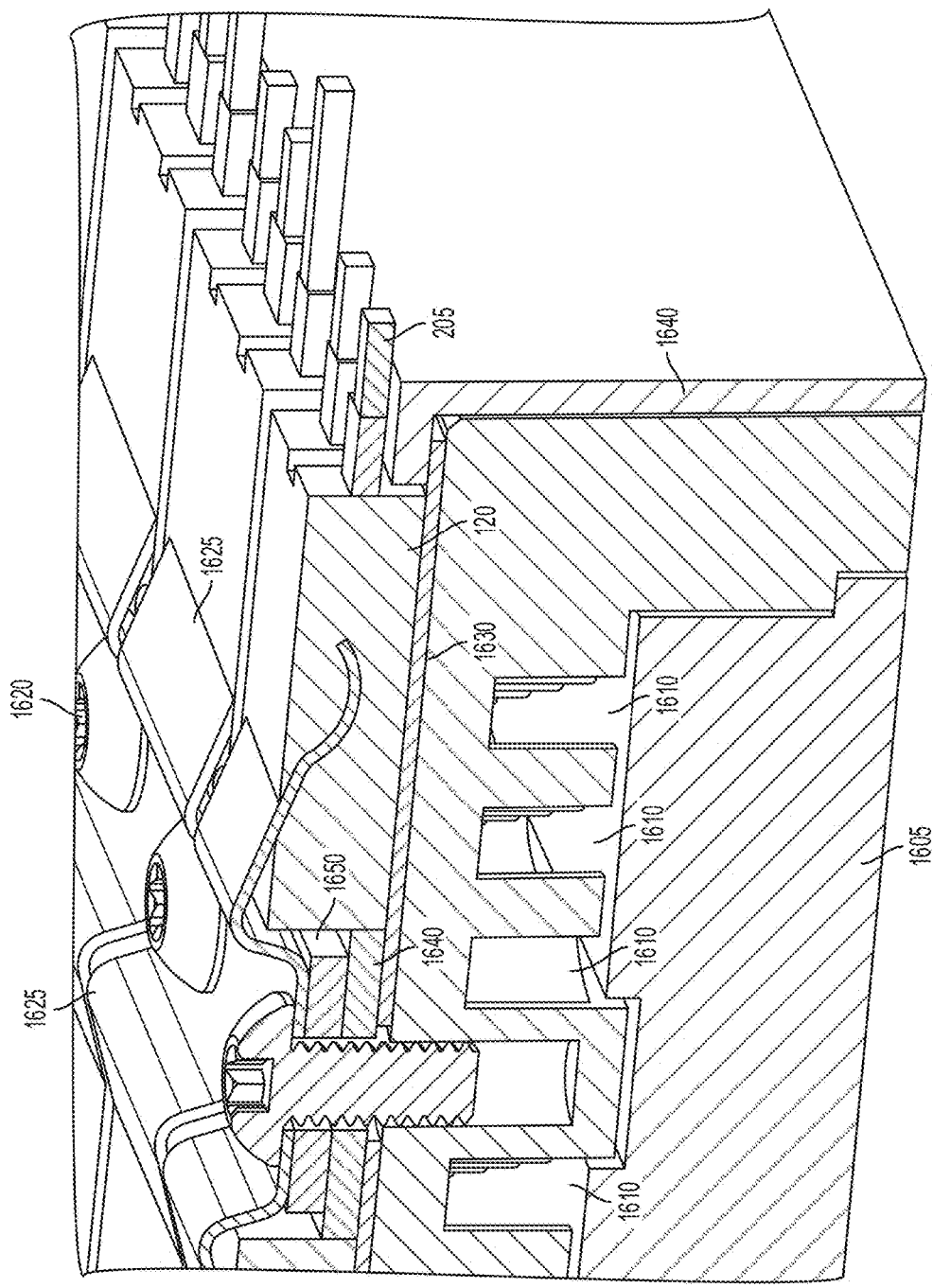
FIG. 23 depicts an example view of a thermal interface of a half-bridge module showing the spatial relationship between a cold pate, ceramic layer, locator and transistors, according to an illustrative implementation.

The transistors 120 are coupled with the locator 1640 using the clips 1620. For example, the clips 1620 can include a threaded portion that can couple with a threaded receiving portion of the locator 1640 and cold plate 1605 to secure the transistors 120 in place. Further, and as depicted in FIG. 23, the PCB 1650 is disposed between the clips 1620 and a top surface of the locator 1640. The PCB 1650 can be secured in place against the locator 1640 by the clips 1620.

As illustrated in FIG. 23, portions of the locator 1640 can extend around the cold plate 1605 such that the cold plate 1605 can be formed or otherwise disposed within an inner region or inner recess of the locator 1640. The shape of the locator 1640 can position the cold plate 1605 to a closer distance (e.g., proximity) or within a predetermined distance to components within a half-bridge module 305. For example, the cold plate 1605 can be spaced from the transistors 120 a distance in a range from 0.25 mm to 1 mm (e.g., less than 1 mm). The cold plate 1605 can be separated from the transistors 120 by a sheet of ceramic material having a thickness or width of less than 1 mm. For example, the plurality of cooling passages 1610 having coolant fluid provided to or flowing through can be positioned in a closer proximity to cool the different electronics (e.g., transistors 120) or other components of a half-bridge module 305.

Figure 24:
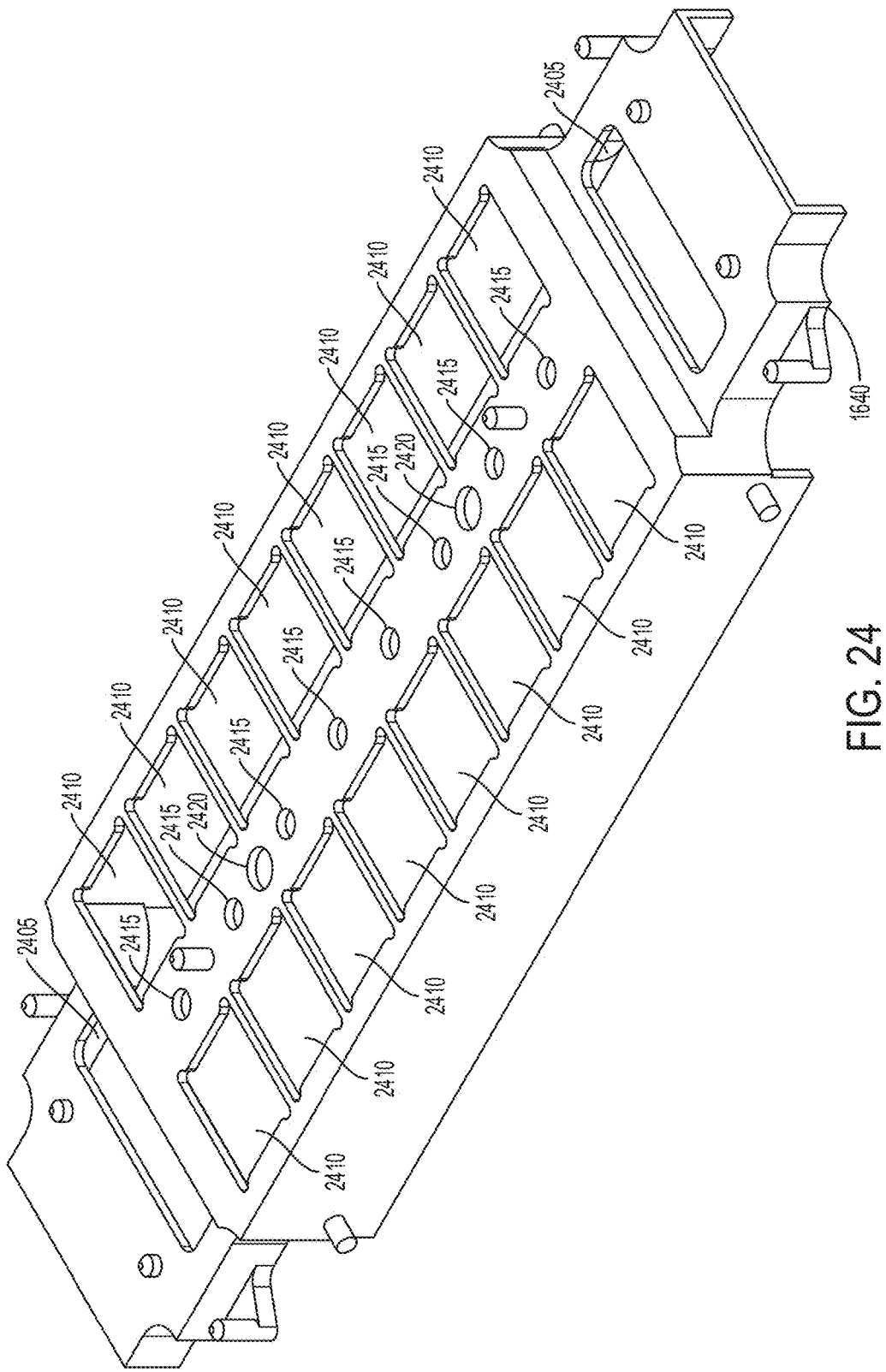
FIG. 24 depicts an example locator having a plurality of slots to couple with different components of a half-bridge module, according to an illustrative implementation.
Figure 25:
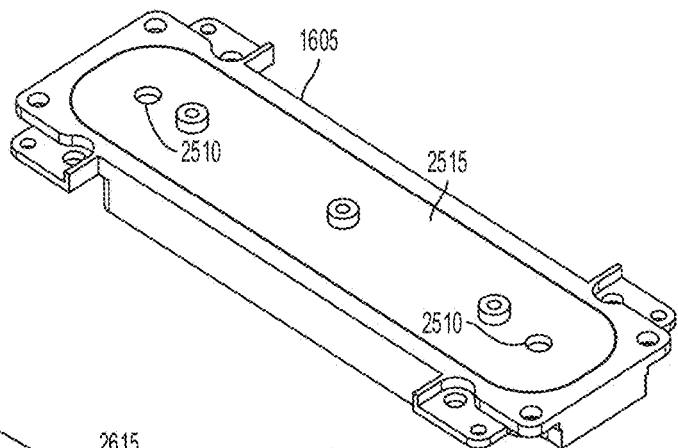
FIG. 25 depicts an example bottom view of a cold plate showing at least two cooling ports to receive or release coolant, according to an illustrative implementation.

FIG. 24 shows the locator 1640 with the components of a half-bridge module 305 removed from the frame. The locator 1640 includes a plurality of slots (e.g., apertures, holes, recesses) formed in a frame of the locator 1640 to hold or couple various components of the half-bridge module 305 in place. The slots can have varying shapes, sizes and dimensions and the shapes, sizes and dimensions of a particular slot can be selected based at least in part on the shape, size or dimension of a component of a half-bridge module 305.

As depicted in FIG. 24, the locator 1640 includes two thermal pad slots 2405 formed at opposite ends of the locator 1640, sixteen transistor slots 2410 (or IGBT slots), eight fastener slots 2415 and two thermistor slots 2420. The thermal pad slots 2405 have a generally rectangular shape which can be selected based on the shape of the particular thermal pad to be used in the half-bridge module 305. The transistors slots 2410 have a generally rectangular shape which can be selected based on the shape of the particular transistors to be used in the half-bridge module 305. The fastener slots 2415 can have a generally round shape and may include a threaded inner surface to couple with a threaded portion of a fastener. The thermistor slots 2420 can have a generally round shape.

A half-bridge module 305 may include only one thermistor, thus only one thermistor slot 2420 may be used. However, two thermistor slots 2420 can be formed to provided symmetry and ease of manufacture. For example, having two thermistor slots 2420 allows for the locator 1640 to be rotated and a thermistor of a half-bridge module 305 can be disposed within either thermistor slot 2420.

The locator 1640 can be formed having any number of slots, including a greater number of slots than described above with respect to FIG. 24 or less than the number of slots described above with respect to FIG. 24. The locator 1640 can operate as a guide or frame for a manufacture process of a half-bridge module 305, such as during a pick and place automation process, to increase an efficiency of the manufacture process. For example, the locator 1640 can keep different components or parts of the half-bridge module 305 form moving around during manufacture resulting in a reducing an amount of fixturing (e.g., identifying and moving parts to correct locations) during the manufacture process. The half-bridge module 305 can be formed faster and more efficiently using the locator 1640 as a guide for an automation device (e.g., pick and place automation machinery). The locator 1640 can reduce the amount of human interaction with a particular manufacture process and therefore, a half-bridge module 305 can be formed using just the pick and place machinery and a grease dispenser device (or other form of fluid device).

FIGS. 25-28 show cut-away views of a cold plate 1605. For example, and referring to FIG. 25, a view of a bottom surface 2515 of the cold plate 1605 is provided showing a first coolant port 2510 and a second coolant port 2510, each formed through the surface 2515 (e.g., bottom surface, top surface) of the cold plate 1605. The first coolant port 210 may correspond to an inlet port to receive coolant or an outlet port to release coolant. The second coolant port 210 may correspond to an inlet port to receive coolant or an outlet port to release coolant. The coolant ports 2510 can be formed orifices or holes formed through the surface 2515 of the cold plate 1605. The coolant ports 2510 can be fluidly coupled with each other through a tube, conduit, or cooling channels formed in or disposed within the cold plate 1605 or a half-bridge module 305 that the cold plate 1605 is disposed within. The coolant ports 2510 can be fluidly coupled with one or more cooling passages or cooling channels 1610 (as shown in FIG. 16) formed within the cold plate 1605 such that coolant can be provided to the cooling channels 1610 within the cold plate 1605 through the coolant ports 2510.

The cold plate 1605 can include multiple coolant ports 2510. For example, the first coolant port 2510 can correspond to a coolant input port or manifold configured to receive a liquid coolant and provide the liquid coolant to the cooling channels 1610. The second coolant port 2510 can correspond to a coolant output port or manifold configured to release the liquid coolant from the cooling channels 1610. The coolant ports 2510 can be formed at opposing ends of the cold plate 1605 (as depicted in FIG. 16) or the coolant ports 2510 can be formed at the same end of the cold plate 1605.

Figure 26:
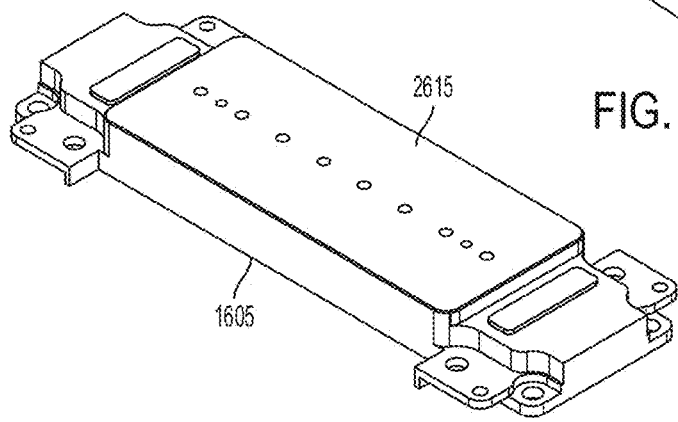
FIG. 26 depicts an example top view of a cold plate, according to an illustrative implementation.

FIG. 26 shows a top view of a top surface 2615 of the cold plate 1605. The top surface 1615 of the cold plate does not include coolant ports 2510. Thus, the liquid coolant provided to the coolant ports 2510 flows through the cold plate 1605 and is sealed or maintained within the cold plate 1605 in part by the top surface 2615 such that the cold plate 1605 can provide cooling to electronics of a half-bridge module 305 the cold plate 1605 is disposed within. The cold plate 1605 may include at least one surface (e.g., bottom surface 2515 or top surface 2615) having one or more coolant ports 2510 formed thereon.

Figure 27:
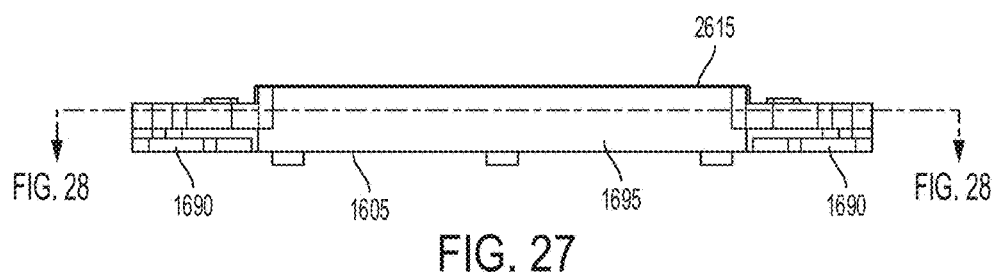
FIG. 27 depicts an example side view of a cold plate having at least two shallow regions and a hump region, according to an illustrative implementation.

FIG. 27 shows a side view of the cold plate 1605. The side view shows the cold plate 1605 having a first shallow region 1690 formed at a first end of the cold plate 1605, a second shallow region 1690 formed at a second end (e.g., different from the first end) of the cold plate 1605, and a hump region 1695 formed or disposed between the first shallow region 1690 and the second shallow region 1690. The hump region 1695 can have a greater height or thickness with respect to the first and second shallow regions 1690. The first and second shallow regions 1690 can have the same height or thickness with respect to each other.

Figure 28:
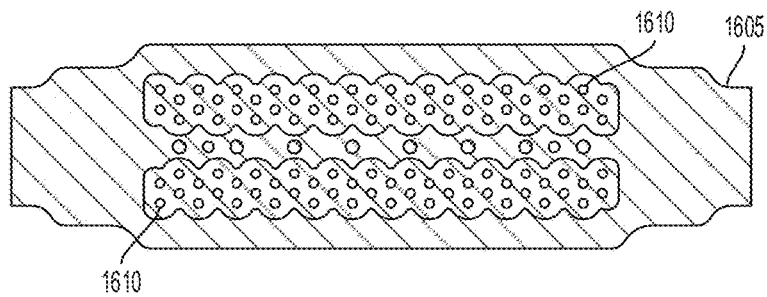
FIG. 28 depicts an example cut-away view to show a plurality of cooling channels formed within a cold plate, according to an illustrative implementation.

FIG. 28 shows a cut away view of the cold plate 1605. The cut away view shows the plurality of cooling channels 1610 formed within the cold plate 1605. Coolant can be provided to and flow through the cooling channels 1610 of the cold plate 1605 to provide heat transfer for electronics, conductors and other components within a respective half-bridge module 305. The geometry of the cold plate 1605 can be selected and formed to enhance heat transfer between the material of the cold plate 1605 (e.g., aluminum) and the fluid flowing through the cooling channels 1610.

The cooling channels 1610 can be formed having a variety of different shapes, different sizes, different dimensions, or different volumes and the particular shape, size, dimensions or volume can be selected based at least in part on a particular application of the cold plate 1605. For example, the cooling channels 1610 can be formed having a generally round or circular shape. The cooling channels 1610 can hold coolant fluid. The cooling channels 1610 can be formed such that coolant fluid can flow through each of them. For example, the cooling channels 1610 can be fluidly coupled with each other or each of the cooling channels 1610 can be fluidly coupled with at least one other different cooling channel 1610. Each of the cooling channels 1610 can have the same shape, size, dimensions, or volume or one or more of the cooling channels 1610 can have a different shape, a different size, different dimensions, or a different volume.

Figure 29:
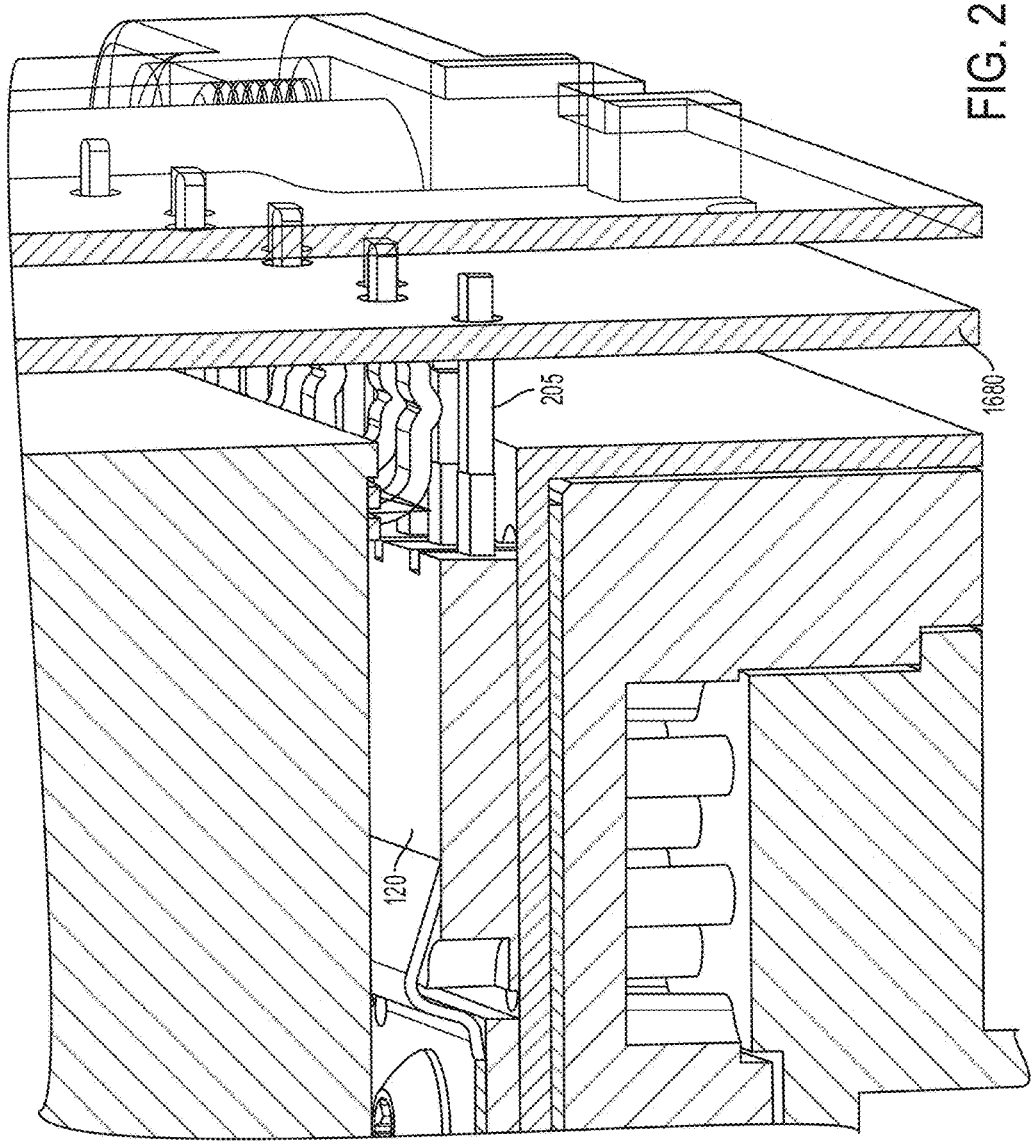
FIG. 29 depicts example transistor having straight leads that are coupled with a printed circuit board, according to an illustrative implementation.

FIG. 29 illustrates the transistor 120 having leads 205 with the leads 205 having a generally straight shape and coupled with a printed circuit board (PCB) 1680. In particular, the leads 205 extend through a hole or orifice formed in the PCB 1680 to couple the transistor 120 with the PCB 1680. The PCB 1680 may include control electronics to communicate and control the transistor 120, such as, to turn the transistor 120 on or off (e.g., open or close the switch). The leads 205 of the transistor 120 can be unbent, and terminated to or otherwise coupled with the PCB 1680 through a variety of different techniques, including but not limited to, resistive welding. The length and dimensions of the leads 205 of the transistor 120 can be selected based at least in part on a distance between the transistor 120 and the PCB 1680. For example, the straight and unbent leads 205 of the transistor 120 can be short in length to minimize parasitic inductance effects, relative to alternative designs where more of the transistor lead is utilized or the leads are bent to reach their target connections.

Figure 30:
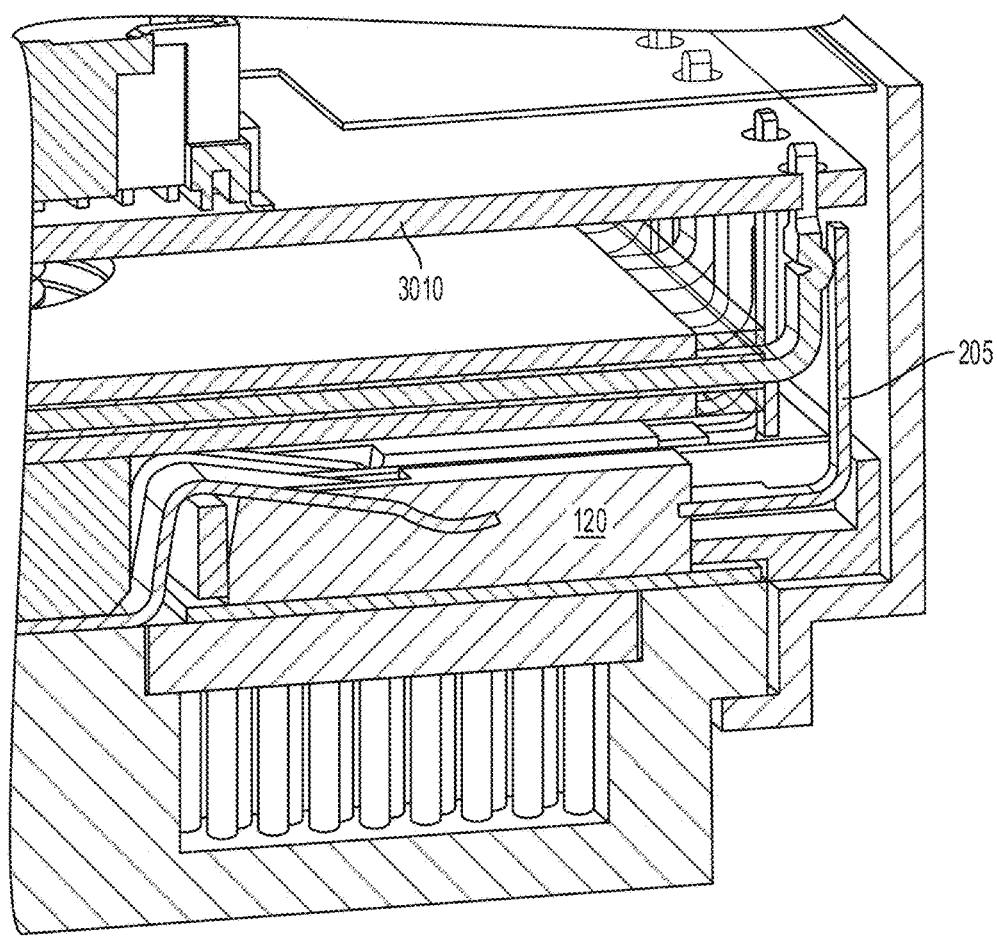
FIG. 30 depicts an example transistor having bent leads, according to an illustrative implementation.

FIG. 30 illustrates the transistor 120 having leads 205 with the leads 205 having a generally bent or curved shape. For example, the leads 205 can be curved to form an angle of 90° with respect to a surface of the transistor 120 (or in a range from 45° to 120° with respect to a surface of the transistor 120) and coupled with a PCB 3010. In particular, the leads 205 extend through a hole or orifice formed in the PCB 3010 to couple the transistor 120 with the PCB 3010. The PCB 3010 may include or provide a power supply to the transistor 120. For example, the PCB 3010 may provide power signals to the transistor 120.

Figure 31:
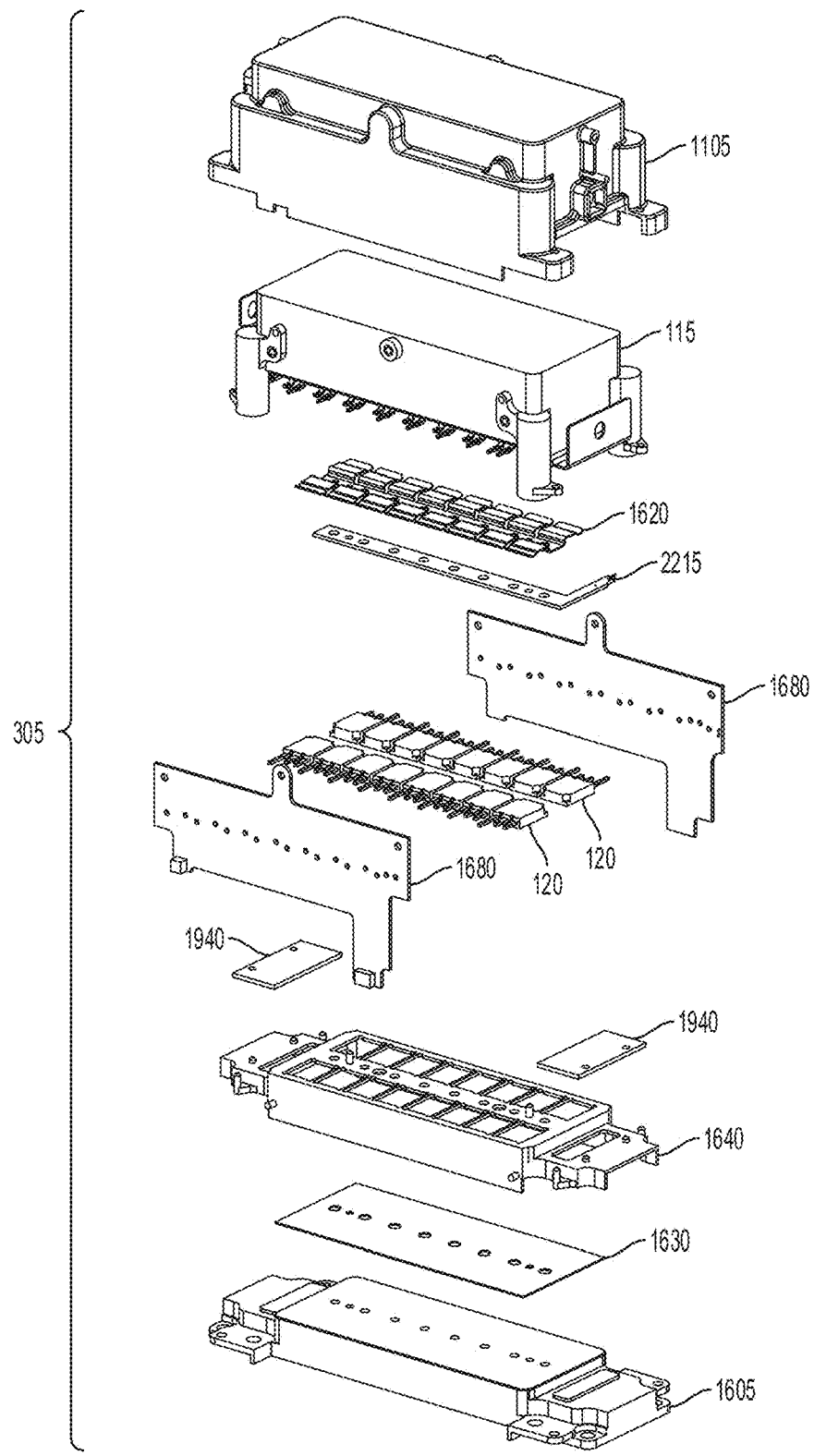
FIG. 31 depicts an exploded view of a half-bridge inverter module, according to an illustrative implementation.

FIG. 31 shows an exploded view of a half-bridge module 305 illustrating the relationship, order of assembly, or alignment of the different components that form the half-bridge module 305. For example, the half-bridge module 305 includes a gel tray 1105 disposed over a capacitor housing 115. First and second PCBs 1680 can couple with at least two side surfaces of the capacitor housing 115. The capacitor housing 115 can be disposed over a plurality of clips 1620 having gull wings, a third PCB 2215 and a plurality of transistors 120. The transistors 120 can be coupled with a locator 1640. For example, each of the transistors 120 can be disposed within at least one slot of the locator 16400. The clips 1620 can compress and hold the transistors 120 in the slots of the locator 1640 using their respective gull wings which extend out and over a top surface of the transistors 120. The third PCB 2215 can be disposed between the clips 1620 and a surface (e.g., top surface) of the locator 1640.

The locator 1640 can be coupled with a cold plate 1605 with a ceramic layer 1630 disposed between the locator 1640 and the cold plate 1605. The cold plate 1605 can be the structural connection between the half-bridge module 305 and the inverter module 300 the half-bridge module 305 is a component of or otherwise disposed within. For example, the cold plate 1605 can include connection points (e.g., mounting flanges, mountings tabs) to couple the cold plate 1605 with other half-bridge modules 305 or couple the cold plate 1605 with connections points within the inverter module 300.

The cold plate 1605 can include a hump region 1995 and two shallow regions 1990. The hump region 1995 can be formed having a height such that the electronics (e.g., capacitor 115, transistors 120, PCBs 1680, 2215 of the half-bridge module 305 are raised up and into an inner area formed by the gel tray 1105 when the half-bridge module 305 is fully assembled. The electronics of the half-bridge module 305 can be surrounded by at least three or more side surfaces of the gel tray 1105 when the half-bridge module 305 is fully assembled.

Figure 32:
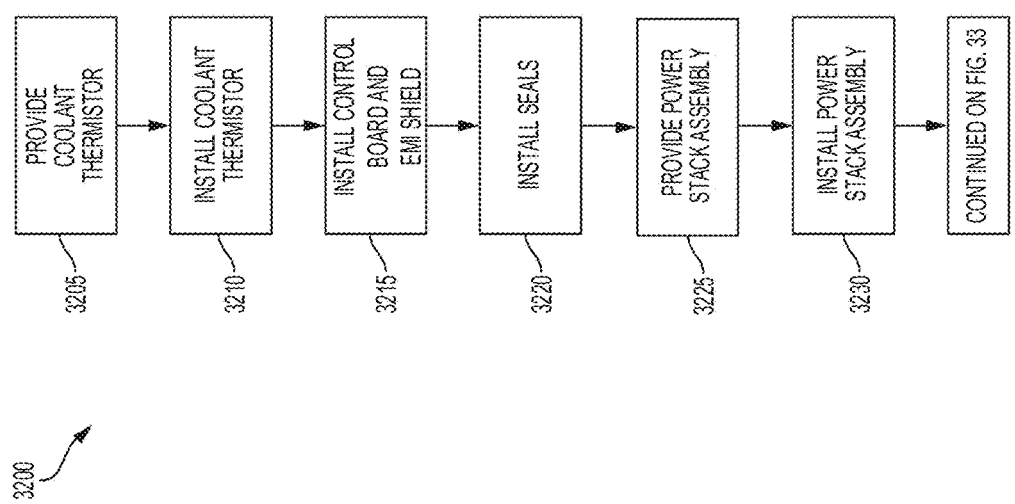
FIGS. 32-33 depict a flow diagram of a method of assembling and manufacturing an inverter module having three half-bridge modules, according to an illustrative implementation.
Figure 33:
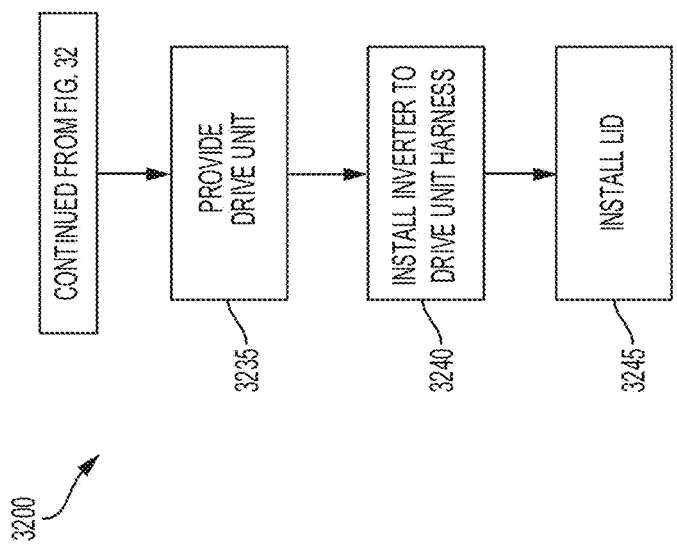
Figure 34:
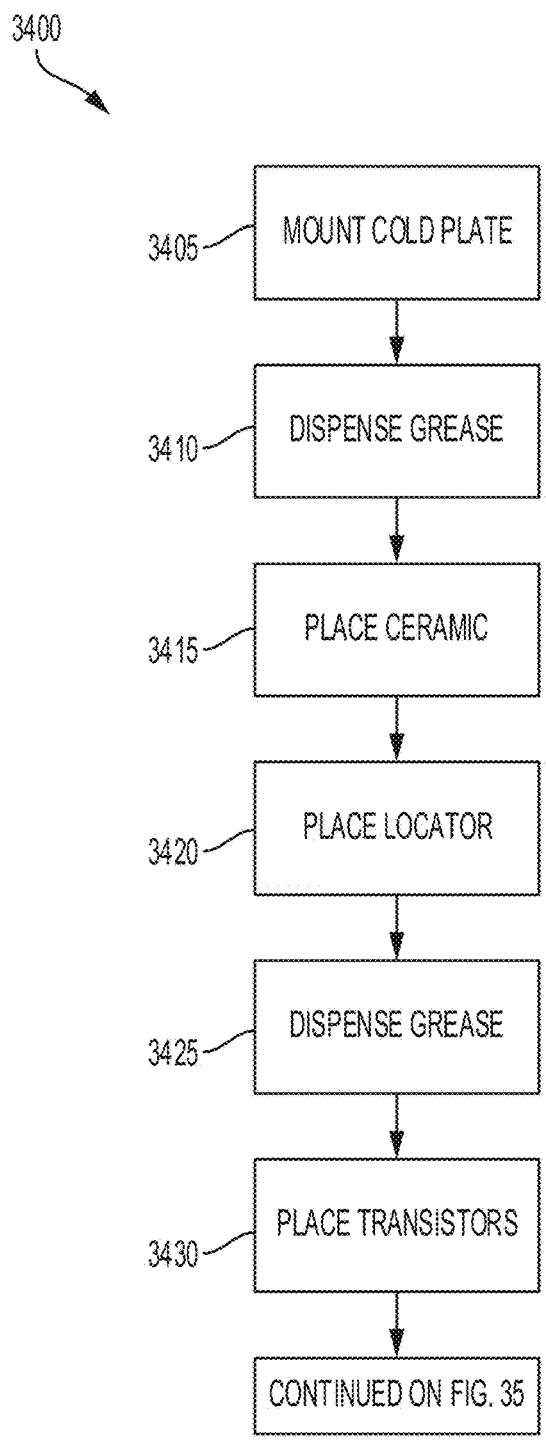
FIGS. 34-40 depict a flow diagram of a method of assembling and manufacturing a half-bridge module, according to an illustrative implementation.
Figure 35:
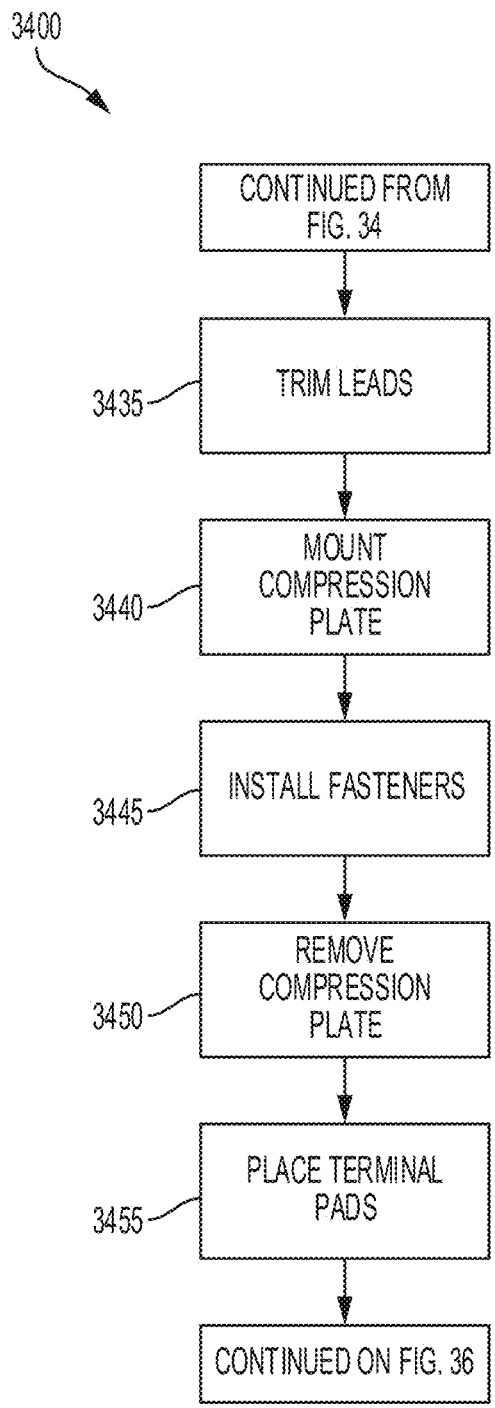
Figure 36:
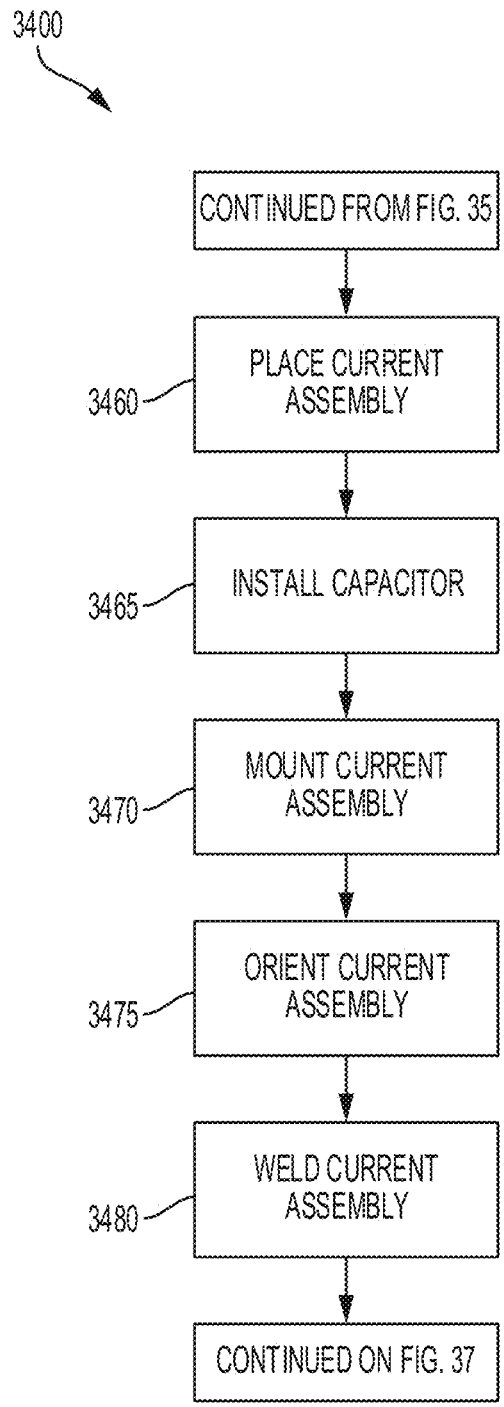
Figure 37:
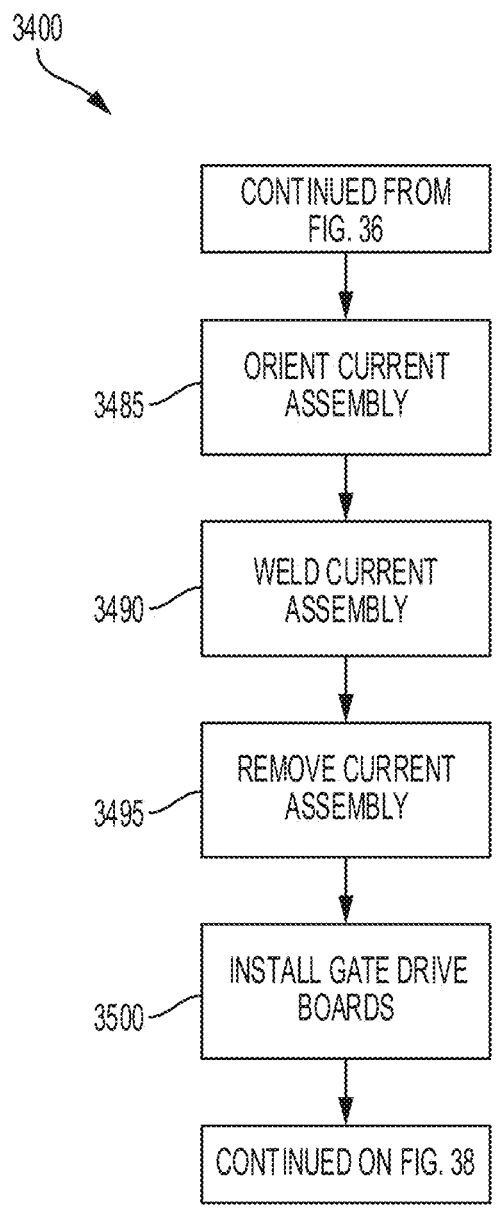
Figure 38:
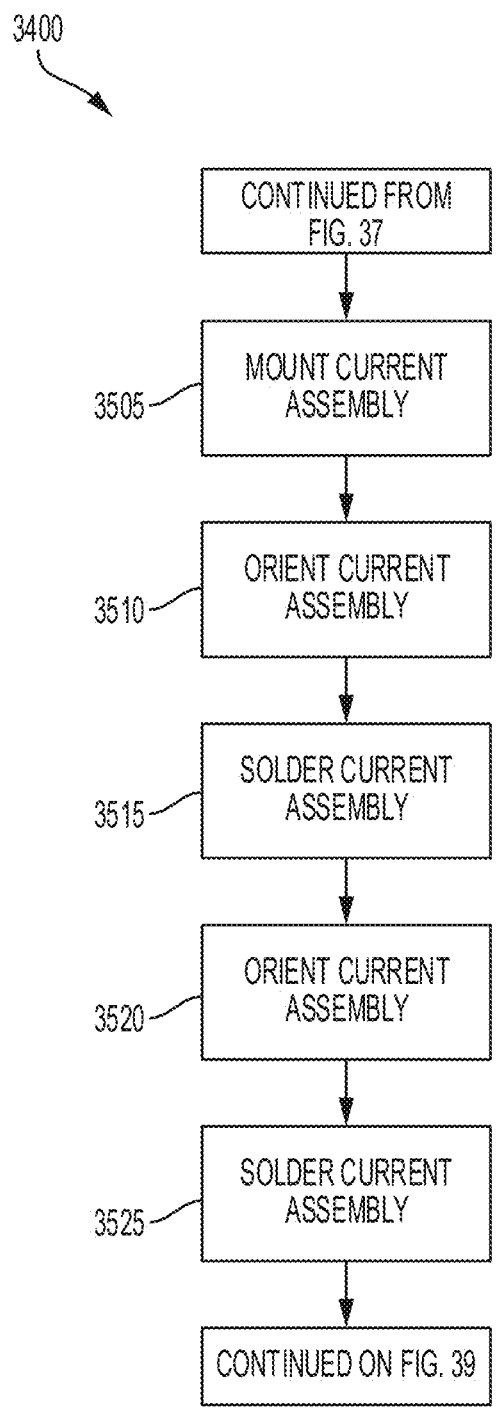
Figure 39:
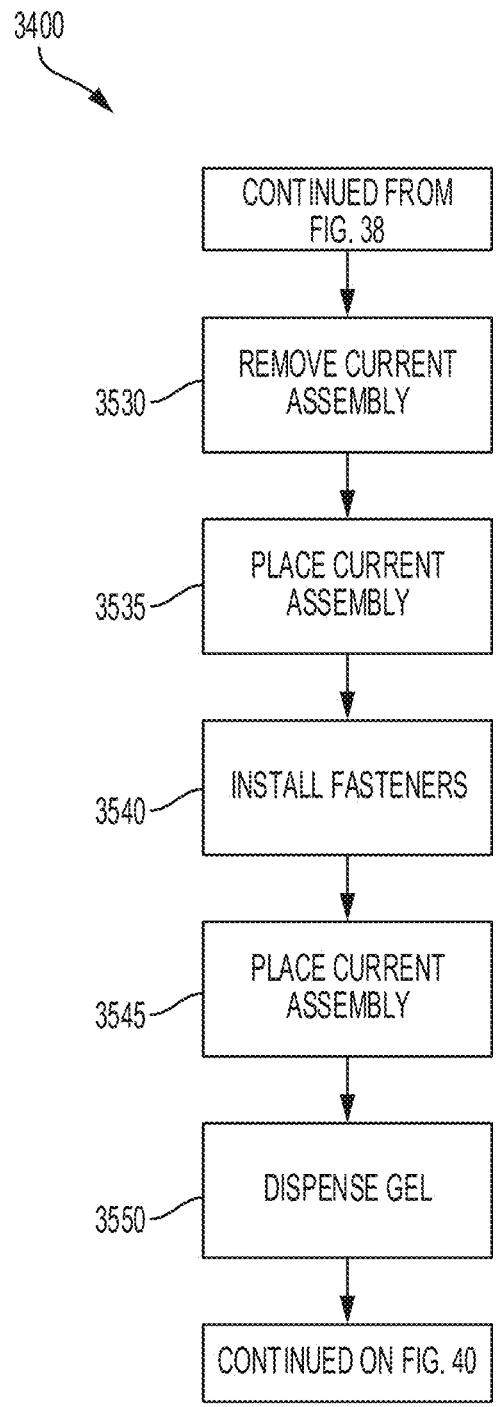
Figure 40:
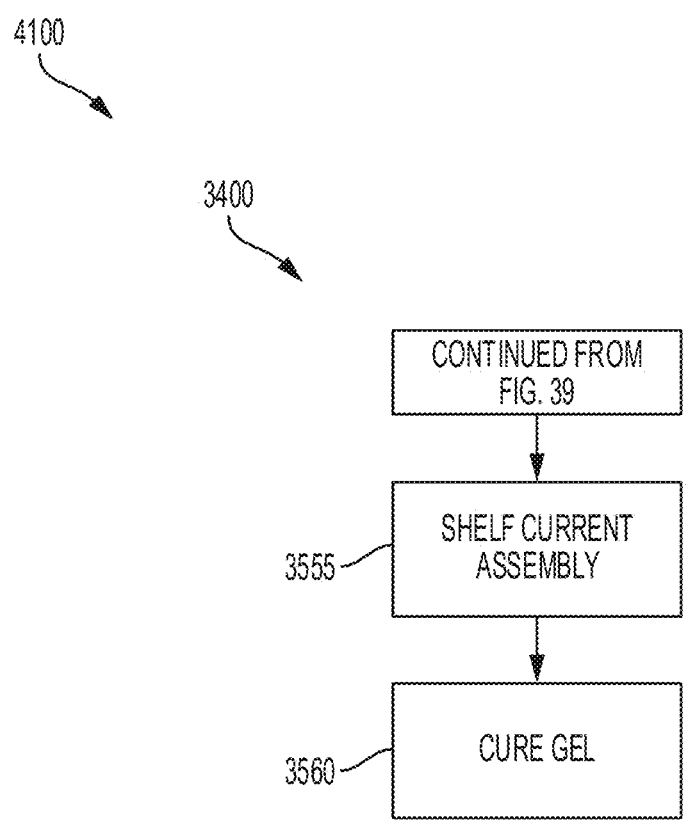

FIGS. 32-33 provide a method 3200 for assembling and manufacturing a main inverter. The main inverter can be a component of the half-bridge module, such as the half-bridge module described above with respect to FIGS. 1-31. The inverter module may include three half-bridge modules (which can also be referred to herein as a power stage, half-bridge inverter modules, half-bridge inverter sub-modules) disposed in an inner area of the inverter module having a triplet arrangement. Each of the half-bridge modules can include at least one coolant thermistor.

Method 3200 can include providing a temperature sensor, such as but not limited to, a coolant thermistor for an inverter module (which can also be referred to herein as a main inverter) (ACT 3205). The half-bridge modules can include different components to provide cooling for the electronics of the respective half-bridge module. For example, each half-bridge module can include a cold plate having a plurality of cooling channels. The cold plate can be positioned such that it is within a predetermined distance of the electronics of the respective half-bridge module to provide heat dissipation or heat rejection within the half-bridge module. Thus, each of the half-bridge modules can include at least one coolant thermistor to measure and provide temperature data for an environment within the half-bridge module.

Method 3200 can include installing the temperature sensor (e.g., coolant thermistor) into an enclosure (which can also be referring to herein as a housing for the inverter module) (ACT 3210). The half-bridge modules can include one temperature sensor or multiple temperature sensors. For example, at least one temperature sensor can be installed next to or adjacent to a coolant inlet manifold, a coolant outlet manifold to measure a temperature of the coolant provided to the half-bridge module. A temperature sensor can be coupled with or embedded within a PCB that is disposed between the electronics of the half-bridge module (e.g., capacitor, transistors) and the cold plate of the half-bridge module.

Method 3200 can include installing a control board and electromagnetic interference (EMI) tray (ACT 3215). The control board and electromagnetic interference (EMI) tray can be assembled at substantially the same time as the coolant thermistor (e.g., simultaneously), the control board and electromagnetic interference (EMI) tray can be assembled prior to the coolant thermistor being assembled or the control board and electromagnetic interference (EMI) tray can be assembled after the coolant thermistor is assembled. The control board can include a control PCB. The control board can include control circuitry to generate control signals to control operation of the half-bridge modules within an inverter module. For example, an inverter module may include a single control board to control each of the half-bridge modules or an inverter module can include multiple control boards.

A power PCB can be assembled and coupled with the half-bridge modules. An inverter module may include a single power PCB to power the electronics of each of the half-bridge modules or an inverter module can include multiple power PCBs such that at least one power PCB is coupled with each half-bridge module. The EMI shield can be disposed within the inverter module such that it is positioned between the control PCB and one or more power PCBs. The EMI shield can block of shield electromagnetic fields between different electronic components of the half-bridge module. The EMI shield can be disposed within the inverter module such that it is positioned between the control PCB and one or more power PCBs. The EMI shield can block of shield electromagnetic fields between different electronic components of the half-bridge module.

Method 3200 can include rotating the enclosure (e.g., flipped) along an x-axis, y-axis or z-axis to seal one or more surfaces of the enclosure (ACT 3220). For example, the enclosure can be rotated to install face seal O-rings between different edges or surfaces of the enclosure. The enclosure may be flipped relative to a z-plane to expose at least one surface (e.g., top surface, bottom surface) of the enclosure for coupling with face seal O-rings.

Method 3200 can include providing a power stack assembly (ACT 3225). Providing the power stack assembly can include assembling a high voltage GDB (HV-GDB) harness. The harness can couple different electronic components of the inverter module together, such as but not limited to, different PCBs within the inverter module. The harness can provide a path for control signals to be transmitted between different electronic components of the inverter module. Providing the power stack assembly can include assembling at least one half-bridge module of the inverter module. The half-bridge module can include, but not limited to, a cold plate, ceramic layer, locator, thermal pads, PCBs, transistors, clips, capacitor, and a gel tray. Multiple half-bridge modules may be assembled having the same components, shape, size, and dimensions. The half-bridge module and the HV-GDB harness can be assembled at substantially the same time (e.g., simultaneously), the half-bridge module can be assembled prior to the HV-GDB harness being assembled or after the HV-GDB being assembled. The HV-GDB can be coupled with the half-bridge module. The harness can couple the PCBs within the respective half-bridge module to control circuitry of the inverter module.

Method 3200 can include installing the power stack assembly into the enclosure of the inverter module (ACT 3230). The power stack assembly or multiple power stacks assembly can be assembled or disposed within the enclosure that forms the housing for the inverter module. The half-bridge modules can be arranged in a triplet configuration such that their respective inputs (e.g., positive, negative) and outlets are aligned with respect to each other. The power stack assembly can be coupled with one or more temperature sensors (e.g., coolant thermistors), the control board (e.g., control PCB), and the EMI tray or EMI shield.

Installing the power stack assembly can include assembling a high voltage DC (HVDC) connector. The DC connector can couple with at least one side surface of the enclosure housing the inverter module. The DC connector can couple with a power source to provide a voltage to the half-bridge modules forming the inverter module. For example, the DC connector can couple with positive and negative bus-bars within the inverter module that provide the voltage to each of the inputs of the half-bridge modules. A control unit connector, such as a master control unit (MCU) connector, can be assembled. The MCU connector can be formed on or coupled with at least one side surface of the enclosure. The MCU connector can couple with an external control unit for providing controls signals to the inverter module. The HVDC connector and the MCU connector can be assembled at substantially the same time (e.g., simultaneously), the MCU connector can be assembled prior to the HVDC connector being assembled or the MCU connector can be assembled after the HVDC connector is assembled.

Method 3200 can include providing a drive unit (ACT 3235). Providing the drive unit can include installing housing mounted connectors within the enclosure of the inverter module. For example, DC terminals can be bolted or otherwise coupled within the enclosure of the inverter module using the housing mounted connectors. The housing mounted connectors may include the MCU connector and the HVDC connector. The high-voltage-low-voltage (HV-LV) harness can be assembled. The LV harness can couple the PCBs in the individual half-bridge modules. For example, the LV harness can provide a low voltage to the different PCBs within the individual half-bridge modules.

Providing the drive unit can include assembling an additional high-voltage-low-voltage (HV-LV) harness. The HV-LV harness can couple high voltage and low voltage systems within the inverter module. For example, the HV-LV harness can couple a first PCB of the inverter module to a second PCB of at least one of the half-bridge modules. Providing the drive unit can include assembling a gearbox bundled harness (or drive unit bundled harness). The gearbox harness can couple a power system or power source of a drive train unit to the invert module. For example, the gearbox harness can electrically couple one or more half-bridge modules or the inverter module with different power systems of a drive train unit to convey or transmit electrical signals between the half-bridge modules or the inverter module and the power systems of the drive train unit.

Method 3200 installing the inverter into the drive unit harness (ACT 3240). For example, installing the inverter into the drive unit harness can include installing the HV-LV harness, gearbox bundled harness and a low-voltage-GDB (LV-GDB) flex cables in the enclosure of the inverter module. The HV-LV harness, gearbox bundled harness and a low-voltage-GDB (LV-GDB) flex cables can be installed using tie-downs or other forms of connectors. Method 3200 can include installing a lid onto the inverter (ACT 3245). For example, a lid and a gasket for the inverter module can be installed and the inverter module having three half-bridge modules arranged in a triplet configuration can be sealed. The lid and gasket can couple with the enclosure using a plurality of fasteners.

FIGS. 34-40 provide a method 3400 for assembling and manufacturing a half-bridge module. The half-bridge module can be the same as the half-bridge modules described above with respect to FIGS. 1-31. Method 3400 can include mounting a cold plate on a pick and place fixture (ACT 3405). The pick and place fixture may include or be a component of a pick and place automation system and can be configured to pick up components (e.g., components of a half-bridge module) and place them into a particular location, fixture, enclosure, system or parts nest for an assembly process or pull components out of a particular location, fixture, enclosure, system or parts nest for an assembly process and position the respective component(s) for packaging or the a subsequent stage in the assembly process.

Method 3400 can include dispensing grease, liquid paste or other forms of a lubricant on the cold plate (ACT 3410). The lubricant can be dispensed by a liquid dispenser positioned proximate to the pick and place fixture. The lubricant can be disposed over at least one surface of the cold plate. Method 3400 can include a ceramic layer or ceramic material (ACT 3415). For example, the ceramic layer or ceramic material can be placed on one or more surfaces of the cold plate. The ceramic layer can be disposed over the lubricant such that the lubricant layer is between the ceramic layer and the cold plate.

Method 3400 can include placing a locator for the half-bridge module (ACT 3420). The locator can include a plurality of slots to hold components of the half-bridge module such that the locator can operate as a guide for the pick and place automation during manufacture of the respective half-bridge module. The locator can be disposed over the ceramic layer such that the ceramic layer is disposed between the cold plate and the locator.

Method 3400 can include dispensing grease, liquid paste or other forms of a lubricant on the ceramic layer and between the ceramic layer and the locator or cold plate (ACT 3425). The lubricant can be disposed over one or more surfaces of the locator. Method 3400 can include placing or disposing a plurality of transistors within slots of the locator (ACT 3430). The transistors may include insulated-gate bipolar transistors (IGBTs). The transistors can be disposed such that at least one transistor is within at least one slot of the locator.

Method 3400 can include trimming leads for the transistors (ACT 3435). The leads of the transistors can be trimmed for coupling with one or more circuit elements within the half-bridge module. For example, the leads can be sized and trimmed to couple with at least one PCB. Method 3400 can include mounting a compression plate (ACT 3440). The compression plate can be used to hold (e.g., compress) the transistors so that they do not move out of position during manufacture. The compression plate can be temporarily mounted to the transistors during the manufacture process.

Method 3400 can include installing one or more fasteners and one or more clips (ACT 3445). The clips can include gull wings and can be installed such that their gull wings extend out and over the transistors to hold the transistors in place, securing the transistors to the locator. The fasteners can couple the clips with locator. Method 3400 can include removing the compression plate (ACT 3450). For example, with the transistors secured by the clips and the fasteners, the compression plate can be removed. Method 3400 can include placing one or more thermal pads (ACT 3455). For example, the one or more thermal pads can be placed such that a tacky side coupled with a surface of the cold plate. The half-bridge module may include two thermal pads with each thermal pad coupled with the cold plate at opposite ends or sides of the half-bridge module. The thermal pads can be disposed within thermal pad slots of the locator. For example, the thermal pads can be disposed at opposing ends of the locator.

Method 3400 can include coupling a current assembly with a surface of a capacitor (ACT 3460). The capacitor may include a DCLSP cap disposed in the assembly jig. The current assembly can be placed on a surface (e.g., top surface, bottom surface) of the capacitor. Method 3400 can include installing the capacitor in the half-bridge module (ACT 3465). For example, a DCLSP capacitor can be installed in the half-bridge module such that it is posited over the transistors. The capacitor can couple with the leads of the transistors to secure the capacitor to the transistors. The capacitor can include a capacitor lead frame. The capacitor lead frame and include leads that couple with one or more PCBs to hold the capacitor in place within the half-bridge module. Method 3400 can include mounting the current assembly onto a weld fixture or a solder fixture (ACT 3470). The weld fixture or solder fixture can hold the current assembly in place during the manufacturing process.

Method 3400 can include rotating, moving, or otherwise positioning the current assembly such that the current assembly is high side up (ACT 3475). For example, the current assembly can be rotated using the solder fixture to position a high side of the current assembly in an accessible position. Method 3400 can include resistive welding the high side of the current assembly (ACT 3480). The high side of the current assembly can be resistive welded to prepare the surface for coupling with other components of a half-bridge inverter module, such as but not limited to, PCBs. Method 3400 can include rotating, moving, or otherwise positioning the current assembly such that the current assembly is low side up (ACT 3485). For example, the current assembly can be rotated using the solder fixture to position a low side of the current assembly in an accessible position. Method 3400 can include resistive welding the low side of the current assembly (ACT 3490). The low side of the current assembly can be resistive welded to prepare the surface for coupling with other components of a half-bridge inverter module, such as but not limited to, PCBs. Method 3400 can include removing the current assembly from the weld fixture or solder fixture (ACT 3495).

Method 3400 can include installing gate drive boards in the half-bridge module (ACT 3500). For example, one or more PCBs can be installed within the half-bridge module. The PCBs can include a control PCB, power PCB, or a temperature PCB. Method 3400 can include mounting the current assembly onto the weld fixture or solder fixture (ACT 3505). Method 3400 can include rotating, moving, or otherwise positioning the current assembly such that the current assembly is high side down (ACT 3510). Method 3400 can include soldering the high side of the current assembly (ACT 3515). For example, the high side can be selectively soldered to couple one or more of the PCBs within the half-bridge module. Method 3400 can include rotating, moving, or otherwise positioning the current assembly such that the current assembly is low side down (ACT 3520). Method 3400 can include soldering the low side of the current assembly (ACT 3525). For example, the low side can be selectively soldered to couple one or more of the PCBs within the half-bridge module. Method 3400 can include removing the current assembly from the weld fixture or solder fixture (ACT 3530).

Method 3400 can include placing the current assembly on top of a gel tray in an assembly jig (ACT 3535). The current assembly can be disposed within an inner region of the gel tray. Method 3400 can include coupling fasteners with or otherwise on the gel tray (ACT 3540). The fasteners can couple the gel tray with the half-bridge module. For example, the fasteners can couple the gel tray with shallow regions of the cold plate of the half-bridge module. Method 3400 can include placing the current assembly on a potting jig (ACT 3545). Method 3400 can include dispensing gel into the potting jig to form the gel tray (ACT 3550). The gel can be dispensed up to a predetermined line or portion of the gel tray. The amount of gel and the size of the gel tray can correspond to the dimensions of the half-bridge module. Method 3400 can include removing or shelving the current assembly. For example, the current assembly can be removed from the half-bridge module. Method 3400 can include curing the gel of the gel tray in an environment appropriate for curing (ACT 3560).

Figure 41:
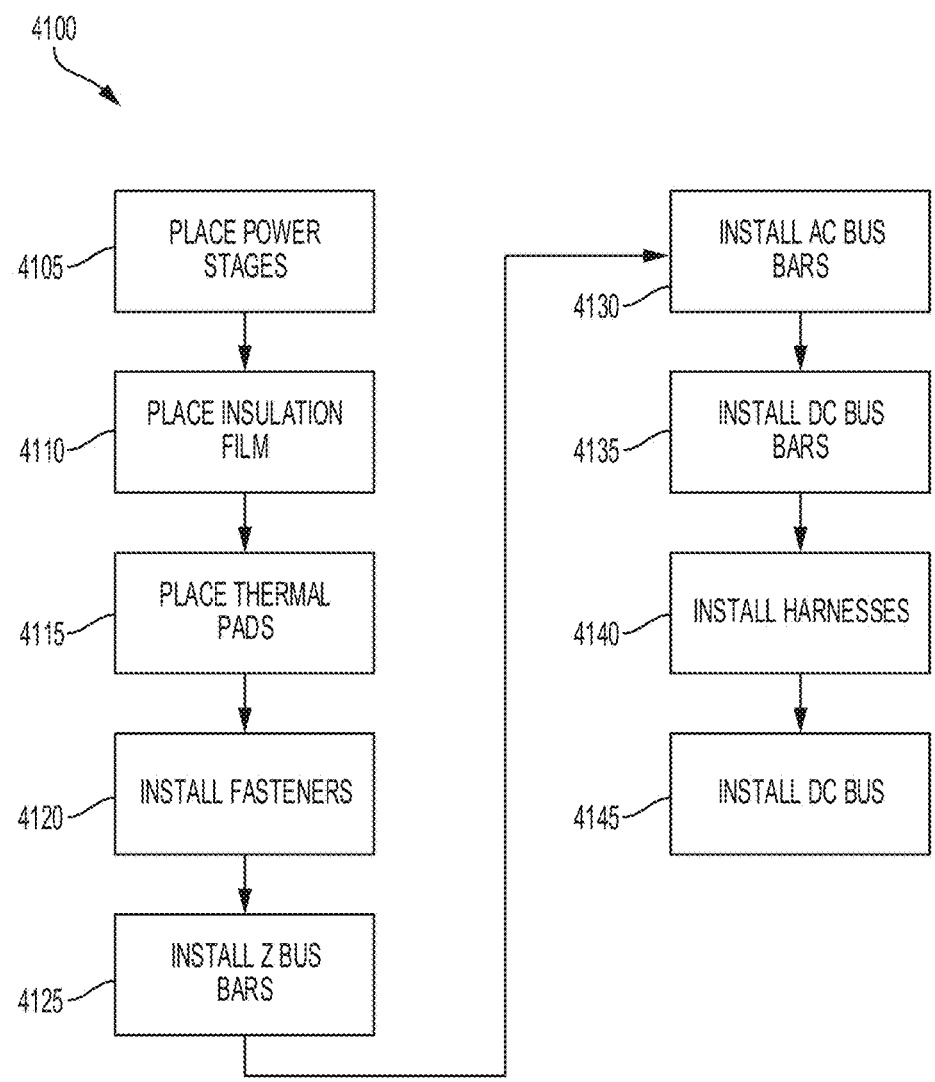
FIG. 41 depicts a flow diagram of a method of assembling and manufacturing an inverter module having three half-bridge modules, according to an illustrative implementation.

FIG. 41 provides a method 4100 for assembling and manufacturing an inverter module (which can also be referred to herein as a power stack). The inverter module can include multiple half-bridge modules, such as the half-bridge modules described above with respect to FIGS. 1-31.

Method 4100 can include placing three half-bridge modules on an assembly jig (ACT 4105). The half-bridge motors can be arranged in a triplet configuration such that the positive and negative phase inputs of each of the half-bridge modules are aligned and the phase output terminals of each of the half-bridge modules are aligned.

Method 4100 can include placing an insulation film (ACT 4110). For example, the insulation film can be placed on or coupled with one or more portions of the half-bridge modules. Method 4100 can include coupling thermal discharge pads with the half-bridge modules (ACT 4115). The thermal discharge pads can couple with different components of the half-bridge module. For example, the thermal discharge pads can couple with a cold plate of the half-bridge module. Method 4100 can include installing PCBs and fasteners on the half-bridge modules (ACT 4120). For example, one or more control PCBs can be coupled with the half-bridge modules. One or more power PCBs can be coupled with the half bridge modules. A HV PCB can be coupled with the half-bridge modules. Fasteners can be used to couple different components to the half-bridge modules. For example, a plurality of fasteners can couple the half-bridge modules to connection points within the inverter module.

Method 4100 can include coupling bus-bars (e.g., z bus-bars) with the half-bridge module (ACT 4125). Method 4100 can include coupling AC bus-bars with the half-bridge modules (ACT 4130). Method 4100 can include coupling DC bus-bars with the half-bridge modules (ACT 4135). The bus-bars can be arranged such that they are parallel to each other. For example, positive and negative bus-bars can be installed along the same side or surfaces of each of the half-bridge modules and be positioned parallel to each other. The positive bus-bar can couple with positive inputs of the half-bridge modules. The negative bus-bar can couple with negative inputs of the half-bridge modules. The positive bus-bar can be disposed above the negative bus-bar and parallel to the negative bus-bar along the same side surfaces of the half-bridge module or the positive bus-bar can be disposed below the negative bus-bar and parallel to the negative bus-bar along the same side surfaces of the half-bridge module. Phase bus-bars can be disposed along an opposite side surfaces of the half-bridge module as compared to the positive and negative bus-bars. A phase bus-bar may be coupled with an output terminal of each of the half-bridge modules.

Method 4100 can include installing HV-GDB harnesses on the half-bridge modules (ACT 4140). The harnesses can electrically couple the half-bridge modules to power systems of a drive train unit. For example, the harnesses can convey or transmit signals between the half-bridge modules and the power system of the drive train unit. Method 4100 can include installing a VIBE-POT DC bus on the half-bridge modules (ACT 4145).

Figure 42:
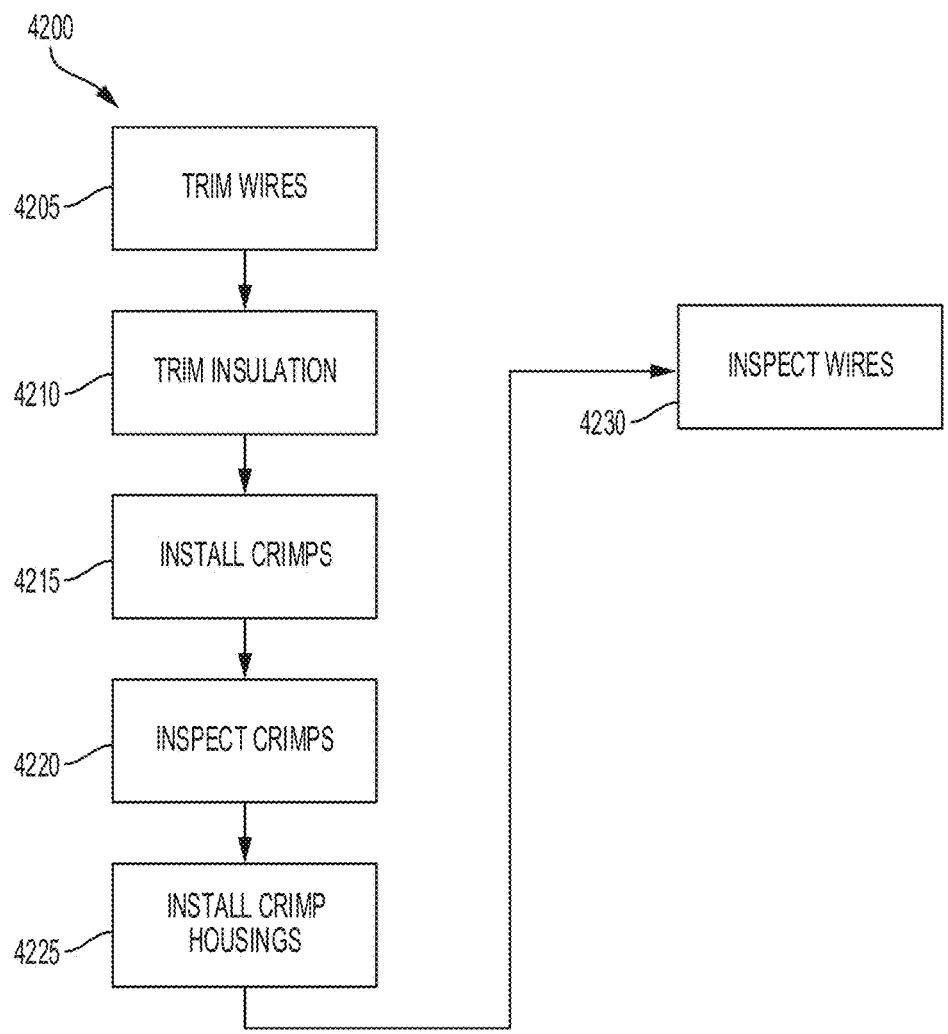
FIG. 42 depicts a flow diagram of a method of wiring and harnesses an inverter module, according to an illustrative implementation.

FIG. 42 provides a method 4200 for wiring and harnesses the inverter module. Method 4200 can include cutting or trimming wires of the inverter module to a particular length (ACT 4205). The length of each of the wires can be selected based at least in part on dimensions of different components of the inverter module. Method 4200 can include trimming insulation layers of the inverter module (ACT 4210). The insulation layers can be trimmed such that one or more edges of the respective insulation layers do not extend out or stick out beyond edges of the surfaces they are disposed between. For example, the insulation layers can be trimmed such that the edges of the insulation layers are flush with the edges of the surfaces they are disposed between. Method 4200 can include installing crimps within the inverter module (ACT 4215). For example, one or more surfaces or edges of the inverter module can be crimped, bent, or folded to form a crimped edge. The crimped edges can correspond to flanges. The flanges can couple with other inverter modules or other surfaces within a power converter to aid in coupling the respective inverter module with the power converter. Method 4200 can include inspecting the crimps (ACT 4220). The crimps can be inspected to ensure they meet engineering specifications. For example, the dimensions of the crimps can be compared to a schematic of the inverter module to determine if the crimps were produced correctly. Method 4200 can include installing crimp housings (ACT 4225). The crimp housings can be disposed around the crimps. The crimp housings can form a protective barrier around the crimps. Method 4200 can include inspecting the wire routing within the inverter module (ACT 4230). For example, the wire routing can be inspected and compared to a schematic of the circuitry of the inverter module to make sure the wires within the inverter module are correctly positioned.

Figure 43:
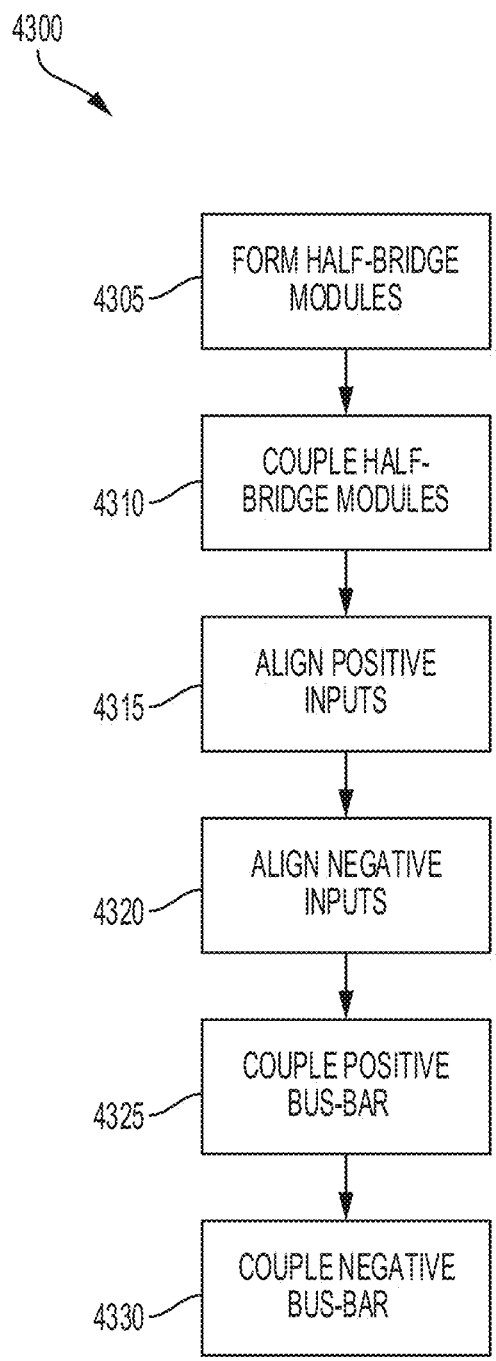
FIG. 43 depicts a flow diagram of a method of forming an inverter module, according to an illustrative implementation.

FIG. 43 provides a method 4300 for forming an inverter module. The method 4300 can include forming one or more half-bridge modules (ACT 4305). For example, a first, second, and third half-bridge modules can be formed. The inverter module can include one or more half-bridge modules with each of the half-bridge modules configured to generate and provide a single phase voltage for a drive train unit of an electric vehicle. Therefore, the inverter module can be formed having three half-bridge modules such to provide a three phase voltage for a drive train unit of an electric vehicle.

The half-bridge modules can include a capacitor, a plurality of transistors coupled together to form a half-bridge inverter circuit. For example, the capacitor can couple between a positive terminal and a negative terminal of the half-bridge inverter circuit. The transistors can include a base terminal, a collector terminal, and an emitter terminal. A first collector terminal of a first transistor couples with the positive terminal of the half-bridge inverter circuit and a first emitter terminal of the first transistor couples with a phase terminal of the half-bridge inverter circuit. A second emitter terminal of a second transistor couples with the negative terminal of the half-bridge inverter circuit and a second collector terminal of the second transistor couples with the phase terminal of the half-bridge inverter circuit. The first transistor and the second transistor can operate as switches and provide a phase voltage through the phase terminal 130, for example, to a three phase motor or motor drive unit of an electrical vehicle.

Method 4300 can include coupling the half-bridge modules together (ACT 4310). The half-bridge modules can be coupled together or disposed within an inverter module in a triplet configuration to provide a compact size. The half-bridge modules can be positioned such that they are side by side or have side surfaces that are positioned adjacent to each other. For example, at least one side surface of a first half-bridge module is adjacent to or next to a first side surface of a second half-bridge module and a second side surface (e.g., opposite the first) of the second half-bridge module is adjacent to or next to at least one side surface of a third half-bridge module. The inverter module can be formed having less than three half-bridge modules or more than three half-bridge modules.

The half-bridge modules can couple together or within an enclosure forming a housing for the inverter module using one or more mounting tabs, mounting flanges, harnesses, or fasteners. For example, the half-bridge modules can include mounting tabs that connect to connection points within the enclosure using fasteners and the mounting flanges can connect to receiving flanges formed on an inner surface of the enclosure. The mounting tabs and mounting flanges can provide connections between the different half-bridge modules such that outer surfaces of the half-bridge can structurally or physically couple together.

Method 4300 can include aligning positive inputs of the half-bridge modules (ACT 4315). Each of the half-bridge modules can include a positive input terminal, and an output terminal. For an inverter module having three half-bridge modules, first, second, and third positive inputs of the first, second and third half-bridge modules, respectively, can be aligned with respect to each other. For example, the positive inputs can be formed, disposed or otherwise coupled with first side surfaces of each of the half-bridge modules at the same height or level. Thus, when the half-bridge modules are positioned in a triplet configuration, the positive inputs are aligned and positioned at the same height or level in a straight or symmetrical arrangement.

Method 4300 can include aligning negative inputs of the half-bridge modules (ACT 4320). For an inverter module having three half-bridge modules, first, second, and third negative inputs of the first, second and third half-bridge modules, respectively, can be aligned with respect to each other. For example, the negative inputs can be formed, disposed or otherwise coupled with first side surfaces of each of the half-bridge modules at the same height or level. Thus, when the half-bridge modules are positioned in a triplet configuration, the negative inputs are aligned and positioned at the same height or level in a straight or symmetrical arrangement.

The positive and negative inputs can be formed, disposed or otherwise coupled with first side surfaces of each of the half-bridge modules at different heights or levels. For example, the positive inputs can be positioned at a first height or first level along the first side surfaces of the half-bridge modules and the negative inputs can be positioned at a second, different height or second, different level along the first side surfaces of the half-bridge modules. The positive inputs may be positioned above and offset with respect to the negative inputs or positioned below and offset with respect to the negative inputs or Method 4300 can include coupling a positive bus-bar with the half-bridge modules (ACT 4325). The positive bus-bar couples with the first, second, and third positive inputs of the first second and third half-bridge inverter modules. The positive bus-bar can be disposed along the first side surface of the half-bridge modules in a straight or symmetrical fashion as the positive inputs are aligned with respect to each other. Therefore, the positive bus-bar can extend along the first side surface parallel with respect to a top or bottom surface of the half-bridge modules. The positive bus-bar couples an input terminal of the inverter module (e.g., DC connector) to the positive input terminals of the half-bridge modules. The positive bus-bar can provide a voltage to the positive input terminals of the half-bridge modules.

Method 4300 can include coupling a negative bus-bar with the half-bridge module (ACT 4330). The negative bus-bar couples with the first, second, and third negative inputs of the first, second and third half-bridge inverter modules such that the positive bus-bar is positioned adjacent to and parallel with the negative bus-bar. The negative bus-bar can be disposed along the first side surface of the half-bridge modules in a straight or symmetrical fashion as the negative inputs are aligned with respect to each other. Therefore, the negative bus-bar can extend along the first side surface parallel with respect to a top or bottom surface of the half-bridge modules. The negative bus-bar couples an input terminal of the inverter module (e.g., DC connector) to the negative input terminals of the half-bridge modules. The negative bus-bar can provide a voltage to the negative input terminals of the half-bridge modules.

The positive and negative bus-bars can be aligned with respect to each other. For example, the positive bus-bar can be positioned at a first height or first level along the first side surfaces of the half-bridge modules and the negative bus-bar can be positioned at a second, different height or second, different level along the first side surfaces of the half-bridge modules. The positive bus-bar can be positioned such that it is parallel with the negative bus-bar along the first side surfaces of the half-bridge modules. The positive bus-bar may be positioned above and parallel with respect to the negative bus-bar or positioned below and parallel with respect to the negative bus-bar.

Output terminals of the half-bridge modules can be aligned. For an inverter module having three half-bridge modules, first, second, and third output terminals of the first, second and third half-bridge modules, respectively, can be aligned with respect to each other. For example, the output terminals can be formed, disposed or otherwise coupled with second side surfaces (e.g., different from the first side surfaces) of each of the half-bridge modules at the same height or level. Thus, when the half-bridge modules are positioned in a triplet configuration, the output terminals are aligned and positioned at the same height or level in a straight or symmetrical arrangement.

The output terminals can be coupled with phase bus-bars. For example, a first phase bus-bar couples to the first output terminal of the first half-bridge inverter module, a second phase bus-bar couples with the second output terminal of the second half-bridge inverter module, and a third phase bus-bar couples with the third output terminal of the third half-bridge inverter module. The phase terminals can provide a voltage generated by the half-bridge modules to a drive train unit of the electric vehicle.

The phase bus-bars can be disposed parallel with respect to each other. The phase bus-bars can be positioned adjacent to each other or side by side and be spaced the same distance from the second surface of the half-bridge modules. The phase bus-bars include output terminals that extend at the same distance above top surfaces of each of the half-bridge modules. For example, first, second, and third phase outputs can be formed on first, second, and third phase bus-bars, of the first, second, and third half-bridge modules respectively. The first, second, and third phase outputs can be positioned the same level or same distance with respect to top surfaces of the first, second, and third half-bridge inverter modules.

A first voltage connector (e.g., HV connector, DC connector) can be formed or coupled with a first side surface of the enclosure housing the half-bridge modules. The first voltage connector can provide a voltage in a first voltage range to the half-bridge modules. For example, the first voltage connector can couple with the positive and negative bus-bars to provide a single phase voltage to each of the inverter modules through the respective positive inputs and negative inputs.

A second voltage connector (e.g., LV connector) can be formed or coupled with a first side surface of the enclosure housing the half-bridge modules. The second voltage connector can provide a voltage in a second voltage range (e.g., low voltage) to the half-bridge modules. The second voltage may be used to power different electronics within the respective half-bridge modules. For example, the second voltage connector can provide the second voltage to power the PCBs disposed within the respective half-bridge modules. The second voltage connector can couple with the PCB through one or more PCB wires disposed within the half-bridge modules. The voltage connector can couple with the positive and negative bus-bars to provide a single phase voltage to each of the inverter modules.

Figure 44:
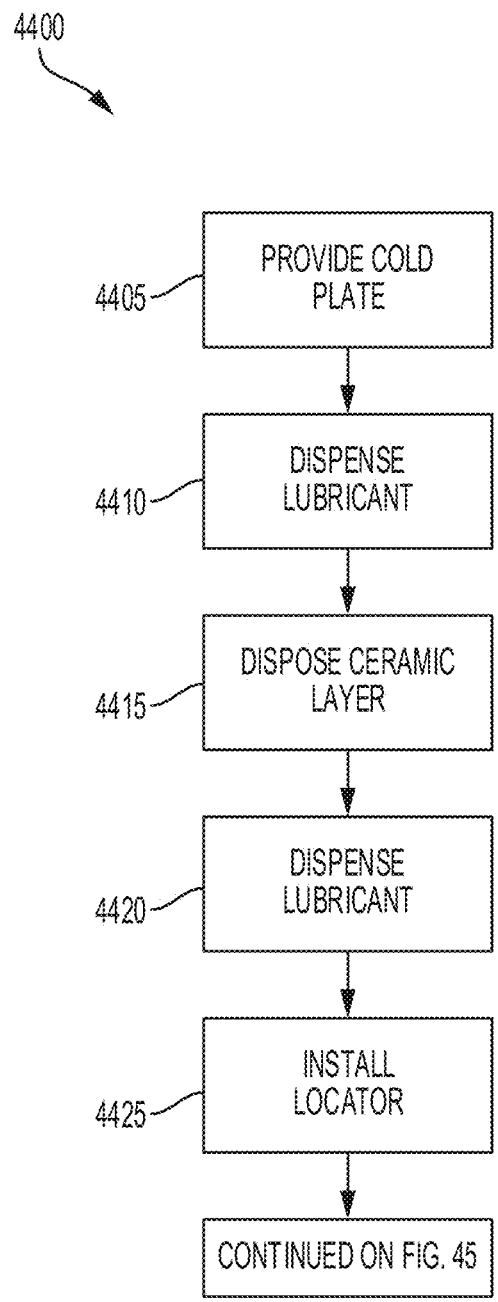
FIGS. 44-45 depict a flow diagram of a method of forming a half-bridge module, according to an illustrative implementation.
Figure 45:
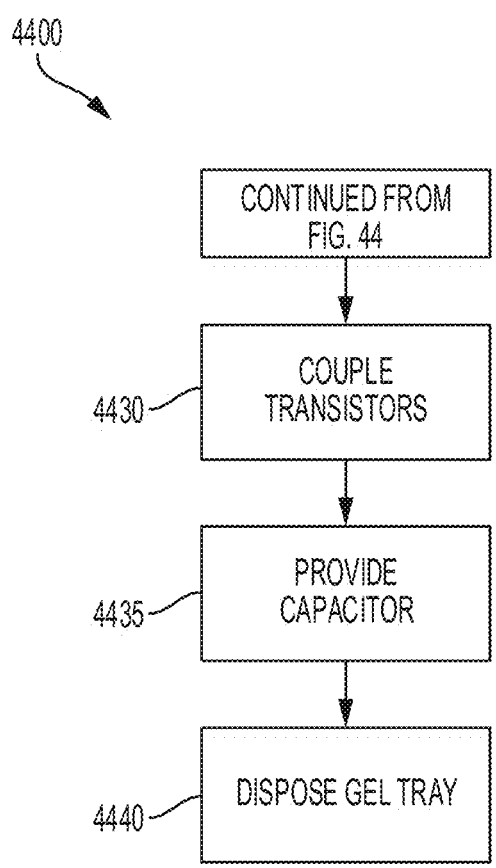

FIGS. 44-45 provide a method 4400 for forming a half-bridge module. The method 4400 can include providing a cold plate on a pick and place fixture (ACT 4405). The cold plate can include two shallow regions and a hump region. The hump region can be disposed between the two shallow regions. The cold plate can form a base for the half-bridge module. The cold plate can include a plurality of cooling channels to provide heat dissipation or heat rejection within the half-bridge module.

Method 4400 can include disposing lubricant over a first surface of the cold plate (ACT 4410). The lubricant can be disposed over the first surface such that the first surface of the cold plate is coated with the lubricant. Method 4400 can include disposing a ceramic layer over the first surface of the cold plate (ACT 4415). The ceramic layer can be disposed over the first surface of the cold plate that is coated with the lubricant. The ceramic layer can operate as an electrical insulator between the cold plate and other components of the half-bridge module, such as a locator.

Method 4400 can include dispensing lubricant over a first surface of the ceramic layer (ACT 4420). The lubricant can be disposed over the first surface of the ceramic layer such that the first surface of the ceramic layer is coated with the lubricant. Method 4400 can include installing a locator over the first surface of the ceramic layer (ACT 4425). The locator can be installed or disposed over the first surface of the ceramic layer coated with lubricant. The locator can be coupled with the cold plate and the ceramic layer using one or more fasteners or one or more clips.

Method 4400 can include coupling a plurality of transistors within a plurality of slots formed in the locator (ACT 4430). For example, each of the transistors can be coupled with or disposed in at least one of the slots formed in the locator. The slots can be arranged such that the transistors are organized in rows of multiple transistors. The transistors can couple with the locator using a plurality of clips and fasteners. The clips can include at least two gull wings that extend over and contact a top surface of the transistors. The gull wings can compress the transistors towards the cold plate. The fasteners can be used to couple the clips to the locator. The locator and the cold plate may include one or more threaded holes to receive a threaded fastener. For example, a fastener can extend through a hole formed in a clip and insert into a threaded hole formed in the locator and the cold plate to secure the clip to the locator and the cold plate. Thus, the clips and fasteners can couple the locator and the ceramic layer (disposed between the locator and the cold plate) to the cold plate.

Method 4400 can include providing or disposing a capacitor over a first surface of the plurality of transistors (ACT 4435). The capacitor can include a capacitor frame. The capacitor can be disposed over a first surface (e.g., top surface) of the transistors. The capacitor can include leads that couple with one or more PCBs disposed within the half-bridge module. Method 4400 can include disposing a gel tray over the capacitor (ACT 4440). The gel tray can include an inner region that covers, houses or submerges the electronics of the half-bridge module. For example, the hump region of the cold plate can have a predetermined height such that it raises the capacitor and the plurality of transistors into the inner region formed by the gel tray. Thus, the gel tray can cover or surround multiple surfaces of the capacitor and transistors.

The method 4400 can include forming an inlet coolant manifold on forming an inlet coolant manifold on a first side surface of the half-bridge module and forming an outlet coolant manifold on a second, different side surface of the half-bridge module. The method 4400 can further include forming a plurality of coolant channels within the cold plate. The plurality of coolant channels can be fluidly coupled with the inlet coolant manifold and the outlet manifold. For example, the inlet coolant manifold and the outlet coolant manifold can be fluidly coupled such that coolant fluid provided to the inlet coolant manifold can flow through the plurality of cooling channels of the cold plate to provide cooling to the components (e.g., capacitor, transistor) of the half-bridge modules and exit the half-bridge module through the outlet coolant manifold.

The method 4400 can include coupling a first thermal pad coupled with a first slot of the locator at a first end of the locator. The first thermal pad can be positioned adjacent to or next to the positive input terminal and the negative input terminal of the half-bridge module. For example, the first thermal pad can be in contact with the negative input terminal and a predetermined distance from the positive input terminal. The first thermal pad configured to provide active cooling (e.g., heat rejection, heat dissipation) to the positive input terminal and the negative input terminal.

A second thermal pad coupled with a second slot of the locator at a second, different end of the locator. The second thermal pad can be positioned adjacent to or next to the output terminal of the half-bridge module. For example, the second thermal pad can be in contact with the output terminal or a predetermined distance from the output terminal. The second thermal pad configured to provide active cooling (e.g., heat rejection, heat dissipation) to the output terminal.

Figure 46:
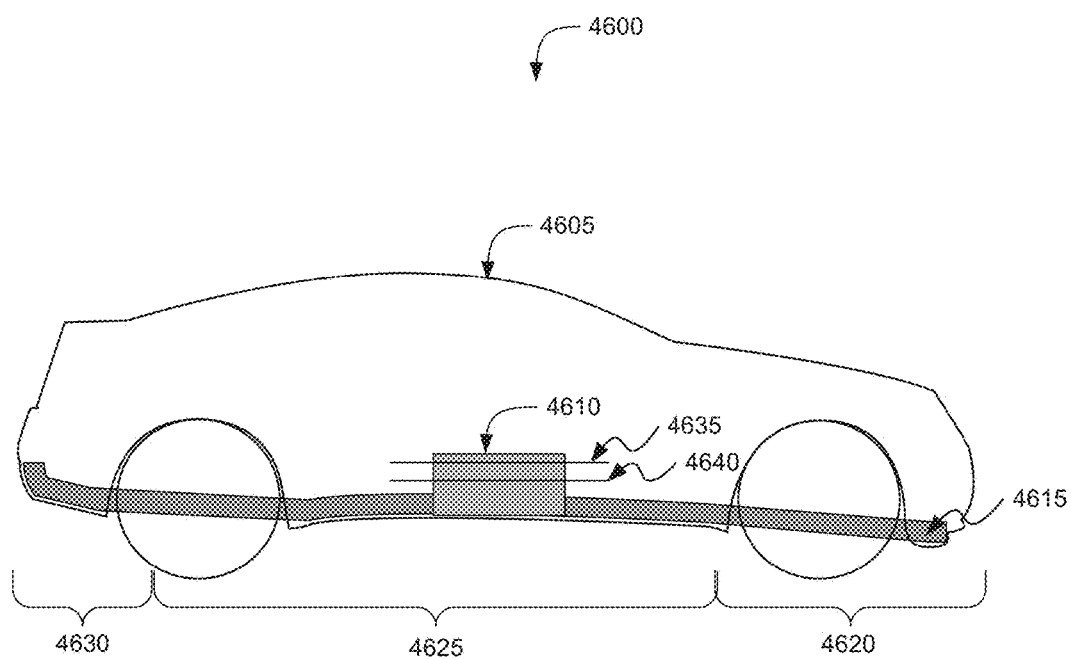
FIG. 46 is a block diagram depicting a cross-sectional view of an example electric vehicle installed with a battery pack.

FIG. 46 depicts an example cross-section view 4600 of an electric vehicle 4605 installed with a battery pack 4610. The battery pack 4610 can correspond to a drive train unit 4610 of the electric vehicle 4605. For example, the battery pack 4610 can be disposed within or be a component of a drive train unit 4610. The drive train unit 4610 (and the battery pack 4610) can provide power to the electric vehicle 4605. For example, the drive train unit 4610 may include components of the electric vehicle 4605 that generate or provide power to drive the wheels or move the electric vehicle 4605. The drive train unit 4610 can be a component of an electric vehicle drive system. The electric vehicle drive system can transmit or provide power to different components of the electric vehicle 4605. For example, the electric vehicle drive train system can transmit power from the battery pack 4610 or drive train unit 4610 to an axle or wheels of the electric vehicle 4605.

The electric vehicle 4605 can include an autonomous, semi-autonomous, or non-autonomous human operated vehicle. The electric vehicle 4605 can include a hybrid vehicle that operates from on-board electric sources and from gasoline or other power sources. The electric vehicle 4605 can include automobiles, cars, trucks, passenger vehicles, industrial vehicles, motorcycles, and other transport vehicles. The electric vehicle 4605 can include a chassis 4615 (sometimes referred to herein as a frame, internal frame, or support structure). The chassis 4615 can support various components of the electric vehicle 4605. The chassis 4615 can span a front portion 4620 (sometimes referred to herein a hood or bonnet portion), a body portion 4625, and a rear portion 4630 (sometimes referred to herein as a trunk portion) of the electric vehicle 2005. The front portion 4620 can include the portion of the electric vehicle 4605 from the front bumper to the front wheel well of the electric vehicle 4605. The body portion 4625 can include the portion of the electric vehicle 4605 from the front wheel well to the back wheel well of the electric vehicle 4605. The rear portion 4630 can include the portion of the electric vehicle 4605 from the back wheel well to the back bumper of the electric vehicle 4605.

The battery pack 4610 can be installed or placed within the electric vehicle 4605. The battery pack 4610 can include or couple with a power converter component. Power converter component can include an inverter module 300 having three half-bridge modules 305. The battery pack 4610 can be installed on the chassis 4615 of the electric vehicle 4605 within the front portion 4620, the body portion 4625 (as depicted in FIG. 46), or the rear portion 4630. The battery pack 4610 can couple with a first bus-bar 4635 and a second bus-bar 4640 that are connected or otherwise electrically coupled with other electrical components of the electric vehicle 4605 to provide electrical power from the battery pack 4610.

Figure 47:
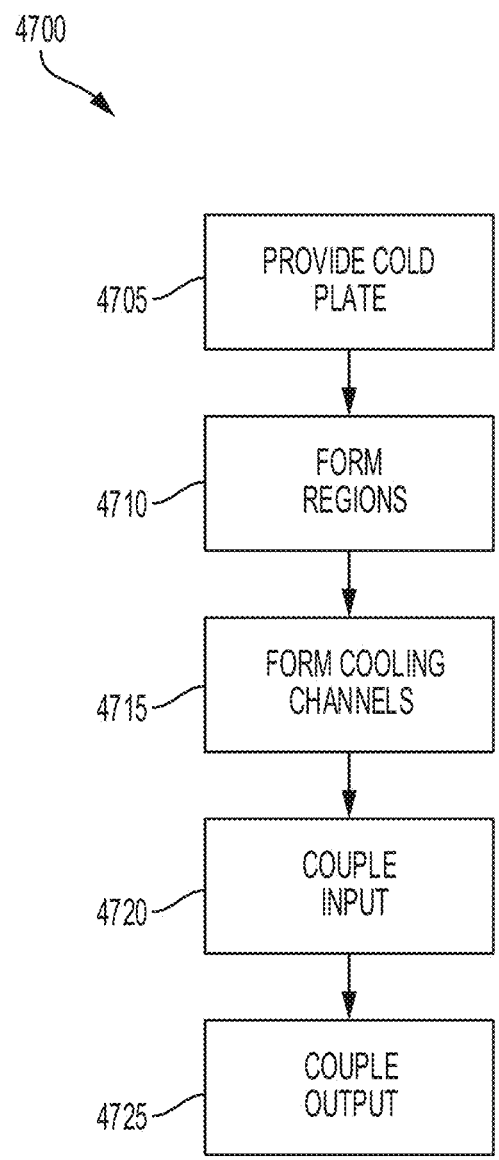
FIG. 47 depicts a flow diagram of a method of forming a half-bridge module, according to an illustrative implementation.

FIG. 47 provides a method 4700 for forming a half-bridge module. The method 4700 can include providing a cold plate (ACT 4705). The cold plate can form a base for a half-bridge module. The half-bridge module can include the cold plate to provide active cooling to one or more electronic components within the half-bridge module. For example, the cold plate can be positioned within a half-bridge module such that it is next to or adjacent to electronics such as transistors, capacitors, or PCB's. The cold plate can provide heat dissipation or heat rejection with the half-bridge module.

Method 4700 can include forming regions of the cold plate (ACT 4710). The cold plate can include different regions having different dimensions (e.g., height, thickness) to provide the active cooling to electronic components within the half-bridge module. For example, the cold plate can be formed having a first, second, and third region with the second region disposed between the first and third region. The first region and the third region can be formed having the same height. The second region can be formed having a greater height that the first and third regions. The second region can be referred to as a hump region. The first and third regions can be referred to as shallow regions. The second region can be formed such that it is adjacent to or under the one or more electronic components within the half-bridge module. Thus, the second region (or hump region) can have a greater height to raise or push the electronic components into an inner area or inner region formed by a gel tray coupled with the cold plate. By raising the electronic components into the inner region of the gel tray, the electronic components can be surround by cooling surfaces on multiple surfaces.

Method 4700 can include forming cooling channels (ACT 4715). The cold plate can include a plurality of cooling channels to provide heat dissipation or heat rejection within the half-bridge module. The cooling channels can be formed in the second region or middle region of the cold plate. The cooling channels can be formed or positioned such that they are adjacent to or under the one or more electronic components within the half-bridge module. The cooling channels can form a passageway or conduit for coolant or fluids to flow through the cold plate and provide active cooling to electronic components disposed around the cold plate. For example, the cooling channels can be fluidly coupled with each other such that coolant provided to at least one cooling channel flows through each of the cooling channels. The cooling channels may be grouped such that coolant only flows through particular cooling channels of the plurality of cooling channels. For example, the coolant channels can be formed into zones within the cold plate with each zone having two or more cooling channels. Thus, different levels or amounts of coolant can be provided the different zones of the cold plate. The cooling channels can be formed having a circular shape, square shape or rectangular shape. Each of the cooling channels can have the same shape and dimensions or one or more of the cooling channels can have a different shape or dimensions from one or more other cooling channels.

Method 4700 can include coupling a coolant input with the cold plate (ACT 4720). The coolant input can be formed through at least one surface of the cold plate. The coolant input can be fluidly coupled with at least one cooling channel to provide coolant or other types of fluid to the cooling channel. The coolant input can be fluidly coupled with multiple cooling channels to provide coolant or other types of fluid to the different cooling channel. The cold plate may include a single coolant input. The cold plate may include multiple coolant inputs. For example, different coolant inputs can be fluidly coupled with different zones of cooling channels or different subsets of the plurality of cooling channels to provide coolant or other types of fluid to the respective cooling channel. The coolant input can be fluidly coupled with a coolant input manifold to receive coolant and provide the coolant to the cooling channels. The coolant input manifold can be formed on or coupled with a second surface (e.g., bottom surface) of the cold plate. The coolant input manifold can receive coolant fluid and provide the coolant fluid to the coolant input.

Method 4700 can include coupling a coolant output with the cold plate (ACT 4725) The coolant output can be formed through at least one surface of the cold plate. The coolant output can be fluidly coupled with at least one cooling channel to form an exit or release for coolant or other types of fluid disposed within the respective cooling channel. The coolant output can be fluidly coupled with multiple cooling channels to form an exit or release for coolant or other types of fluid disposed within the respective cooling channels. The cold plate may include a single coolant output. The cold plate may include multiple coolant outputs. For example, different coolant outputs can be fluidly coupled with different zones of cooling channels or different subsets of the plurality of cooling channels to form an exit or release for coolant or other types of fluid disposed within the respective cooling channels.

The coolant output can be fluidly coupled with a coolant output manifold to release fluid from the cooling channels. For example, the coolant output manifold can be formed on or coupled with a second surface (e.g., bottom surface) of the cold plate. The coolant output manifold can provide an exit for coolant fluid flowing through the cooling channels of the cold plate.

Figure 48:
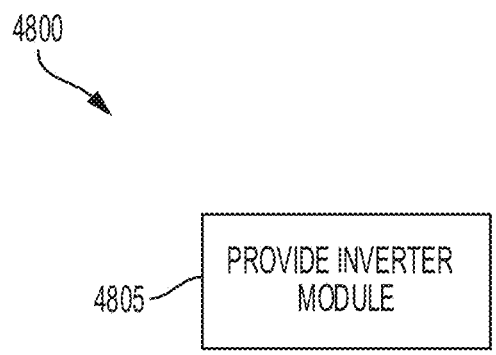
FIG. 48 provides a method of providing an inverter module.

FIG. 48 provides a method 4800 for providing an inverter module. The method 4800 can include providing an inverter module (ACT 4805). The inverter module can include first, second and third half-bridge inverter modules coupled with each other in a triplet configuration. The first, second, and third positive inputs of the first, second and third half-bridge inverter modules, respectively, can be aligned with each other. The first, second, and third negative inputs of the first, second and third half-bridge inverter modules, respectively, can be aligned with respect to each other. The first, second, and third output terminals of the first, second and third half-bridge inverter modules, respectively, can be aligned with respect to each other. The inverter module can include a positive bus-bar coupled with the first, second, and third positive inputs of the first second and third half-bridge inverter module. The inverter module can include a negative bus-bar coupled with the first, second, and third negative inputs of the first, second and third half-bridge inverter modules. The positive bus-bar can be positioned adjacent to and parallel with the negative bus-bar.

Figure 49:
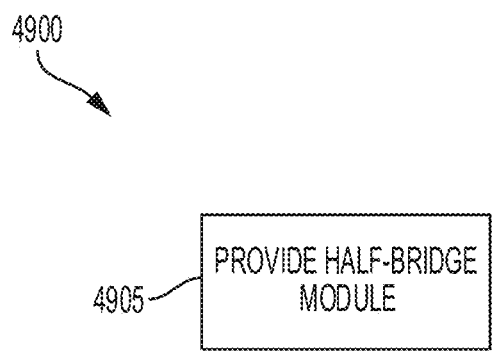
FIG. 49 provides a method of providing a half-bridge module.

FIG. 49 provides a method 4900 for providing a half-bridge module. The method 4900 can include providing a half-bridge module (ACT 4905). The half-bridge module can include a cold plate, a ceramic layer disposed over a first surface of the cold plate, and a plurality of transistors disposed within slots of a locator. The locator and the plurality of transistors can be disposed over a first surface of the ceramic layer. The half-bridge module can include a plurality of clips having gull wings that extend over the transistors to secure the plurality of transistors to the locator, a first plurality of fasteners disposed through the locator and cold plate to secure the plurality of clips to the locator, and a first printed circuit board (PCB) disposed between the plurality of clips and the locator. The half-bridge module can include a capacitor disposed over a first surface of the plurality of the transistors, and a gel tray disposed over the capacitor, the first PCB and the plurality of transistors.

The half-bridge module can include a cold plate having a first surface and a second, opposing surface. The cold plate can include a first region having a first height, a second region having the first height, and a third region having a third height. The second height can be greater than the first height. The cold plate can include a plurality of cooling channels formed within the second region. One or more of the plurality of cooling channels can be fluidly coupled with one or more other cooling channels. The cold plate can include a coolant input fluidly coupled with at least one first cooling channel of the plurality of cooling channels and a coolant output fluidly coupled with at least one second cooling channel of the plurality of cooling channels.

Having now described some illustrative implementations, it is apparent that the foregoing is illustrative and not limiting, having been presented by way of example. Features that are described herein in the context of separate implementations can also be implemented in combination in a single embodiment or implementation. Features that are described in the context of a single implementation can also be implemented in multiple implementations separately or in various sub-combinations. References to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any act or element may include implementations where the act or element is based at least in part on any act or element.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The systems and methods described herein may be embodied in other specific forms without departing from the characteristics thereof. For example, descriptions of positive and negative electrical characteristics may be reversed. For example, elements described as negative elements can instead be configured as positive elements and elements described as positive elements can instead by configured as negative elements. Further relative parallel, perpendicular, vertical or other positioning or orientation descriptions include variations within +/−10% or +/−10 degrees of pure vertical, parallel or perpendicular positioning. References to "approximately," "about" "substantially" or other terms of degree include variations of +1-10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

What is claimed is:

1. An inverter module, comprising:
   first, second and third half-bridge inverter modules coupled with each other in a triplet configuration, wherein first, second, and third positive inputs of the first, second and third half-bridge inverter modules, respectively, are aligned with each other and first, second, and third negative inputs of the first, second and third half-bridge inverter modules, respectively, are aligned with respect to each other, and wherein first, second, and third output terminals of the first, second and third half-bridge inverter modules, respectively, are aligned with respect to each other;
   a positive bus-bar coupled with the first, second, and third positive inputs of the first, second and third half-bridge inverter modules;
   a negative bus-bar coupled with the first, second, and third negative inputs of the first, second and third half-bridge inverter modules, the positive bus-bar positioned adjacent to and parallel with the negative bus-bar;
   the first, second, and third positive inputs of the first, second and third half-bridge inverter modules disposed at a first level along a first side of each of the first, second and third half-bridge inverter modules; and
   the first, second, and third negative inputs of the first, second and third half-bridge inverter modules disposed at a second, different level along the first side of each of the first, second and third half-bridge inverter modules.

2. The inverter module of claim 1, comprising:
   a first phase bus-bar coupled with the first output terminal of the first half-bridge inverter module;
   a second phase bus-bar coupled with the second output terminal of the second half-bridge inverter module; and
   a third phase bus-bar coupled with the third output terminal of the third half-bridge inverter module.

3. The inverter module of claim 1, comprising:
first, second, and third phase bus-bars extending from the first, second, and third half-bridge inverter modules respectively, the first, second, and third phase bus-bars disposed parallel with respect to each other.

4. The inverter module of claim 1, comprising:
a housing, the first, second, and third half-bridge modules disposed within the housing;
a high voltage connector coupled with a first side surface of the housing, the high voltage connector coupled with the positive bus-bar and the negative bus-bar; and
a low voltage connector coupled with a second, different side surface of the housing.

5. The inverter module of claim 1, comprising:
a housing, the first, second, and third half-bridge modules disposed within the housing;
a coolant input coupled with a first side surface of the housing, the coolant input configured to provide coolant fluid to the inverter module to cool the first, second, and third half-bridge inverter modules; and
a coolant output coupled with a second, different side surface of the housing, the coolant output configured to release the coolant fluid from the inverter module.

6. The inverter module of claim 1, comprising:
a first power printed circuit board (PCB) coupled with the first half-bridge module through a first cold plate;
a second power PCB coupled with the second half-bridge module through a second cold plate; and
a third power PCB coupled with the third half-bridge module through a third cold plate, each of the first, second, and third power PCBs configured to provide power signals to the first, second, and third half-bridge modules, respectively.

7. The inverter module of claim 1, comprising:
an electromagnetic interference (EMI) shield disposed a predetermined distance from a second surface of the first, second, and third half-bridge inverter modules.

8. The inverter module of claim 1, comprising:
a control printed circuit board (PCB) disposed a predetermined distance from a second surface of the first, second, and third half-bridge inverter modules, the control PCB provides control signals to each of the first, second, and third half-bridge inverter modules.

9. The inverter module of claim 1, comprising:
the first half-bridge module having a first cold plate, a first plurality of transistors, and a first ceramic layer disposed between the first cold plate and the first plurality of transistors;
the second half-bridge module having a second cold plate, a second plurality of transistors, and a second ceramic layer disposed between the second cold plate and the second plurality of transistors; and
the third half-bridge module having a third cold plate, a third plurality of transistors, and a third ceramic layer disposed between the third cold plate and the third plurality of transistors.

10. The inverter module of claim 1, comprising:
the first half-bridge module having a first cold plate, the first cold plate having two shallow regions and a hump region, the hump region disposed between the two shallow regions;
the second half-bridge module having a second cold plate, the second cold plate having two shallow regions and a hump region, the hump region disposed between the two shallow regions; and
the third half-bridge module having a third cold plate, the third cold plate having two shallow regions and a hump region, the hump region disposed between the two shallow regions, the hump region of the first, second, and third regions configured to raise a capacitor of each of the first, second, and third half-bridge modules into a gel tray of each of the first, second, and third half-bridge modules.

11. The inverter module of claim 1, comprising:
the first half-bridge inverter module having a first inlet coolant manifold and a first outlet coolant manifold, each of the first inlet coolant manifold and the first outlet coolant manifold fluidly coupled with first coolant channels of a first cold plate to provide liquid coolant to the first coolant channels;
the second half-bridge inverter module having a second inlet coolant manifold and a second outlet coolant manifold, each of the second inlet coolant manifold and the second outlet coolant manifold fluidly coupled with second coolant channels of a second cold plate to provide liquid coolant to the second coolant channels; and
the third half-bridge inverter module having a third inlet coolant manifold and a third outlet coolant manifold, each of the third inlet coolant manifold and the third outlet coolant manifold fluidly coupled with third coolant channels of a third cold plate to provide liquid coolant to the third coolant channels.

12. The inverter module of claim 1, comprising:
the first half-bridge module having a first gel tray disposed about multiple sides of a first capacitor;
the second half-bridge module having a second gel tray disposed about multiple sides of a second capacitor; and
the third half-bridge module having a third gel tray disposed about multiple sides of a third capacitor.

13. An inverter module, comprising:
first, second and third half-bridge inverter modules coupled with each other in a triplet configuration, wherein first, second, and third positive inputs of the first, second and third half-bridge inverter modules, respectively, are aligned with each other and first, second, and third negative inputs of the first, second and third half-bridge inverter modules, respectively, are aligned with respect to each other, and wherein first, second, and third output terminals of the first, second and third half-bridge inverter modules, respectively, are aligned with respect to each other;
a positive bus-bar coupled with the first, second, and third positive inputs of the first, second and third half-bridge inverter modules;
a negative bus-bar coupled with the first, second, and third negative inputs of the first, second and third half-bridge inverter modules, the positive bus-bar positioned adjacent to and parallel with the negative bus-bar; and
first, second, and third phase bus-bars having first, second, and third phase outputs respectively, the first, second, and third phase outputs disposed at the same level with respect to a first surface of the first, second, and third half-bridge inverter modules.

14. A method, comprising:
forming a first, second and third half-bridge inverter modules;
coupling the first, second and third half-bridge inverter modules with each other in a triplet configuration;
aligning first, second, and third positive inputs of the first, second and third half-bridge inverter modules, respectively, with each other;

aligning first, second, and third negative inputs of the first, second and third half-bridge inverter modules, respectively, with each other;
coupling a positive bus-bar with the first, second, and third positive inputs of the first, second and third half-bridge inverter modules;
coupling a negative bus-bar with the first, second, and third negative inputs of the first, second and third half-bridge inverter modules such that the positive bus-bar is positioned adjacent to and parallel with the negative bus-bar;
aligning first, second, and third output terminals of the first, second and third half-bridge inverter modules, respectively, with respect to each other;
disposing a first cold plate, a first plurality of transistors, and a first ceramic layer within the first half-bridge module, the first ceramic layer disposed between the first cold plate and the first plurality of transistors;
disposing a second cold plate, a second plurality of transistors, and a second ceramic layer within the second half-bridge module, the second ceramic layer disposed between the second cold plate and the second plurality of transistors; and
disposing a third cold plate, a third plurality of transistors, and a third ceramic layer within the third half-bridge module, the third ceramic layer disposed between the third cold plate and the third plurality of transistors.

15. The method of claim 14, comprising:
disposing the first, second, and third positive inputs of the first, second and third half-bridge inverter modules at a first level along a first side of each of the first, second and third half-bridge inverter modules; and
disposing the first, second, and third negative inputs of the first, second and third half-bridge inverter modules at a second, different level along the first side of each of the first, second and third half-bridge inverter modules.

16. The method of claim 14, comprising:
coupling a first phase bus-bar to the first output terminal of the first half-bridge inverter module;
coupling a second phase bus-bar with the second output terminal of the second half-bridge inverter module; and
coupling a third phase bus-bar coupled with the third output terminal of the third half-bridge inverter module.

17. The method of claim 14, comprising:
coupling first, second, and third phase bus-bars with the first, second, and third half-bridge inverter modules respectively, the first, second, and third phase bus-bars disposed parallel with respect to each other.

18. The method of claim 14, comprising:
forming first, second, and third phase outputs on first, second, and third phase bus-bars, of the first, second, and third half-bridge modules respectively, the first, second, and third phase outputs formed at the same level with respect to a first surface of the first, second, and third half-bridge inverter modules.

19. A method, comprising:
providing an inverter module, the inverter module comprising:
first, second and third half-bridge inverter modules coupled with each other in a triplet configuration, wherein first, second, and third positive inputs of the first, second and third half-bridge inverter modules, respectively, are aligned with each other and first, second, and third negative inputs of the first, second and third half-bridge inverter modules, respectively, are aligned with respect to each other, and wherein first, second, and third output terminals of the first, second and third half-bridge inverter modules, respectively, are aligned with respect to each other;
a positive bus-bar coupled with the first, second, and third positive inputs of the first, second and third half-bridge inverter modules;
a negative bus-bar coupled with the first, second, and third negative inputs of the first, second and third half-bridge inverter modules, wherein the positive bus-bar is positioned adjacent to and parallel with the negative bus-bar; and
first, second, and third phase bus-bars extending from the first, second, and third half-bridge inverter modules respectively, the first, second, and third phase bus-bars disposed parallel with respect to each other.

20. An electric vehicle, comprising:
an inverter module disposed in a drive train unit of the electric vehicle, the inverter module comprising:
first, second and third half-bridge inverter modules coupled with each other in a triplet configuration, wherein first, second, and third positive inputs of the first, second and third half-bridge inverter modules, respectively, are aligned with each other and first, second, and third negative inputs of the first, second and third half-bridge inverter modules, respectively, are aligned with respect to each other, and wherein first, second, and third output terminals of the first, second and third half-bridge inverter modules, respectively, are aligned with respect to each other;
a positive bus-bar coupled with the first, second, and third positive inputs of the first, second and third half-bridge inverter modules;
a negative bus-bar coupled with the first, second, and third negative inputs of the first, second and third half-bridge inverter modules, the positive bus-bar positioned adjacent to and parallel with the negative bus-bar;
a first phase bus-bar coupled with the first output terminal of the first half-bridge inverter module;
a second phase bus-bar coupled with the second output terminal of the second half-bridge inverter module; and
a third phase bus-bar coupled with the third output terminal of the third half-bridge inverter module.

* * * * *